(12) United States Patent
Louis

(10) Patent No.: US 11,735,399 B2
(45) Date of Patent: Aug. 22, 2023

(54) METHODS AND SYSTEMS FOR GENERATING PLASMA ACTIVATED LIQUID

(71) Applicant: GOJO Industries, Inc., Akron, OH (US)

(72) Inventor: Jeffrey S. Louis, Akron, OH (US)

(73) Assignee: GOJO Industries, Inc., Akron, OH (US)

( * ) Notice: Subject to any disclaimer, the term of this patent is extended or adjusted under 35 U.S.C. 154(b) by 115 days.

(21) Appl. No.: 16/907,945

(22) Filed: Jun. 22, 2020

(65) Prior Publication Data

US 2020/0321199 A1 Oct. 8, 2020

Related U.S. Application Data

(63) Continuation of application No. 15/807,997, filed on Nov. 9, 2017, now Pat. No. 10,692,704.
(Continued)

(51) Int. Cl.
*H01J 37/32* (2006.01)
*B01J 19/18* (2006.01)
*B01J 19/22* (2006.01)

(52) U.S. Cl.
CPC ..... *H01J 37/32761* (2013.01); *B01J 19/1887* (2013.01); *H01J 37/32348* (2013.01); *B01J 19/22* (2013.01)

(58) Field of Classification Search
CPC ........... H01J 37/32761; H01J 37/32348; B01J 19/1887; B01J 19/22; B01J 19/088; B01J 2219/0877; B01J 2219/0894; B01J 2219/0849; A61L 2/14; A61L 2/18; A61L 2202/11; A61L 2209/213; A61L 9/22; B04C 3/00; B01D 19/0057; C02F 1/4608;
(Continued)

(56) References Cited

U.S. PATENT DOCUMENTS 3,918,987 A 11/1975 Kopfer
4,020,856 A 5/1977 Masterson
(Continued)

FOREIGN PATENT DOCUMENTS

DE 102011001416 A1 9/2012
DE 102011076806 A1 12/2012
(Continued)

OTHER PUBLICATIONS

Klimpel, Kurt, M.D. "Clostridium difficle Test Exposure to BIT Plasma"; Plasma Clostridium difficile Killing Trials; 2009; 5 pages.
(Continued)

*Primary Examiner* — Xiuyu Tai
(74) *Attorney, Agent, or Firm* — Calfee, Halter & Griswold LLP

(57) ABSTRACT

Exemplary systems and methods associated with activating fluids using indirect plasma. In particular, liquid can be activated to high concentrations and at high volumes by thinning and mixing the liquid as it is exposed to the plasma, resulting more efficient activation. Further increases in activation can be reached by re-circulating fluid for additional exposure to the plasma. High flow rates can be achieved with integrated systems that utilize multiple activation systems with coordinated control.

20 Claims, 39 Drawing Sheets

Related U.S. Application Data

(60) Provisional application No. 62/420,101, filed on Nov. 10, 2016.

(58) Field of Classification Search
CPC .......... C02F 9/00; C02F 1/4606; C02F 1/305; C02F 1/385; C02F 1/68; C02F 1/50; C02F 2303/04
See application file for complete search history.

(56) References Cited

U.S. PATENT DOCUMENTS

| | | | |
|---|---|---|---|
| 4,029,485 | A * | 6/1977 | Siwersson .................. B03C 3/10 55/423 |
| 4,704,189 | A | 11/1987 | Assaf |
| 5,281,315 | A | 1/1994 | Krapivina et al. |
| 5,695,619 | A * | 12/1997 | Williamson ........... B01D 53/32 204/170 |
| 5,876,663 | A | 3/1999 | Laroussi |
| 6,030,506 | A | 2/2000 | Bittenson et al. |
| 6,171,625 | B1 | 1/2001 | Denvir et al. |
| 6,176,941 | B1 | 1/2001 | Jewett et al. |
| 6,387,238 | B1 | 5/2002 | Merk et al. |
| 6,543,460 | B1 | 4/2003 | Denes et al. |
| 6,558,638 | B2 | 5/2003 | Zadiraka et al. |
| 6,706,243 | B1 | 3/2004 | Sias et al. |
| 6,723,091 | B2 | 4/2004 | Goble et al. |
| 6,911,225 | B2 | 6/2005 | Ruan et al. |
| 7,004,356 | B1 | 2/2006 | Sayers |
| 7,008,592 | B2 | 3/2006 | Sias et al. |
| 7,163,664 | B2 | 1/2007 | Paskalov et al. |
| 7,291,314 | B2 | 11/2007 | Paskalov et al. |
| 7,326,382 | B2 | 2/2008 | Adiga et al. |
| 7,330,755 | B2 | 2/2008 | Viöl et al. |
| 7,402,435 | B2 | 7/2008 | Miyoshi et al. |
| 7,560,203 | B2 | 7/2009 | Tamoto et al. |
| 7,608,839 | B2 | 10/2009 | Coulombe et al. |
| 7,633,231 | B2 | 12/2009 | Watson |
| 7,683,342 | B2 | 3/2010 | Morfill et al. |
| 7,829,051 | B2 | 11/2010 | Fridman et al. |
| 7,923,251 | B2 | 4/2011 | Vankov et al. |
| 3,005,548 | A1 | 8/2011 | Watson |
| 7,989,673 | B2 | 8/2011 | Paskalov et al. |
| 3,048,930 | A1 | 11/2011 | Bobbert |
| 8,103,340 | B2 | 1/2012 | Viöl |
| 8,283,171 | B2 | 10/2012 | Vankov et al. |
| 8,354,057 | B2 | 1/2013 | Heselton et al. |
| 8,377,388 | B2 | 2/2013 | Konesky |
| 8,383,036 | B2 | 2/2013 | Sloan et al. |
| 8,388,618 | B2 | 3/2013 | Fridman et al. |
| 8,455,228 | B2 | 6/2013 | Jaroszeski et al. |
| 8,460,283 | B1 | 6/2013 | Laroussi et al. |
| 8,521,274 | B2 | 8/2013 | Gutsol et al. |
| 8,557,187 | B2 | 10/2013 | Ehlbeck et al. |
| 8,725,248 | B2 | 5/2014 | Gutsol et al. |
| 8,802,022 | B2 | 8/2014 | Konesky |
| 8,810,134 | B2 | 8/2014 | Watson |
| 8,828,326 | B2 | 9/2014 | Holbeche |
| 8,894,644 | B2 | 11/2014 | Stieber et al. |
| 8,900,521 | B2 | 12/2014 | Hancock |
| 8,906,659 | B2 | 12/2014 | Clyne et al. |
| 8,926,920 | B2 | 1/2015 | Morfill et al. |
| 8,928,230 | B2 | 1/2015 | Watson et al. |
| 8,957,572 | B2 | 2/2015 | Eden et al. |
| 8,992,518 | B2 | 3/2015 | Fridman et al. |
| 8,994,271 | B2 | 3/2015 | Kindel et al. |
| 9,005,188 | B2 | 4/2015 | Wandke et al. |
| 9,006,976 | B2 | 4/2015 | Watson et al. |
| 9,038,645 | B2 | 5/2015 | Wandke et al. |
| 9,072,157 | B2 | 6/2015 | Holbeche et al. |
| 9,192,776 | B2 | 11/2015 | Hummel et al. |
| 9,226,790 | B2 | 1/2016 | Zemel et al. |
| 9,236,227 | B2 | 1/2016 | Watson et al. |
| 9,257,264 | B2 | 2/2016 | Hummel et al. |
| 9,287,094 | B2 | 3/2016 | Trutwig et al. |
| 9,295,535 | B2 | 3/2016 | Holbeche et al. |
| 9,308,285 | B2 | 4/2016 | Hancock et al. |
| 9,330,890 | B2 | 5/2016 | Busse et al. |
| 9,339,572 | B2 | 5/2016 | Tsai et al. |
| 9,339,783 | B2 | 5/2016 | Fridman et al. |
| 9,345,120 | B2 | 5/2016 | Wandke et al. |
| 9,351,790 | B2 | 5/2016 | Zemel et al. |
| 9,384,947 | B2 | 7/2016 | Watson et al. |
| 9,387,369 | B2 | 7/2016 | Yamamoto |
| 9,418,820 | B2 | 8/2016 | Watson et al. |
| 9,437,401 | B2 | 9/2016 | Watson et al. |
| 9,440,057 | B2 | 9/2016 | Jacofsky et al. |
| 9,472,382 | B2 | 10/2016 | Jacofsky |
| 9,498,637 | B2 | 11/2016 | Sanders et al. |
| 9,511,240 | B2 | 12/2016 | Dobrynin et al. |
| 9,521,736 | B2 | 12/2016 | Jacofsky et al. |
| 9,538,630 | B2 | 1/2017 | Watson |
| 9,558,918 | B2 | 1/2017 | Watson et al. |
| 9,570,273 | B2 | 2/2017 | Watson et al. |
| 9,601,317 | B2 | 3/2017 | Konesky |
| 10,692,704 | B2 | 6/2020 | Louis |
| 2004/0120844 | A1 | 6/2004 | Tribelsky et al. |
| 2004/0216845 | A1 | 11/2004 | Golkowski |
| 2004/0245087 | A1 | 12/2004 | Lee |
| 2005/0053532 | A1 | 3/2005 | Holl |
| 2006/0189976 | A1 | 8/2006 | Kami et al. |
| 2006/0223729 | A1 | 10/2006 | Hamblin et al. |
| 2006/0229225 | A1 | 10/2006 | Martin et al. |
| 2007/0251953 | A1 | 11/2007 | Criswell et al. |
| 2009/0041617 | A1 | 2/2009 | Lee |
| 2009/0054896 | A1 | 2/2009 | Fridman et al. |
| 2009/0098062 | A1 | 4/2009 | Bobbert |
| 2009/0175956 | A1 | 7/2009 | Buschmann et al. |
| 2010/0145253 | A1 | 6/2010 | Gutsol et al. |
| 2010/0168499 | A1 | 7/2010 | Gutsol et al. |
| 2010/0171188 | A1 | 7/2010 | Lung et al. |
| 2010/0196505 | A1 | 8/2010 | Kaiser et al. |
| 2010/0209293 | A1 | 8/2010 | Ikawa et al. |
| 2010/0280513 | A1 | 11/2010 | Juergen et al. |
| 2010/0296977 | A1 | 11/2010 | Hancock |
| 2011/0022043 | A1 | 1/2011 | Wandke et al. |
| 2011/0076190 | A1 | 3/2011 | Tanaka et al. |
| 2011/0112528 | A1 | 5/2011 | Stieber et al. |
| 2011/0171188 | A1 | 7/2011 | Morfill et al. |
| 2011/0251604 | A1 | 10/2011 | Staack et al. |
| 2011/0297623 | A1 | 12/2011 | Foret |
| 2012/0039747 | A1 | 2/2012 | Morfill et al. |
| 2012/0042419 | A1 | 2/2012 | Wilson et al. |
| 2012/0046597 | A1 | 2/2012 | Morfill et al. |
| 2012/0046602 | A1 | 2/2012 | Morfill et al. |
| 2012/0064016 | A1 | 3/2012 | Lloyd et al. |
| 2012/0080412 | A1 | 4/2012 | Holbeche et al. |
| 2012/0100037 | A1 | 4/2012 | Shannon et al. |
| 2012/0107761 | A1 | 5/2012 | Holbeche et al. |
| 2012/0107896 | A1 | 5/2012 | Wandke et al. |
| 2012/0288934 | A1 | 11/2012 | Weltmann et al. |
| 2012/0305787 | A1 | 12/2012 | Henson |
| 2012/0315684 | A1 | 12/2012 | Hayashi et al. |
| 2013/0026137 | A1 | 1/2013 | Kindel et al. |
| 2013/0147340 | A1 | 6/2013 | Holbeche |
| 2013/0345620 | A1 | 12/2013 | Zemel et al. |
| 2014/0100277 | A1 | 4/2014 | Gray et al. |
| 2014/0188037 | A1 | 7/2014 | Jacofsky et al. |
| 2014/0188071 | A1 | 7/2014 | Jacofsky et al. |
| 2014/0188097 | A1 | 7/2014 | Watson et al. |
| 2014/0188195 | A1 | 7/2014 | Jacofsky et al. |
| 2014/0200506 | A1 | 7/2014 | Zemel et al. |
| 2014/0207053 | A1 | 7/2014 | Morfill et al. |
| 2014/0271354 | A1 | 9/2014 | Tsai et al. |
| 2014/0322096 | A1 | 10/2014 | Pelfrey et al. |
| 2014/0341786 | A1 | 11/2014 | Konesky |
| 2015/0004248 | A1 | 1/2015 | Morfill et al. |
| 2015/0088234 | A1 | 3/2015 | Weltmann et al. |
| 2015/0094647 | A1 | 4/2015 | Kalghatgi et al. |
| 2015/0112300 | A1 | 4/2015 | Glowacki et al. |
| 2015/0123711 | A1 | 5/2015 | Mandela et al. |
| 2015/0151135 | A1 | 6/2015 | Kalghatgi et al. |
| 2015/0157870 | A1 | 6/2015 | Kalghatgi et al. |

(56) References Cited

U.S. PATENT DOCUMENTS

| | | | |
|---|---|---|---|
| 2015/0182975 A1* | 7/2015 | Matsuura | B03C 3/78 |
| | | | 95/8 |
| 2015/0209595 A1 | 7/2015 | Kalghatgi et al. | |
| 2015/0283283 A1 | 10/2015 | Schieven | |
| 2015/0340207 A1 | 11/2015 | Holbeche | |
| 2015/0373923 A1 | 12/2015 | Ferrell et al. | |
| 2016/0045246 A1 | 2/2016 | Stieber et al. | |
| 2016/0089545 A1 | 3/2016 | Juluri et al. | |
| 2016/0106993 A1 | 4/2016 | Watson et al. | |
| 2016/0113701 A1 | 4/2016 | Zemel et al. | |
| 2016/0166818 A1 | 6/2016 | Kalghatgi et al. | |
| 2016/0220670 A1 | 8/2016 | Kalghatgi et al. | |
| 2016/0236002 A1 | 8/2016 | Dirk et al. | |
| 2016/0242269 A1 | 8/2016 | Dirk et al. | |
| 2016/0271411 A1 | 9/2016 | Hummel et al. | |
| 2016/0271412 A1 | 9/2016 | Hummel et al. | |
| 2016/0331436 A1 | 11/2016 | Holbeche | |
| 2016/0331437 A1 | 11/2016 | Holbeche et al. | |
| 2016/0331989 A1 | 11/2016 | Cho et al. | |
| 2016/0338184 A1 | 11/2016 | Holbeche | |
| 2016/0338755 A1 | 11/2016 | Holbeche et al. | |
| 2016/0354614 A1 | 12/2016 | Watson et al. | |
| 2016/0361558 A1 | 12/2016 | Jacofsky et al. | |

FOREIGN PATENT DOCUMENTS

| | | |
|---|---|---|
| EP | 644159 A2 | 3/1995 |
| EP | 2016809 A2 | 1/2009 |
| EP | 2820949 A1 | 1/2015 |
| EP | 3051926 A1 | 8/2016 |
| JP | 2013034945 A | 2/2013 |
| KR | 20150142162 A | 12/2015 |
| WO | 2001010215 A1 | 2/2001 |
| WO | 2001050963 A1 | 7/2001 |
| WO | 2002059046 A2 | 8/2002 |
| WO | 2006076334 A1 | 7/2006 |
| WO | 2006116252 A2 | 11/2006 |
| WO | 2007048806 A1 | 5/2007 |
| WO | 2007063987 A1 | 6/2007 |
| WO | 2010009103 A2 | 1/2010 |
| WO | 2010022160 A2 | 2/2010 |
| WO | 2010085513 A1 | 7/2010 |
| WO | 2010107722 A1 | 9/2010 |
| WO | 2010107741 A1 | 9/2010 |
| WO | 2010107744 A1 | 9/2010 |
| WO | 2010107745 A1 | 9/2010 |
| WO | 2010107746 A1 | 9/2010 |
| WO | 2011058301 A1 | 5/2011 |
| WO | 2011128620 A1 | 10/2011 |
| WO | 2012018891 A2 | 2/2012 |
| WO | 2012106735 A2 | 8/2012 |
| WO | 2012112042 A1 | 8/2012 |
| WO | 2013040542 A1 | 3/2013 |
| WO | 2014145570 A1 | 9/2014 |
| WO | 2015071099 A1 | 5/2015 |
| WO | 2016020407 A1 | 2/2016 |
| WO | 2016037599 A1 | 3/2016 |
| WO | 2016068382 A1 | 5/2016 |
| WO | 2016096751 A1 | 6/2016 |
| WO | 2016128873 A1 | 8/2016 |
| WO | 2016192986 A1 | 12/2016 |
| WO | 2016192997 A1 | 12/2016 |
| WO | 2017008781 A1 | 1/2017 |
| WO | 2017147362 A1 | 8/2017 |

OTHER PUBLICATIONS

Alekseev, Oleg et al., "Nonthermal Dielectric Barrier Discharge (DBD) Plasma Suppresses Herpes Simplex Virus Type 1 (HSV-1) Replication in Corneal Epithelium", TVST, 2014, vol. 3, No. 2, Article 2, pp. 1-14.

Alhabshan, Rashed et al., "Effects of In-vivo Application of Cold Atmospheric Plasma on Corneal Wound Healing in New Zealand White Rabbits", International Journal of Ophthalmic Pathology, 2013, 2:3, pp. 1-5.

Brun, Paolo et al., "Disinfection of Ocular Cells and Tissues by Atmospheric-Pressure Cold Plasma", PLoS One, Mar. 2012, vol. 7, Issue 3, e33245, pp. 1-13.

Critzer, Faith J. et al., "Atmospheric Plasma Inactivation of Foodborne Pathogens on Fresh Produce Surfaces", Journal of Food Protection, vol. 70, No. 10, 2007, pp. 2290-2296.

Delaquis, Pascal J. et al., "Disinfection of Mung Bean Seed with Gaseous Acetic Acid", Journal of Food Protection, vol. 62, No. 8, 1999, pp. 953-957.

Park, Dayonna P. et al., "Reactive nitrogen species produced in water by non-equilibrium plasma increase plant growth rate and nutritional yield", Current Applied Physics 13 (2013), pp. 519-529.

Sera, Bozena et al., "Germination of Chenopodium Album in Response to Microwave Plasma Treatment", Plasma Science and Technology, vol. 10, No. 4, Aug. 2008, pp. 506-511.

Niemira, Brendan A., Cold Plasma Inactivates *Salmonella* Stanley and *Escherichia coli* O157:h7 Inoculated on Golden Delicious Apples, Journal of Food Protection, vol. 71, No. 7, 2008, pp. 1357-1365.

Escobar-Cortes, K., et al., "Proteases and sonication specifically remove the exosporium layer . . . ", J. Microbiol. Methods, Jan. 2013.

Venezia, Richard, et al., "Lethal Activity of Nonthermal Plasma . . . ", Univ. of Chicago Press, Infection Control and Hospital Epidemiology, vol. 29, No. 5, May 2008, http://www.jstor.org/stable/10.1086/588003.

Lawley, Trevor, D., et al., "Proteomic and Genomic Characterization of Highly Infectious . . . ", J. Bacteriol. 2009, vol. 191, No. 17, pp. 5377-5386, Jun. 2009, http://jb.asm.org/content/191/17/5377.

Oehmigen, K., et al., "The Role of Acidification for Antimicrobial . . . ", Wiley InterScience, Plasma Process. and Polym. 2010, 7, pp. 250-257, 2010.

Lawley, Trevor, D., et al., "Use of Purified Clostridium difficile Spores . . . ", Appl. Environ. Microbiol., pp. 6895-6900, Aug. 2010.

Ermolaeva, Svetlana, A., et al., "Bactericidal effects of non-thermal argon plasma . . . ", J. Med. Microbiol., Sep. 2010, http://jmm.sgmjournals.org/content/60/1/75.full.

Burlica et al. "Formation of H2 and H2O2 in a Water-Spray Gliding Arc Nonthermal Plasma Reactor", Industrial & Engineering Chemistry Research, vol. 49, No. 14, Jun. 24, 2010.

Traylor, Matthew, J., et al., "Long-term antibacterial efficacy of air plasma-activated water", J. Phys. D: Appl. Phys., Nov. 2011, http://www.stacks.iop.org/JPhysD/44/472001.

Huang, Yaohua, "Non-thermal Plasma Inactivation of Bacillus Amyloliquefaciens Spores", Master's Thesis, Univ. of Tennessee, 2011, http://www.trace.tennessee.edu/utk_gradthes/980.

Tolls, Elisabeth, H., et al., Surface Layers of Clostridium difficile Endospores, J. Bacteriol. 2011, vol. 193, No. 23, pp. 6461-6470, 2011.

Paredes-Sabja, D., et al., "Adherence of Clostridium difficile spores to Caco-2 cells in culture", J. Med. Microbiol., pp. 1208-1218, 2012.

Pei., X., et al., "Inactivation of a 25.5 . . . Enterococcus faecalis biofilm . . . ", J. Phys. D: Appl. Phys., http://www.stacks.iop.org/JPhysD/45/165205, Apr. 2012.

Ma Ruonan et al., "Non-thermal plasma-activated water inactivation of food-borne pathogen on fresh product," Journal of Hazardous Materials, vol. 300, Dec. 31, 2015, pp. 643-651.

Choi-Jeng-Hae et al., "Treatment with low-temperature atmospheric pressure plasma enhances cutaneous delivery of epidermal growth factor by regulating E-cadherin-meidcated cell junctions," Arch Dermatol (2014) 306-635-643.

International Search Report and Written Opinion for International Application No. PCT/US2017/019259 dated May 31, 2017.

International Search Report and Written Opinion for International Application No. PCT/US2017/032078 dated Jul. 25, 2017.

International Search Report and Written Opinion for International Application No. PCT/US2017/060769 dated Jan. 25, 2018.

Office Action from U.S. Appl. No. 15/807,997 dated Oct. 29, 2019.

Notice of Allowance from U.S. Appl. No. 15/807,997 dated Feb. 10, 2020.

\* cited by examiner

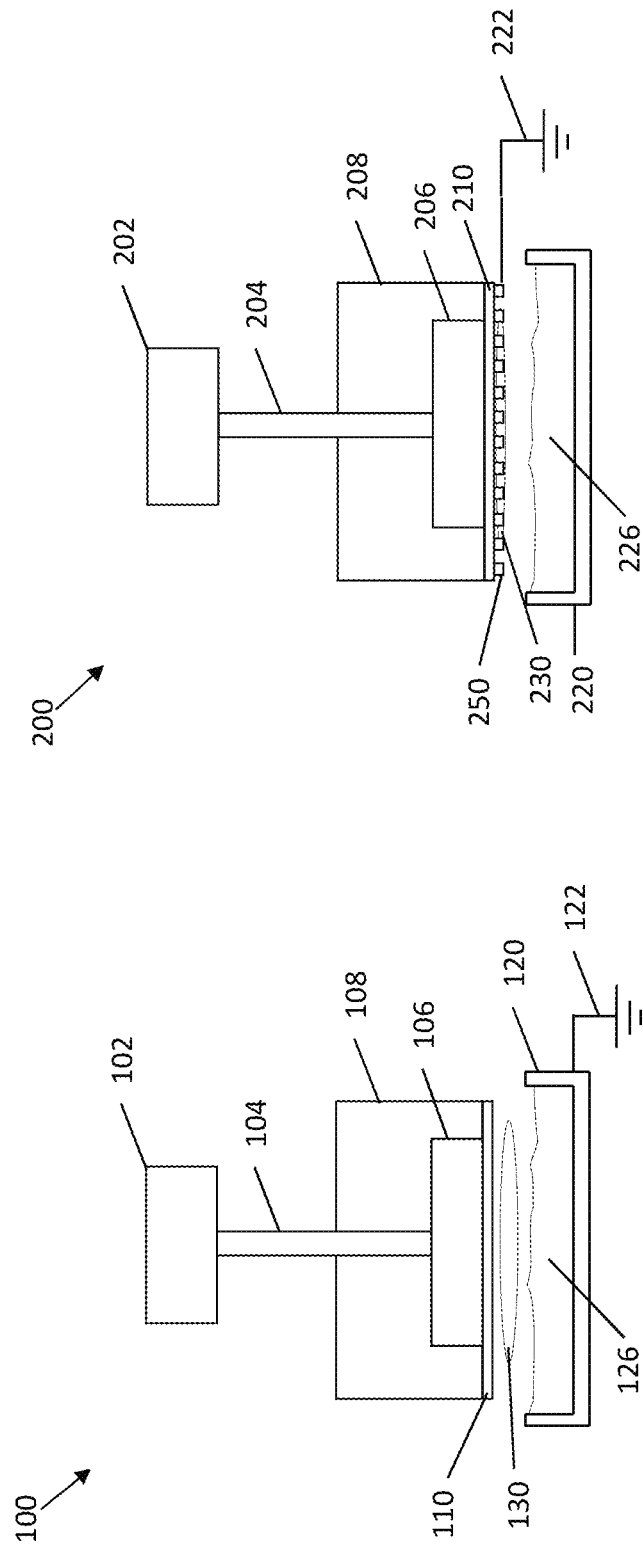

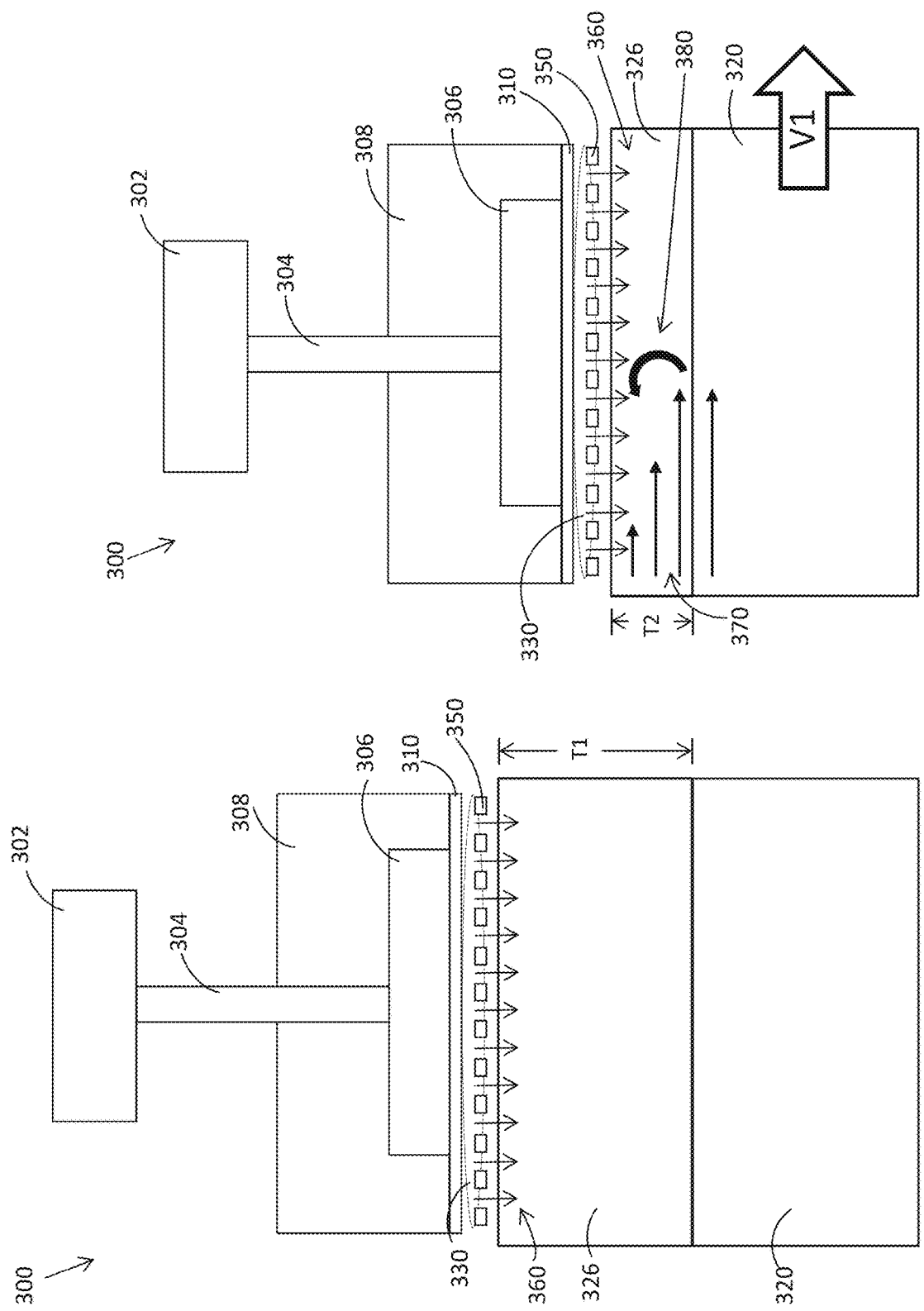

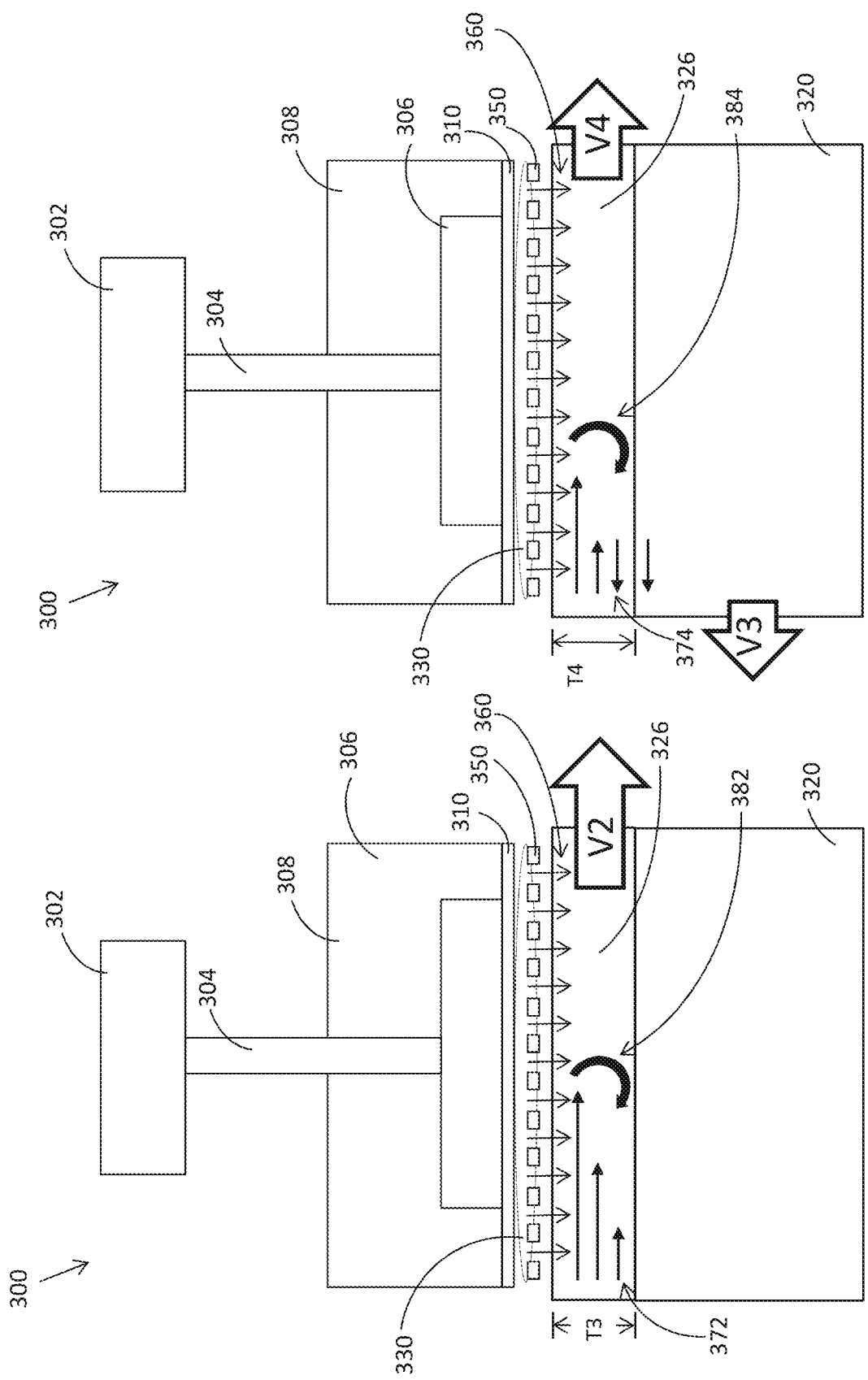

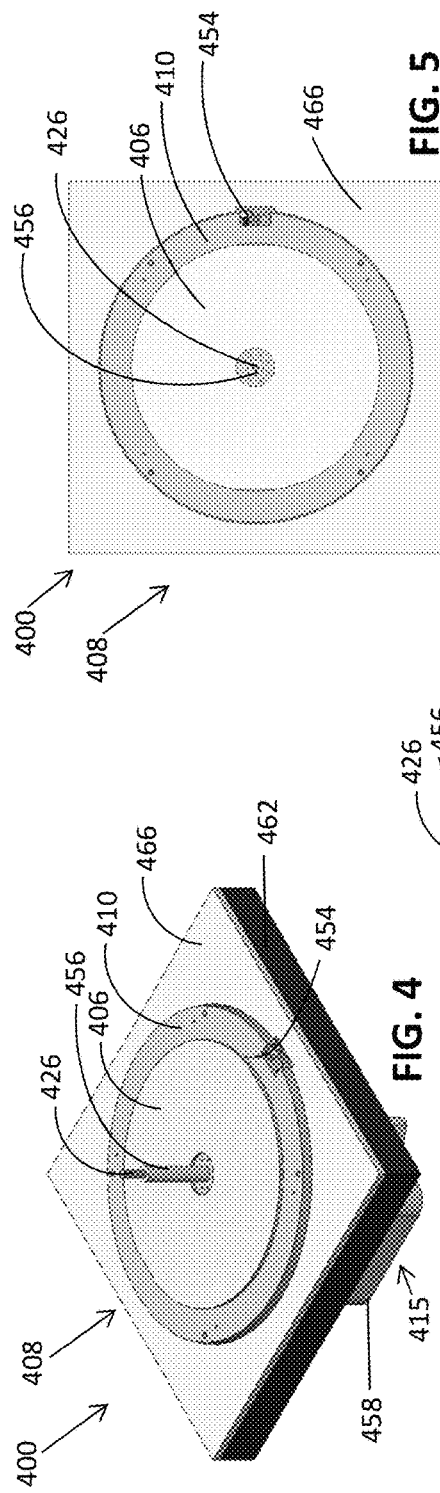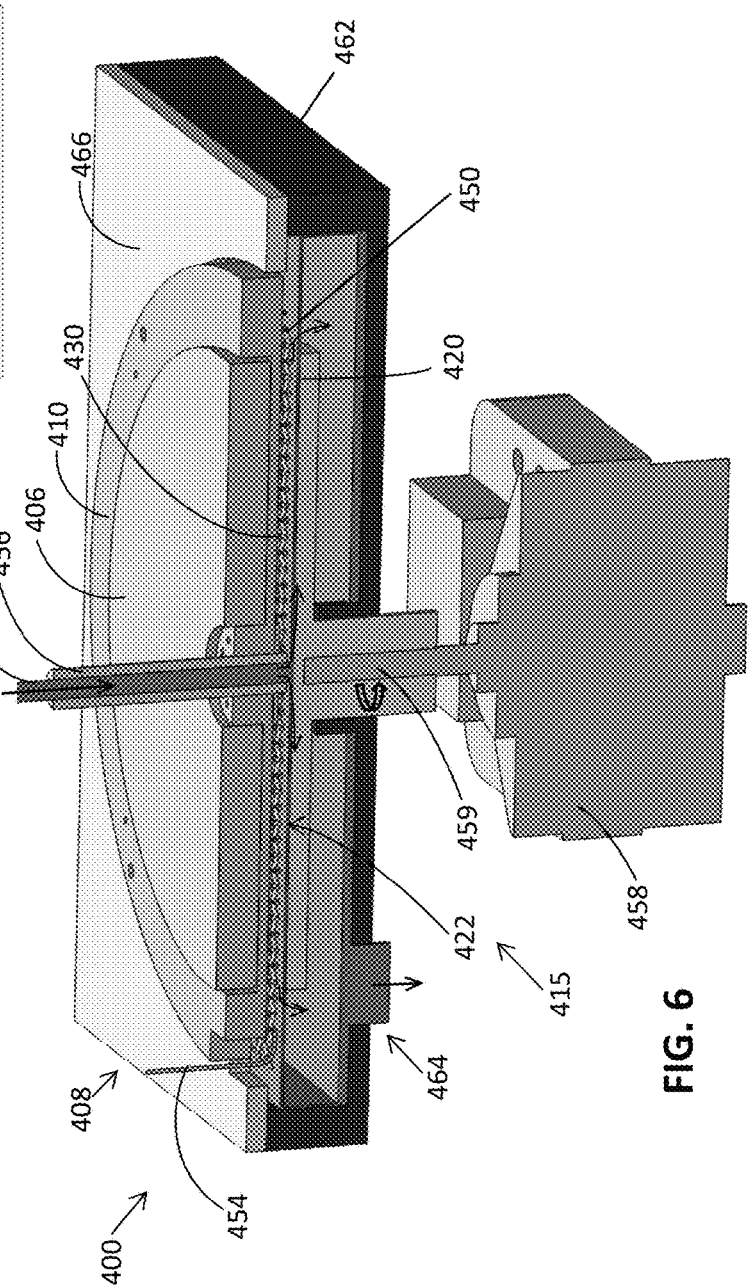

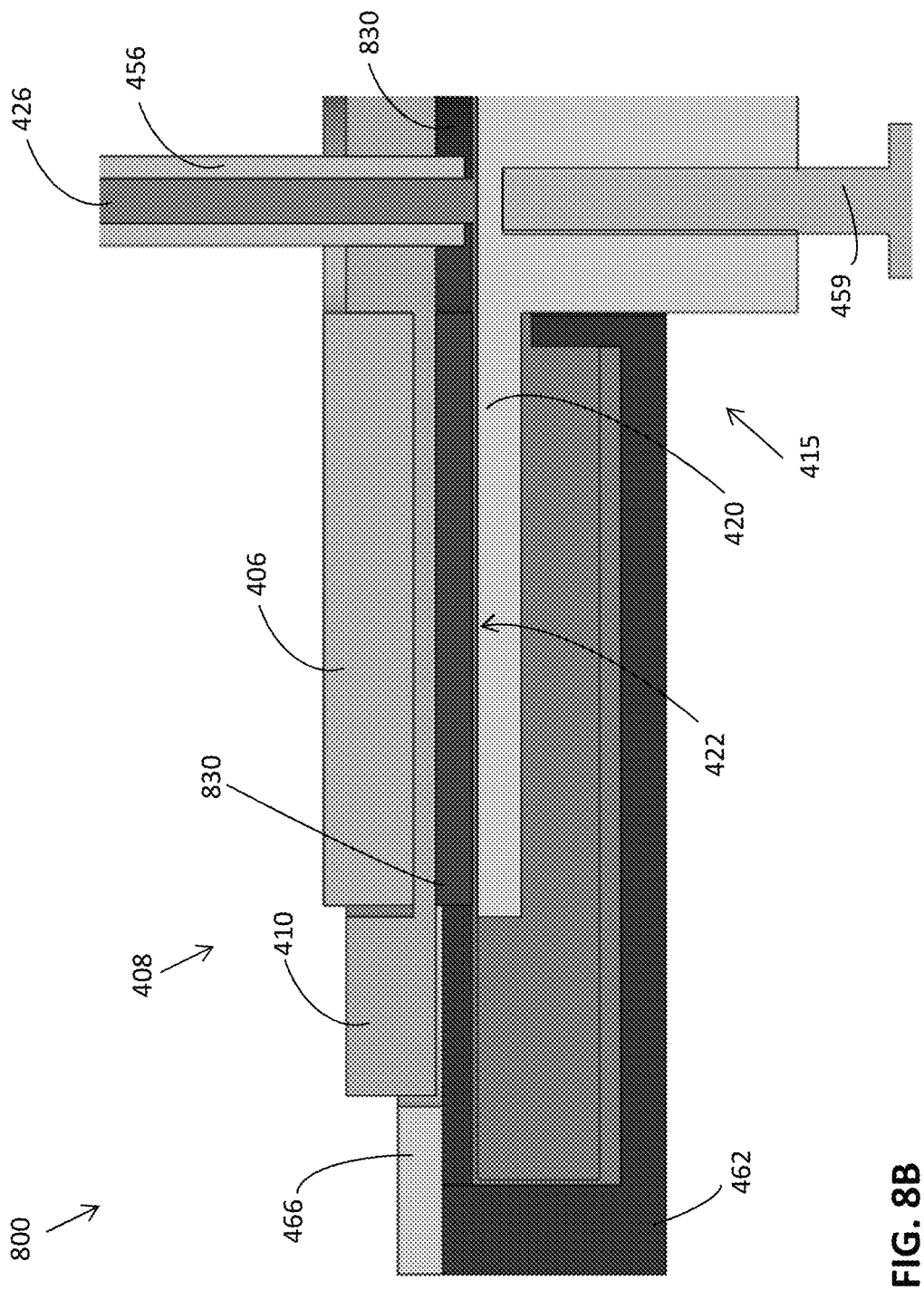

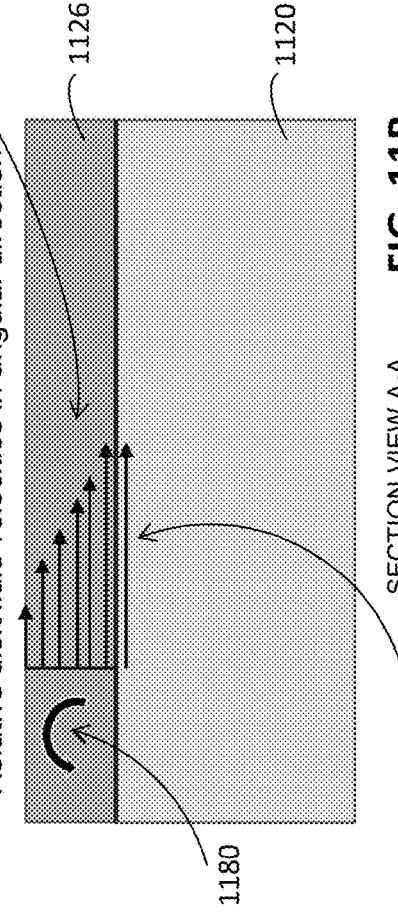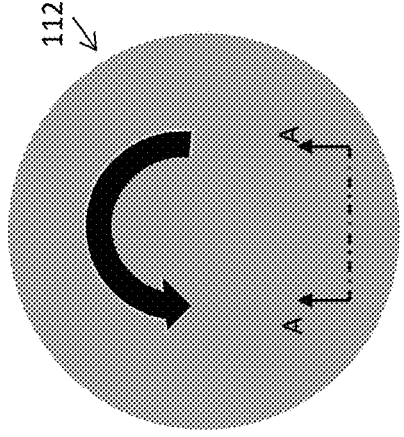
FIG. 11B
FIG. 11A
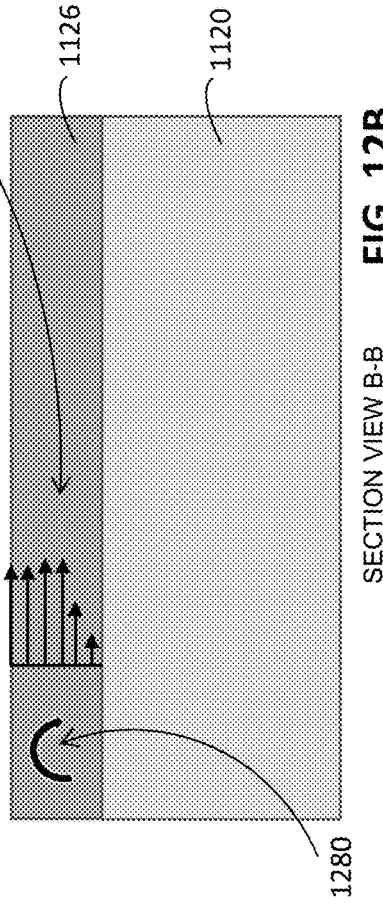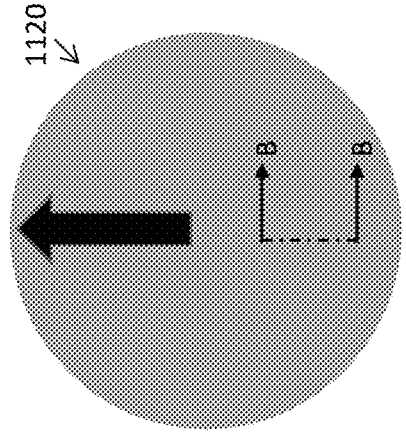
FIG. 12B
FIG. 12A

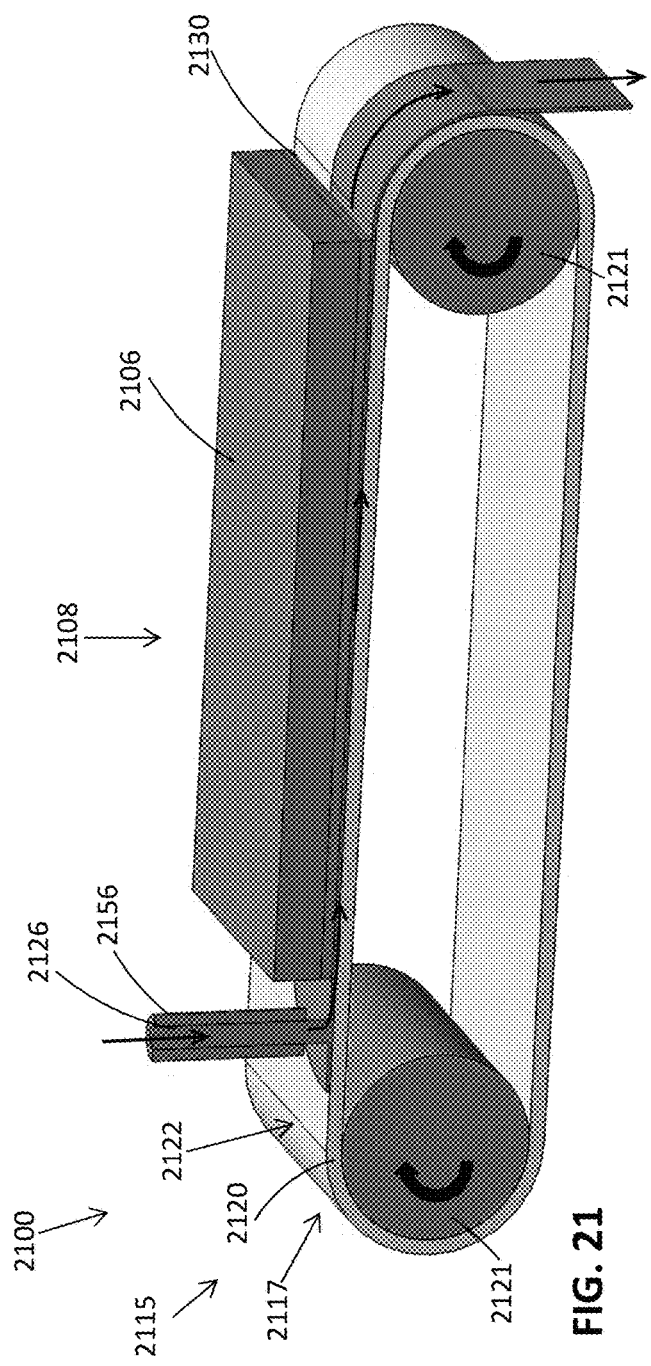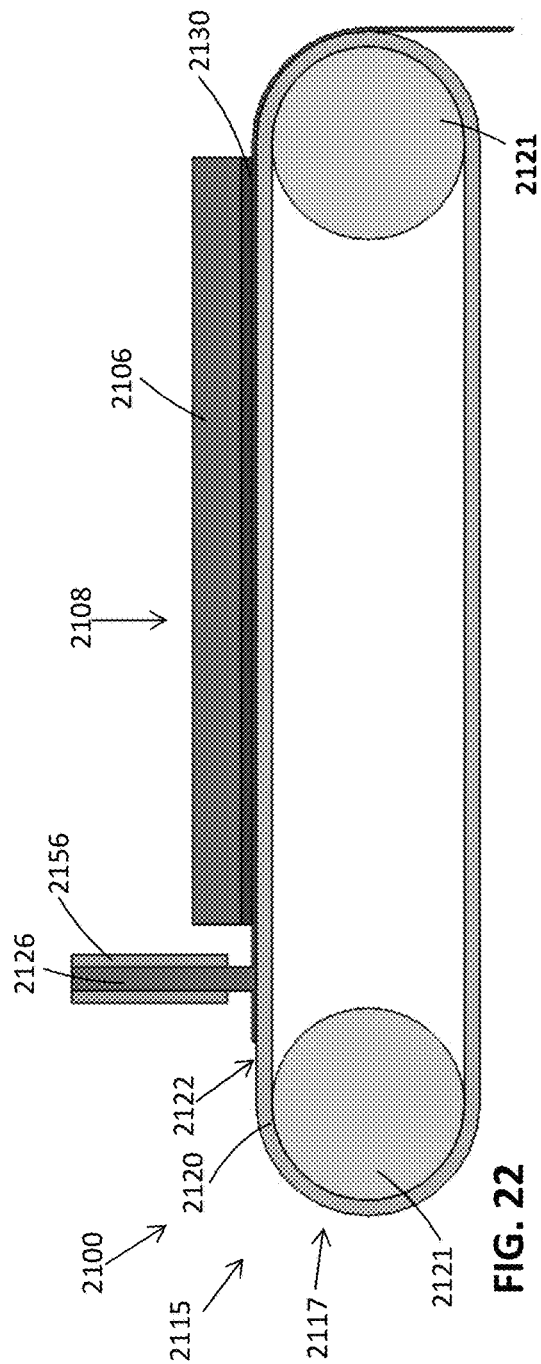

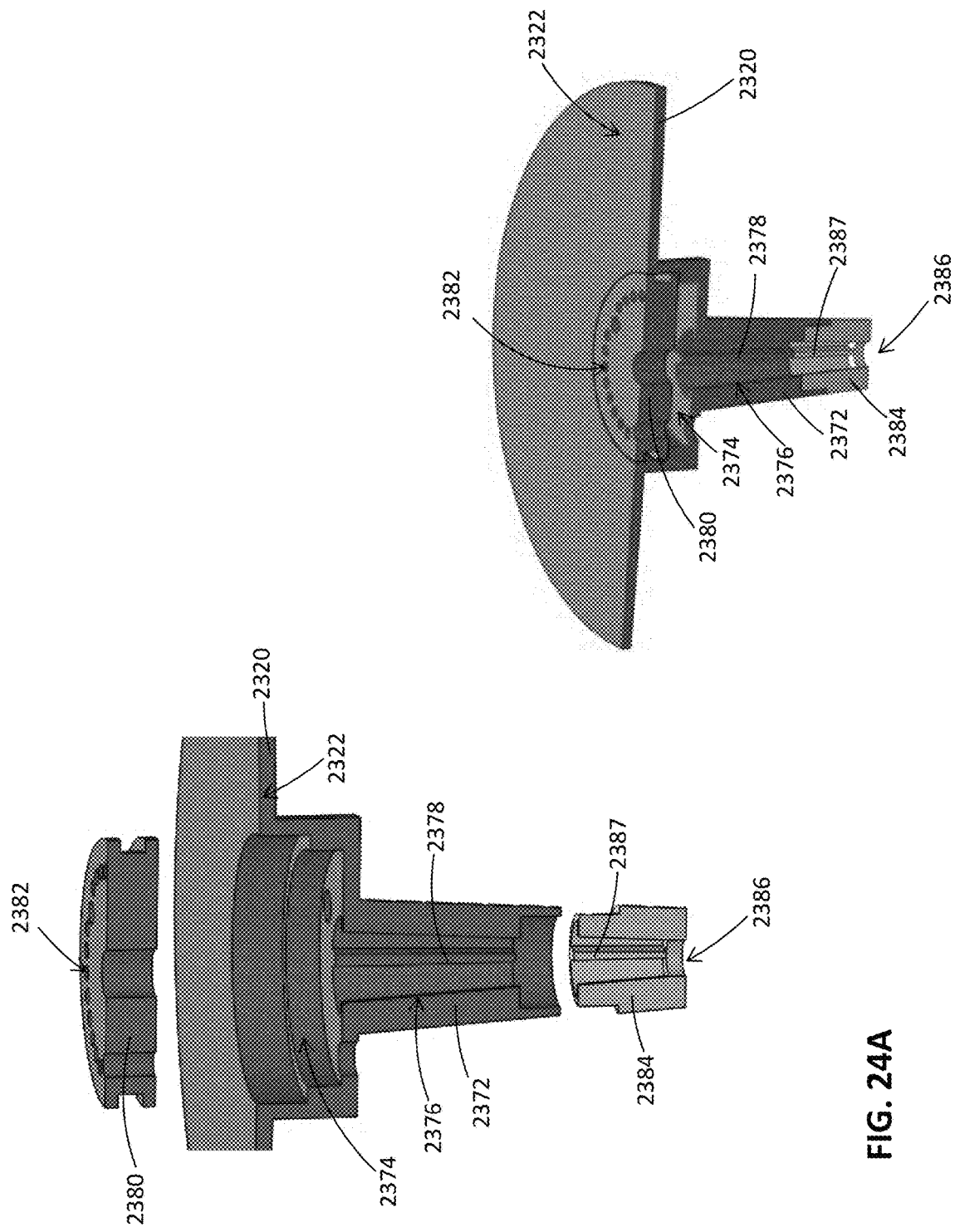

METHODS AND SYSTEMS FOR GENERATING PLASMA ACTIVATED LIQUID

RELATED APPLICATIONS

This application is a continuation application of U.S. patent application Ser. No. 15/807,997, filed Nov. 9, 2017, which claims priority to U.S. Provisional Application Ser. No. 62/420,101, filed Nov. 10, 216, and is incorporated herein by reference in its entirety.

TECHNICAL FIELD

The present invention relates generally to methods and systems for activating fluid using non-thermal plasma, and more particularly for producing plasma-activated liquid by activating a thin layer of fluid.

BACKGROUND OF THE INVENTION

Water and other fluids can be treated with plasma to "activate" them. Plasma treatments include direct and indirect methods of exposing the liquid to the plasma. Current technology is restricted to treating the liquid with a plasma above the liquid surface with limited penetration. Diffusion of the active species into the liquid is severely diminished by any appreciable thickness of the liquid. As a consequence, plasma activated liquids are produced in very small volumes at a slow rate and with low concentrations. Some technology has tried to create plasma inside of the liquid to introduce activated species deeper into the liquid with little or no success.

Methods and systems that use plasma to generate a large volume of plasma-activated liquid (PAL) with high concentrations of activated species are disclosed herein.

SUMMARY

According to one aspect of the present invention, a plasma activated liquid generation apparatus includes a supply of a liquid, a liquid thinning device including a thinning surface, where a velocity differential between the liquid and the thinning surface creates a thin layer of the liquid as the liquid flows across the thinning surface, and a plasma generating device for generating a plasma proximate to the thin layer of liquid on the thinning surface of the liquid thinning device, where at least a portion of the liquid exposed to the plasma becomes plasma activated.

The descriptions of the invention do not limit the words used in the claims in any way or the scope of the claims or invention. The words used in the claims have all of their full ordinary meanings.

BRIEF DESCRIPTION OF THE DRAWINGS

In the accompanying drawings, which are incorporated in and constitute a part of the specification, embodiments of the invention are illustrated, which, together with a general description of the invention given above, and the detailed description given below, serve to exemplify embodiments of this invention.

FIG. 1 illustrates a prior art embodiment for creating activated fluid using direct plasma.

FIG. 2 illustrates a prior art embodiment for creating activated fluid using indirect plasma.

FIG. 3A illustrates an exemplary PAL generation apparatus.

FIG. 3B illustrates another exemplary PAL generation apparatus.

FIG. 3C illustrates another exemplary PAL generation apparatus.

FIG. 3D illustrates another exemplary PAL generation apparatus.

FIG. 4 is a perspective drawing of an exemplary embodiment of a PAL generation apparatus with an exemplary spin disk.

FIG. 5 is a top view drawing of the apparatus of FIG. 4.

FIG. 6 is a cross-section of the perspective drawing of the apparatus of FIG. 4.

FIG. 8B is a cross-section of a portion of the apparatus of FIG. 8A.

FIG. 11A is a schematic top view showing the angular direction of an exemplary spin disk with fluid.

FIG. 11B shows a cross-section side view of the spin disk with fluid from FIG. 11A.

FIG. 12A is a schematic top view showing the radial direction of an exemplary spin disk with fluid.

FIG. 12B shows a cross-section side view of the spin disk with fluid from FIG. 12A.

FIG. 21 is a cross-section of a perspective drawing of an exemplary embodiment of a PAL generation apparatus with an exemplary conveyor.

FIG. 22 is a side view cross-section of a portion of the apparatus of FIG. 21.

FIG. 24A is a cross-section view of selected components of the apparatus of FIG. 23A.

FIG. 24B is another cross-section view of selected components of the apparatus of FIG. 23A.

DESCRIPTION

Figure 7A:
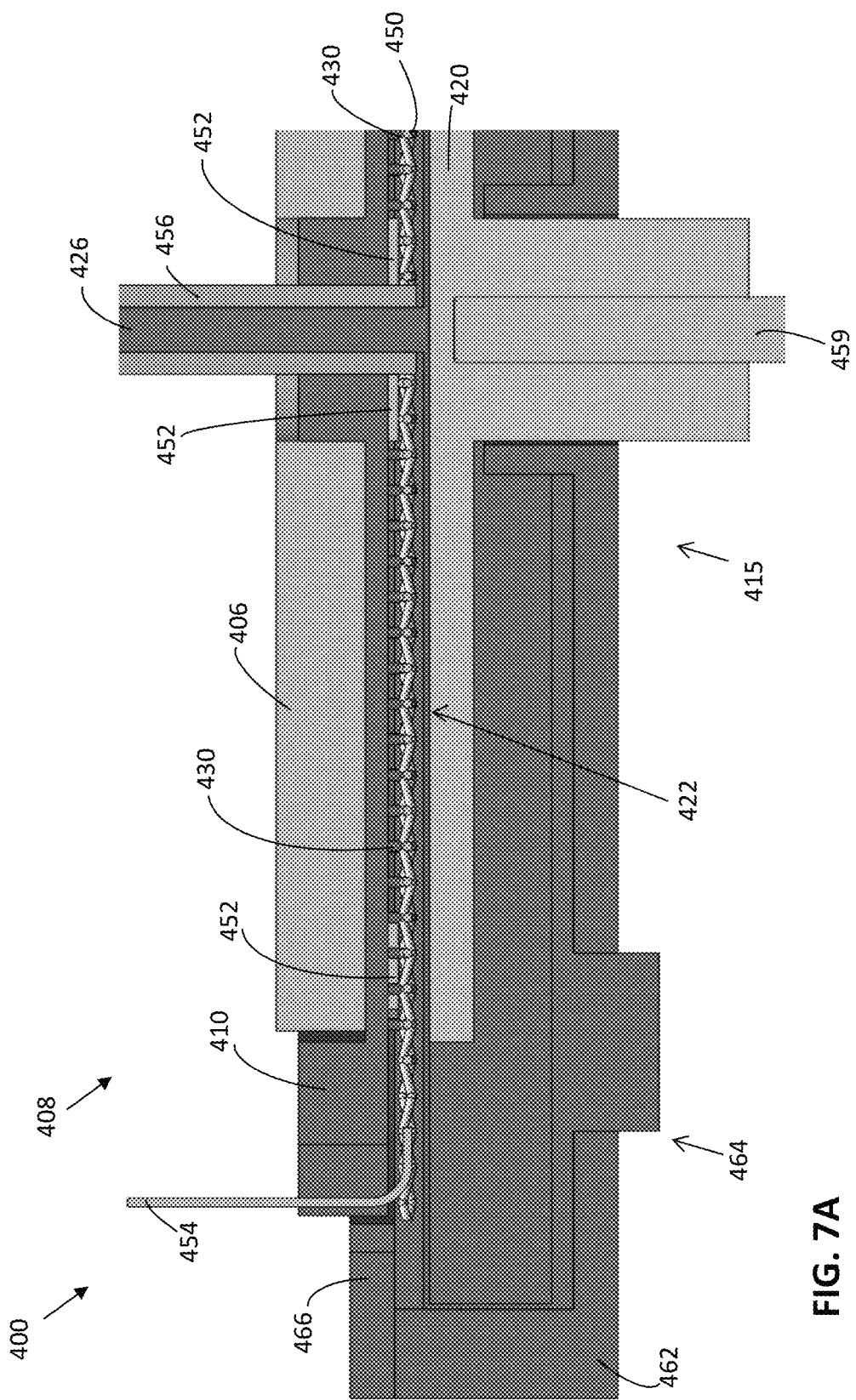
FIG. 7A is a cross-section of a portion of the apparatus of FIG. 4.
Figure 7B:
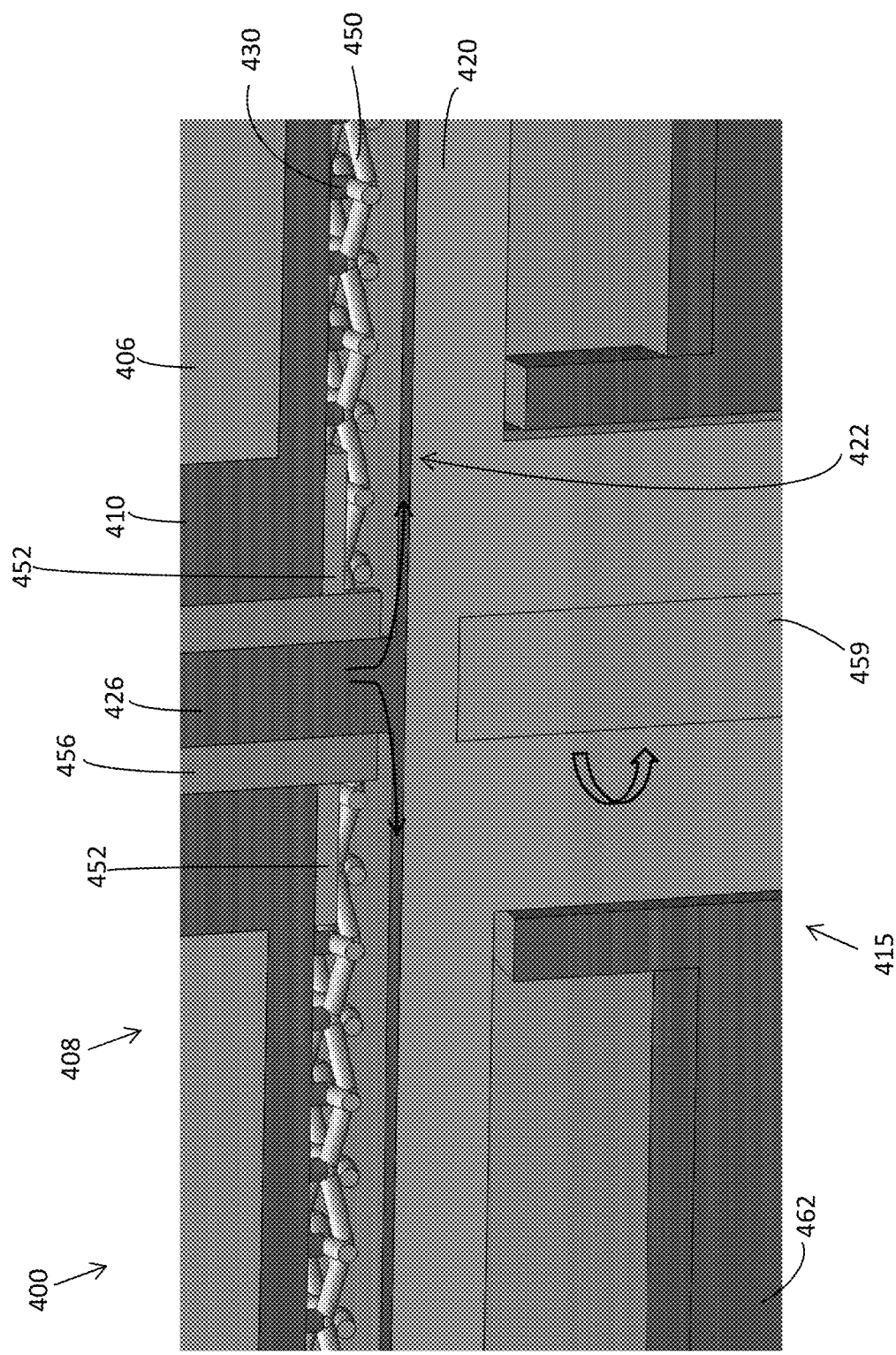
FIG. 7B is a cross-section of another portion of the apparatus of FIG. 4.

The following includes definitions of exemplary terms used throughout the disclosure. Both singular and plural forms of all terms fall within each meaning:

"Circuit" or "circuitry," as used herein includes, but is not limited to, hardware, firmware, software or combinations of each to perform a function(s) or an action(s). For example, based on a desired feature or need, a circuit may include a software controlled microprocessor, discrete logic such as an application specific integrated circuit (ASIC), or other programmed logic device. A circuit may also be fully embodied as software. As used herein, "circuit" is considered synonymous with "logic."

"Controller," as used herein includes, but is not limited to, any circuit or device that coordinates and controls the operation of one or more input or output devices. For example, a controller can include a device having one or more processors, microprocessors, or central processing units (CPUs) capable of being programmed to perform input or output functions.

"Logic," as used herein includes, but is not limited to, hardware, firmware, software or combinations of each to perform a function(s) or an action(s), or to cause a function or action from another component. For example, based on a desired application or need, logic may include a software controlled microprocessor, discrete logic such as an application specific integrated circuit (ASIC), or other programmed logic device. Logic may also be fully embodied as software. As used herein, "logic" is considered synonymous with "circuit."

"Operative communication" or "circuit communication," as used herein includes, but is not limited to, a communicative relationship between devices, logic, or circuits, including mechanical and pneumatic relationships. Direct electrical, electromagnetic, and optical connections and indirect electrical, electromagnetic, and optical connections are examples of such communications. Linkages, gears, chains, push rods, cams, keys, attaching hardware, and other components facilitating mechanical connections are also examples of such communications. Pneumatic devices and interconnecting pneumatic tubing may also contribute to operative communications. Two devices are in operative communication if an action from one causes an effect in the other, regardless of whether the action is modified by some other device. For example, two devices separated by one or more of the following: i) amplifiers, ii) filters, iii) transformers, iv) optical isolators, v) digital or analog buffers, vi) analog integrators, vii) other electronic circuitry, viii) fiber optic transceivers, ix) Bluetooth communications links, x) 802.11 communications links, xi) satellite communication links, xii) near-field communication, and xili) other wireless communication links. As another example, an electromagnetic sensor is in operative communication with a signal if it receives electromagnetic radiation from the signal. As a final example, two devices not directly connected to each other, but both capable of interfacing with a third device, e.g., a central processing unit (CPU), are in operative communication.

"Processor," as used herein includes, but is not limited to, one or more of virtually any number of processor systems or stand-alone processors, such as microprocessors, microcontrollers, central processing units (CPUs), and digital signal processors (DSPs), in any combination. The processor may be associated with various other circuits that support operation of the processor, such as random access memory (RAM), read-only memory (ROM), programmable read-only memory (PROM), erasable programmable read-only memory (EPROM), clocks, decoders, memory controllers, or interrupt controllers, etc. These support circuits may be internal or external to the processor or its associated electronic packaging. The support circuits are in operative communication with the processor. The support circuits are not necessarily shown separate from the processor in block diagrams or other drawings.

"Signal," as used herein includes, but is not limited to, one or more electrical signals, including analog or digital signals, one or more computer instructions, a bit or bit stream, or the like.

"Software," as used herein includes, but is not limited to, one or more computer readable or executable instructions that cause a computer or other electronic device to perform functions, actions, or behave in a desired manner. The instructions may be embodied in various forms such as routines, algorithms, modules or programs including separate applications or code from dynamically linked libraries. Software may also be implemented in various forms such as a stand-alone program, a function call, a servlet, an applet, instructions stored in a memory, part of an operating system, or other types of executable instructions. It will be appreciated by one of ordinary skill in the art that the form of software is dependent on, for example, requirements of a desired application, the environment it runs on, or the desires of a designer/programmer or the like.

While the above exemplary definitions have been provided, it is Applicant's intention that the broadest reasonable interpretation consistent with this specification be used for these and other terms.

Plasmas, or ionized gases, have one or more free electrons that are not bound to an atom or molecule. Plasmas may be generated using a variety of gases including, air, nitrogen, noble gases (He, Ar, Xe, Kr, etc), oxygen, carbon dioxide and mixtures thereof under an electric field. In addition, non-thermal plasmas provide high concentrations of energetic and chemically active species. They can operate far from thermodynamic equilibrium with high concentrations of active species and yet remain at a temperature that is substantially the same as room temperature. The energy from the free electrons may be transferred to additional plasma components creating additional ionization, excitation and/or dissociation. Fluid that is contacted with plasma becomes "activated" and is referred to herein as plasma activated fluid, and in some embodiments, the plasma activated fluid is a plasma activated liquid (PAL), including, for example, plasma activated water.

In some embodiments, plasmas may contain superoxide anions $[O2^{--}]$, which react with $H^+$ in acidic media to form hydroperoxy radicals, $HOO^-$: $[O_2^-]+[H^+] \rightarrow [HOO^-]$. Other radical species may include OH' and NO' in aqueous phase or the presence of air or gas. For example, treating water with plasma results in plasma activated water that may contain concentrations of one or more of ozone, $H_2O_2$, nitrates, nitrites, radicals and other active species.

Activating fluids, including, for example, water, with plasma to obtain plasma activated fluids is shown and described in U.S. Provisional Application Ser. No. 62/252,720, titled Method and System to Create a Large Volume of Highly Concentrated Plasma Activated Liquid Using Cold Plasma, filed Nov. 9, 2015; U.S. Published Patent Application Number 2014/0322096, titled Sanitization Station Using Plasma Activated Fluid, filed on Jul. 2, 2014; and U.S. Published Patent Application Number 2014/0100277, titled Solutions and Methods of Making Solutions to Kill or Deactivate Spores Microorganisms, Bacteria and Fungus, filed on Mar. 15, 2013. All of which are incorporated by reference herein in their entirety. Several other patents and applications such as: WO 2007/048806, titled Method for the Preparation of Biocidal Activated Water Solutions, filed Oct. 25, 2006; WO 2012/018891, which is titled Materials for Disinfection Produced by Non-Thermal Plasma, filed on Aug. 3, 2011; and U.S. Pat. No. 7,291,314, titled Activated Water Apparatus and Methods, filed Dec. 20, 2001, are incorporated herein by reference in their entirety for their disclosure on activating fluid. Further, U.S. patent Ser. No. 13/843,189, titled Methods and Solutions for Killing or Deactivating Spores, filed Mar. 15, 2013 and U.S. patent Ser. No. 13/838,418, titled Methods and Solutions for Killing or Deactivating Bacteria, filed Mar. 15, 2013 are also incorporated herein by reference in their entirety for their disclosure on activating fluid.

It is known to treat water and other fluids with plasma to "activate" them. One method of activating water and other fluids is illustrated in FIG. 1, which is a prior art dielectric barrier discharge ("DBD") plasma generating system 100. The prior art plasma generating system 100 includes a high voltage source 102, a conductor 104, a DBD plasma generator housing 108, a high voltage electrode 106 and a dielectric barrier 110. The plasma generating system 100 also includes a container 120 which is grounded with a grounding conductor 122. During operation, the high voltage source 102 is turned on and plasma 130 forms below the dielectric barrier 110. The high voltage power source 102 may be a DC power source, a high frequency AC power source, an RF power source, a pulsed DC power source, a pulsed AC power source, a microwave power source or the like. The power supply can be pulsed with a duty cycle of 0-100% and pulse duration of 1 nanosecond up to 1 microsecond.

The plasma 130 contacts the fluid 126, which may be, for example, water, and activates the fluid 126. Fluid 126 activated by direct contact with plasma is referred to herein as "direct plasma activated fluid."

FIG. 2 illustrates an exemplary prior art system 200 for activating a fluid using indirect plasma. System 200 includes a high voltage power source 202. High voltage power source 202 may be a DC power source, a high frequency AC power source, an RF power source, a microwave power source, a pulsed DC power source, a pulsed AC power source or the like. The power supply can be pulsed with a duty cycle of 0-100% and pulse duration of 1 nanosecond up to 1 microsecond.

The exemplary system 200 includes a DBD plasma generator 208 connected to high voltage power source 202 by cable or conductor 204. DBD plasma generator housing 208 includes a high voltage electrode 206 and a dielectric barrier 210 located between high voltage electrode 206 and a filter 250 located above the fluid 226 in container 220 that is to be activated. In some embodiments, the fluid 226 is water. In this embodiment, for example, filter 250 is a conductive mesh that is grounded by grounding conductor 222.

During operation of system 200, when high voltage electrode 206 is energized, plasma 230 forms below the dielectric barrier 210. The filter 250 (if the filter 250 is made of a conductive material and grounded) prevents charged ions and electrons from passing through the filter 250 and contacting the fluid 226 to be activated. Thus, only neutral species pass through the conductive filter 250 and activate the fluid 226. This is typically referred to as "afterglow" or "indirect" plasma. Fluid 226 activated by afterglow that passes through, or is created through filter 250, is referred to "indirect plasma activated fluid."

In some embodiments, an exemplary stainless steel mesh can be utilized as filter 250. In one embodiment, for example, the stainless steel mesh may be a stainless steel woven wire having a 10×10 mesh with a 0.025" wire diameter and a 0.075" opening size (56% opening area). In other embodiments, various filters 250, including meshes, with different sizes, conducting materials, wire diameters, weave patterns, opening sizes, etc., may be used.

The fluid being activated can be a variety of different fluids, including, for example, various liquids. In some exemplary embodiments, liquid can be water, water with additional additives, or other liquids with additives. In some embodiments, the properties of the fluid may be altered prior to, during, and/or after activation by plasma.

For example, the properties of the fluid may be altered prior to activation by plasma or indirect plasma to increase or decrease concentration of species, radicals, and the like. For example, the pH of water may be adjusted to be acidic or basic. The pH may be adjusted by, for example, adding acid to the water prior to activation. The pH level may be lowered through the activation process. In one embodiment, the pH level of the activated water is about 2.0, in another embodiment the pH is between about 2.0 and 3.5, and in yet another embodiment the pH is about 2.7. Still, in another embodiment the pH is less than about 3.0 and in another embodiment is less than about 2.0.

In another exemplary embodiment, the liquid can be an alcohol, such as, for example, ethyl alcohol, ethanol alcohol, or isopropanol alcohol, diluted with water. Exemplary embodiments include formulations that contain water and ethanol mixtures. These formulations may contain up to about 70% ethanol, including up to about 60% ethanol, including up to about 50% ethanol, including up to about 40% ethanol, including up to about 30% ethanol, including up to about 20% ethanol, including up to about 10% ethanol. In one exemplary embodiment, the liquid is tap water. In other embodiments, the liquid can be distilled water, deionized water, filtered water, saline, water with acidic properties, and/or water with basic properties. In some exemplary embodiments, the formulation includes water, alcohol, and/or one or more additional additives.

In yet other embodiments, the liquid can be mixed with additives to improve the antimicrobial efficacy against virus, bacteria, and/or fungi. In some exemplary embodiments, the additive is a stabilizer. For example, use of a stabilizer enables an exemplary activated wipe (e.g., a wipe with a PAL) to retain its antimicrobial benefits for a longer period than would otherwise exist with formulations that do not have a stabilizer. Non-limiting examples of additives/stabilizers that can be added to the liquid include alcohol (e.g., ethanol, isopropyl alcohol), hydrogen peroxide, nitrite (e.g. sodium nitrite), bio active oil (e.g., limonene, coconut oil, grape seed oil, olive oil, thyme oil), acid (e.g., acetic acid, citric acid, nitrous acid, hydrochloric acid), enzyme (e.g., superoxide dismutase, nitrate reductase); quaternary ammonium group (e.g., benzalkonium chloride, didecyldimethylammonium chloride), preservatives (e.g., methylparaben, propylparaben, phenoxyethanol), glycol (e.g., caprylyl glycol, propylene glycol), nonvolatile glycol ether (e.g., ethylene glycol n-hexyl ether, ethylene glycol n-butyl ether), and/or any combinations thereof.

In addition, other additives may be used to optimize generation, increase performance, and/or increase stability. These additives may include, for example: chelators to reduce metal degradation; surfactants to improve penetration of the solution and/or to reduce the impact of organic load; buffers used to adjust the pH; and/or alcohol, such as, for example, ethanol to increase stability. In addition, in some embodiments, corrosion inhibitors may be added, such as, for example, inorganic sulfates and/or inorganic phosphates. In some embodiments, a zeolite buffering system may be used. In some embodiments, one or more of these additives are added prior to activation of the fluid.

In addition, the properties of the activated fluid may be adjusted during the activation process itself by altering the gas that is ionized at the electrode. For example, the gas that is ionized may be normal air, $N_2$, $O_2$, He, Ar, Xe, Kr, vaporized liquids (water, ethanol and others), combinations thereof at various ratios, or the like. In some embodiments, one or more inert gases are used in the plasma generating process. In some embodiments, one or more noble gases are used in the plasma generating process, and in some embodiments, combinations of noble other gases and vaporized liquids are used in the plasma generating process.

Other additives may be added before or after the liquid is activated to increase efficacy or stabilization of the resulting solution. Other additives that may be used depending on the desired results include, for example, alcohol, silver salts (e.g., silver nitrate or silver chloride, or colloidal silver); zinc salts (e.g. zinc chloride, zinc lactate, or zinc oxide); suspensions containing metal nanoparticles; chlorhexidine; anionic, cationic, non-ionic and/or amphoteric surfactants; emulsifiers; hydrotropes; glycerol; chelating agents; alcohols; quaternary ammonium compounds, acids (organic or inorganic); bases; or surface tension decreasing agents.

In some embodiments, ethanol, acidified ethanol, n-propanol or isopropanol may be used as an additive to increase efficacy. In addition, it is believed that the addition of these ethanol additives may increase the half-life of radical species that aid in the killing and deactivation of spores.

In some embodiments, the additive is an additive, such as, for example, a volatile additive, like alcohol, which will not leave a residue on the surface after a surface has been treated with the PAL.

In some embodiments, the activated fluid may be blended with other activated or non-activated fluid(s) to achieve combined properties, including, for example, various concentrations or levels of activation.

The plasma used to create a PAL can be formed from any type of direct or indirect non-thermal plasma generator, such as, for example, a plasma jet, DBD, DBD plasma jet, RBD, gliding arc, corona discharge, non-thermal arc discharge, pulsed spark discharge, hollow cathode discharge, glow discharge, and the like. The voltage waveform generated by the plasma power supply can be DC, pulsed DC, pulsed AC, AC sinusoidal, RF, microwave and the like. In one embodiment, the plasma can be driven by ambient air. In other embodiments, the plasma can be driven by a feeding gas. Various feeding gases may be used, for example, including noble gasses (e.g., helium, argon), molecular gases (e.g., air, oxygen, nitrogen), gas carrying evaporated liquids, and/or combination thereof.

The embodiments shown in FIGS. 1 and 2 are not capable of activating relatively high volumes of fluid and/or achieving relatively high activation/concentration levels. These embodiments have a relatively small portion of the liquid at the surface exposed to the plasma. Even with a flowing channel of liquid, where the velocity of the liquid is moderately higher than the substrate, the thickness of the liquid is dictated by the surface tension of the liquid.

FIGS. 3A-3D illustrate an exemplary PAL generation apparatus 300. Apparatus 300 includes a high voltage power source 302, a conductor/cable 304, and a DBD plasma generating device 308. The high voltage power source 302 may be a DC power source, a high frequency AC power source, an RF power source, a pulsed DC power source, a pulsed AC power source, a microwave power source or the like. The power supply can be pulsed with a duty cycle of 0-100% and pulse duration of 1 nanosecond up to 1 microsecond.

The plasma generating device 308 includes a high voltage electrode 306 and a dielectric barrier 310. The apparatus also includes a conductive element 350 acting as a filter to create an indirect plasma system. However, it should be appreciated that an indirect plasma system is shown here for exemplary purposes only. As mentioned above, several other types of plasmas may also be suitable, including, for example, direct or indirect non-thermal plasma generators, a plasma jet, DBD, DBD plasma jet, RBD, gliding arc, corona discharge, non-thermal arc discharge, pulsed spark discharge, hollow cathode discharge, glow discharge, etc., some of which are discussed in more detail below. In this embodiment, the filter 350 is a conductive mesh or screen. The plasma generating system 300 also includes a substrate 320 with a surface for supporting a supply of fluid 326. Fluid 326 may be, for example, one of the various liquids as mentioned above, including, for example, water or water with additional additives. The dielectric barrier 310 is configured to prevent the high voltage electrode 306 from contacting the fluid 326 and/or other apparatus components.

In some embodiments, one or more spacers (not shown) may be utilized to maintain a gap (e.g., an air gap) between the conductive element 350 and the dielectric barrier 310. In some embodiments, the conductive element 350 is grounded and in other embodiments the conductive element 350 is connected to circuitry for affecting an electric field associated with the plasma 330. For example, the circuitry may include the circuitry disclosed in U.S. Provisional Application Ser. No. 62/299,783, titled Methods and Systems for Controlling or Tuning the Electric Field Generated in Skin or Tissue During Cold Plasma Skin Treatments, filed Feb. 25, 2016, which is incorporated by reference herein in its entirety.

During operation, the high voltage power source 302 is turned on and a plasma 330 forms below the dielectric barrier 310. The filter 350 prevents charged ions and electrons from passing through and contacting the fluid 326 to be activated. Fluid 326 activated by afterglow 360 (shown as arrows penetrating into fluid 326) that passes through and/or is created through filter 350, is indirect plasma activated fluid. The PAL generation apparatus 300 is configured such that the plasma generating device 308 generates the plasma 330 proximate to the fluid 326 on the substrate surface 320, where at least a portion of the liquid 326 exposed to the afterglow 360 of the plasma 330 becomes plasma activated. A direct plasma system can similarly activate the fluid 326 directly without the filter 350 and its associated afterglow 360.

In the embodiment shown in FIG. 3A, the substrate surface 320 is stationary and the fluid 326 is stationary or flowing at a relatively slow velocity insufficient to overcome the fluid's surface tension. The thickness of the fluid 326 in this state is shown as T1. As can be seen by the illustration of FIG. 3A, the afterglow 360 created by the apparatus 300 does not penetrate deep enough to activate a large portion of the fluid 326. Similarly, in a direct plasma system, the activating effects of the plasma 330 do not penetrate deeply into the fluid 326.

Referring now to FIG. 3B, the substrate surface 320 is moving at a velocity V1. The moving substrate surface 320 causes the fluid 326 to move in the same direction. The portion of the fluid 326 in direct contact with the substrate surface 320 moving at velocity V1 also moves with a velocity at or near V1. This velocity V1 is sufficient to overcome the surface tension of fluid 326, which causes the thickness of the fluid 326 in this state to thin to a thin layer with a thickness T2 (i.e., T2<T1). In this manner, the portion of the substrate surface 320 where the velocity is sufficient to overcome the surface tension of the fluid 326 and thin the fluid 326 may be referred to as a thinning surface. A device providing the thinning surface may be included in a liquid thinning device, as described in more detail below as part of various exemplary embodiments.

As can be seen by the illustration of FIG. 3B, although the afterglow 360 created by the apparatus 300 has the same penetration depth as shown in FIG. 3A, a larger portion (percentage) of the fluid 326 is activated because of the reduced thickness T2 of the fluid 326. In embodiments using a direct plasma, the plasma, not just its afterglow, similarly activates the fluid.

In addition, as also shown in FIG. 3B, because of its fluidic properties, all of fluid 326 does not flow at velocity V1. In particular, the fluid 326 against the substrate surface 320 flows with a velocity greater than the fluid 326 at the outer surface away from the substrate surface 320. FIG. 3B shows exemplary fluid velocity vectors 370 throughout fluid 326 induced by the substrate surface 320 moving at velocity V1. The velocity differences between these fluid velocity vectors 370 create shearing forces within the fluid 326 that result in internal mixing of the fluid 326, shown as swirl 380. The swirl 380 of the fluid 326 exposes more inactive fluid 326 to the afterglow 360 of the plasma 330 since the afterglow 360 only penetrates a portion of the fluid 326, causing a larger portion (percentage) of the fluid 326 to be activated.

Referring now to FIG. 3C, the substrate surface 320 is stationary and the fluid 326 is directed at a velocity V2. This velocity V2 is sufficient to overcome the surface tension of fluid 326, which causes the thickness of the fluid 326 in this state to thin to a thin layer with a thickness T3 (i.e., T3<T1).

As can be seen by the illustration of FIG. 3C, although the afterglow 360 created by the apparatus 300 has the same penetration depth as shown in FIG. 3A, a larger portion (percentage) of the fluid 326 is activated because of the reduced thickness T3 of the fluid 326.

In addition, because of its fluidic properties, all of fluid 326 does not flow at velocity V2. In particular, the fluid 326 against the stationary substrate surface 320 flows with a velocity less than the fluid 326 at the outer surface away from the substrate surface 320. FIG. 3C shows exemplary fluid velocity vectors 372 throughout fluid 326 induced by the stationary substrate surface 320 and the fluid 326 directed at a velocity V2. The velocity differences between these fluid velocity vectors 372 create shearing forces within the fluid 326 that result in internal mixing of the fluid 326, shown as swirl 382. The swirl 382 of the fluid 326 exposes more inactive fluid 326 to the afterglow 360 of the plasma 330 since the afterglow 360 only penetrates a portion of the fluid 326, causing a larger portion (percentage) of the fluid 326 to be activated.

Referring now to FIG. 3D, the substrate surface 320 is moving at a velocity V3 and the fluid 326 is directed at a velocity V4 in the opposite direction. The moving substrate surface 320 causes the portion of the fluid 326 in direct contact with substrate surface 320 to approach velocity V3 in the same direction. The velocity differential is sufficient to overcome the surface tension of fluid 326, which causes the thickness of the fluid 326 in this state to thin to a thin layer with a thickness T4 (i.e., T4<T1).

As can be seen by the illustration of FIG. 3D, although the afterglow 360 (or plasma 330 in direct plasma embodiments) created by the apparatus 300 has the same penetration depth as shown in FIG. 3A, a larger portion (percentage) of the fluid 326 is activated because of the reduced thickness T4 of the fluid 326.

In addition, because of its fluidic properties, all of fluid 326 does not flow at velocity V3 or V4. In particular, the fluid 326 against the stationary substrate surface 320 flows with a velocity in an opposite direction than the fluid 326 at the outer surface away from the substrate surface 320. FIG. 3D shows exemplary fluid velocity vectors 374 throughout fluid 326 induced by the substrate surface 320 moving at velocity V3 and the fluid 326 directed at a velocity V4. The velocity and directional differences between these fluid velocity vectors 374 create shearing forces within the fluid 326 that result in internal mixing of the fluid 326, shown as swirl 384. The swirl 384 of the fluid 326 exposes more inactive fluid 326 to the afterglow 360 of the plasma 330 since the afterglow 360 only penetrates a portion of the fluid 326, causing a larger portion (percentage) of the fluid 326 to be activated.

In various embodiments, the substrate surface is smooth, includes a feature that affects a speed of the fluid against the substrate surface, and/or combinations thereof. In one embodiment, the feature is a rib on the substrate surface that increases the friction between the substrate surface and the fluid.

Further embodiments include any number of configurations where a device is designed to create a relatively large differential between fluid velocity and the velocity of the substrate carrying the fluid. The relative velocities need to be different enough to overcome surface tension forces, thin, and/or and mix the fluid. As discussed above, in some embodiments the substrate velocity is greater than the fluid velocity, and in other embodiments the fluid velocity is greater than the substrate velocity. In the latter case, surface tension can be overcome by the high velocity of the fluid causing the fluid to roll in upon itself, creating a thinner liquid and internal mixing. This phenomena is similar to the phenomenon where a fluid liquid streamer rolls along the substrate surface, as discussed in more detail below. The reduced thickness of the fluid 326 created by the velocity differential also prevents the fluid 326 from contacting and/or interfering with the plasma 330 generation.

It should be appreciated that any combination of fluid and substrate velocities that thin the fluid and/or create internal shearing of the fluid can be utilized, including those not explicitly represented by FIGS. 3B-3D. In some cases, more than one of the states shown by FIGS. 3B-3D can occur in the same embodiment. In particular, portions of an interface between a substrate surface and a fluid may exhibit different velocity differentials (including, e.g., speed and/or direction) than other portions of the interface. For example, a spinning surface will have various angular velocities along a radial direction as well as a different radial velocity. In another example, the portion of a fluid in contact with a moving substrate surface may have various velocities based on how long the fluid has been in contact with the moving substrate surface. In other examples, velocity differentials are dependent on factors associated with the introduction of the fluid to the substrate (including, e.g., location (centered, off-centered), direction (e.g., perpendicular, angled, parallel), velocity, etc.). In some embodiments, the velocity differentials may be associated with one or more velocity differential gradients distributed across the thinning surface.

In this manner, the apparatus 300 maximizes the exposed fluid 326 surface area to the plasma 330, thins the fluid 326, and incorporates significant internal mixing of the fluid 326. All of these factors contribute to increased activation efficiency (diffusion of the active species into the fluid 326) and PAL yield by maximizing the amount of fluid 326 exposed to the plasma 330

In this manner, one or more apparatuses 300 can create large volumes of fluid with high concentrations of activated species rapidly. In some embodiments, PAL may be produced so rapidly that the PAL can be produced essentially "on demand."

FIGS. 4-7 illustrate an exemplary embodiment of a PAL generation apparatus 400 with a spin disk. FIG. 4 is a perspective drawing of the apparatus 400. FIG. 5 is a top view drawing of the apparatus 400. FIG. 6 is a cross-section of the perspective drawing of the apparatus 400. FIGS. 7A and 7B are cross-sections of portions of the apparatus 400.

A plasma generating device 408 includes a high voltage electrode 406 and a dielectric barrier 410. The high voltage electrode 406 is connected to a high voltage power source via a connector/cable (not shown), as described above. The apparatus also includes a conductive element 450 acting as a filter to create an indirect plasma system. In this embodiment, the filter 450 is a conductive mesh or screen. Spacers 452 maintain a gap (e.g., an air gap) between the conductive element 450 and the dielectric barrier 410. Conductive post 454 is shown as an exemplary conductive connection to the conductive element 450. In some embodiments, the conductive element 450 is grounded and in other embodiments the conductive element 450 is connected to circuitry for affecting an electric field associated with the plasma 430, as discussed above, via the conductive post 454. Various other means of connecting the conductive element 450 to ground or other circuitry may also be used.

The apparatus 400 also includes a fluid (e.g., liquid) thinning device 415 with a spin disk 420 with a surface for supporting a supply of fluid 426. As described in detail below, the surface of the spin disk 420 moves at a speed that creates a thin layer of the fluid 426 as the fluid 426 flows across the spinning surface 422 of the spin disk 420. Fluid 426 may be, for example, one of the various liquids as mentioned above, including, for example, water or water with additional additives. The dielectric barrier 410 is configured to prevent the high voltage electrode 406 from contacting the fluid 426 and/or other apparatus components. The thin layer of fluid 426 created by the spinning surface 422 also prevents the fluid 426 from contacting and/or interfering with the plasma generation.

The plasma generating device 408 and liquid thinning device 415 are configured to position the thinned fluid 426 and plasma 430 proximate to each other for proper activation of the fluid 426. For example, in this embodiment, the electrode 406, dielectric barrier 410, conductive element 450, and spin disk 420 are all configured as interfacing disk shapes that create a disk-shaped plasma 430 and a disk-shaped thin layer of fluid 426.

The apparatus 400 also includes a conduit 456 in which fluid 426 flows from an inlet and is deposited onto the spin disk 420. A motor 458 or other means may be used to spin the spin disk 420 via, for example, a motor shaft 459.

During operation, the high voltage power source is turned on and a plasma 430 forms below the dielectric barrier 410 in the gap between the dielectric barrier 410 and the filter 450. The filter 450 prevents charged ions and electrons from passing through and contacting the fluid 426 to be activated. Fluid 426 activated by the plasma afterglow, as discussed above, is indirect plasma activated fluid. The PAL generation apparatus 400 is configured such that the plasma generating device 408 generates the plasma 430 proximate to the fluid 426 on the spin disk 420, where at least a portion of the liquid 426 exposed to the afterglow of the plasma 430 becomes plasma activated. The close proximity of the plasma 430 to the thinned and mixing fluid 426 on top of the spin disk 420 creates high concentrations of plasma activated species in the fluid 426.

The spin disk 420 thins the fluid 426 and produces internal mixing of the fluid 426, as discussed above and in further detail below. In this embodiment, as shown by the arrows in FIGS. 6 and 8, the fluid 426 is directed onto the spin disk 420 from the conduit 456 in a direction perpendicular to the spin disk 420, flows across the spinning surface 422 of the spin disk 420 in a thin layer while exposed to the afterglow of the plasma 430, exits the spin disk 420 in a radial direction due to its radial momentum, and is collected in a collection chamber 462 as the fluid 426 impacts the side walls of the chamber 462 and falls to the bottom of the chamber 462. A fluid outlet or drain 464, including, for example, an outlet conduit, on the bottom of the chamber 462 allows fluid 426 to be collected, directed, and used outside of the apparatus 400 or within a larger machine in which this apparatus 400 resides. The apparatus may also include a chamber cover 466 and a pump (not shown) configured to provide the fluid 426 to, from, and/or within the apparatus 400. In some embodiments, the pump may act as a recirculation device configured to direct at least a portion of the fluid 426 exposed to the plasma 430 back through the apparatus 400.

The bottom of the chamber 462 is shown flat, but can be slanted or conical in shape to help direct fluid 426 to the drain 464. As mentioned above, in some embodiments, the fluid 426 may also be re-circulated from the drain 464 back into the fluid 426 inlet conduit 456. Re-circulating all or a portion of the fluid 426 from the drain 464 back into the liquid inlet would expose the re-circulated fluid 426 to the plasma 430 again and further increase the concentration of plasma activated species.

In some embodiments, the apparatus 400 may be enclosed in an enclosure. The advantage of being in an enclosed system is that any unwanted emissions (gas or otherwise) from the plasma (such as ozone) could be contained within a closed system and treated to prevent undesired exposure of the surrounding environment to the emissions.

The spin disk 420 includes a disk surface that rotates about a disk center with a speed (e.g., in revolutions per minute (RPM)) dictated by the motor 458, which may be controlled by a controller, as discussed below. The rotating surface 422 of the spin disk 420 causes the fluid 426 to have an angular velocity component in the same direction in addition to the radial velocity component caused by centrifugal force. The fluid velocity is sufficient to overcome the surface tension of fluid 426, which causes the thickness of the fluid 426 to be a thin layer. In this embodiment, the fluid 426 is deposited onto the spin disk 420 substantially at the spin disk center. In other embodiments, the fluid 426 can be deposited onto the spin disk 420 offset from the spin disk center. Also in this embodiment, the fluid 426 is deposited onto the spin disk 420 from above in a direction substantially perpendicular to the spin disk surface. In other embodiments, the fluid 426 can be deposited onto the spin disk 420 at various other angles and/or deposited onto the spin disk 420 from below, for example, via a feed tube.

In this particular embodiment, the fluid 426 is deposited vertically onto a surface of the spin disk 420 that is moving in an approximately horizontal direction at a relatively high rate of speed. The high surface speed overcomes the liquid surface tension forces to create a thin layer of fluid 426 and internal mixing flow within the thin layer of fluid 426 on the spin disk 420. In this embodiment, the spin disk 420 uses centrifugal action to thin the fluid 426. Internal mixing flow within the thin layer of fluid 426 is created by the spin disk 420 spinning faster than the fluid 426, resulting in a shearing action within the fluid 426, causing internal circulation of the fluid 426. (See also, e.g., FIG. 3B.) Further internal flow (or turbulence) within the fluid 426 is created by the fluid 426 being thrown radially away from the spin disk 420 while the disk 420 spins in an angular direction, causing additional shearing of the fluid 426 due to the two different velocity directions. In this manner, exposing the thin layer of fluid 426 to plasma 430 rapidly creates high concentrations of active species due not only to the thinness of the fluid 426 layer (i.e., diffusion of species through a thin layer versus a thick layer of fluid), but also due to the mixing flow internal to the thin layer of fluid 426. The internal flow within the fluid 426 circulates fresh, un-exposed (and/or less-exposed) fluid 426 to the surface by re-circulating the fluid 426 within the layer. The apparatus 400 can create high concentrations of activated species within the fluid 426 with low plasma exposure residence time.

Figure 8A:
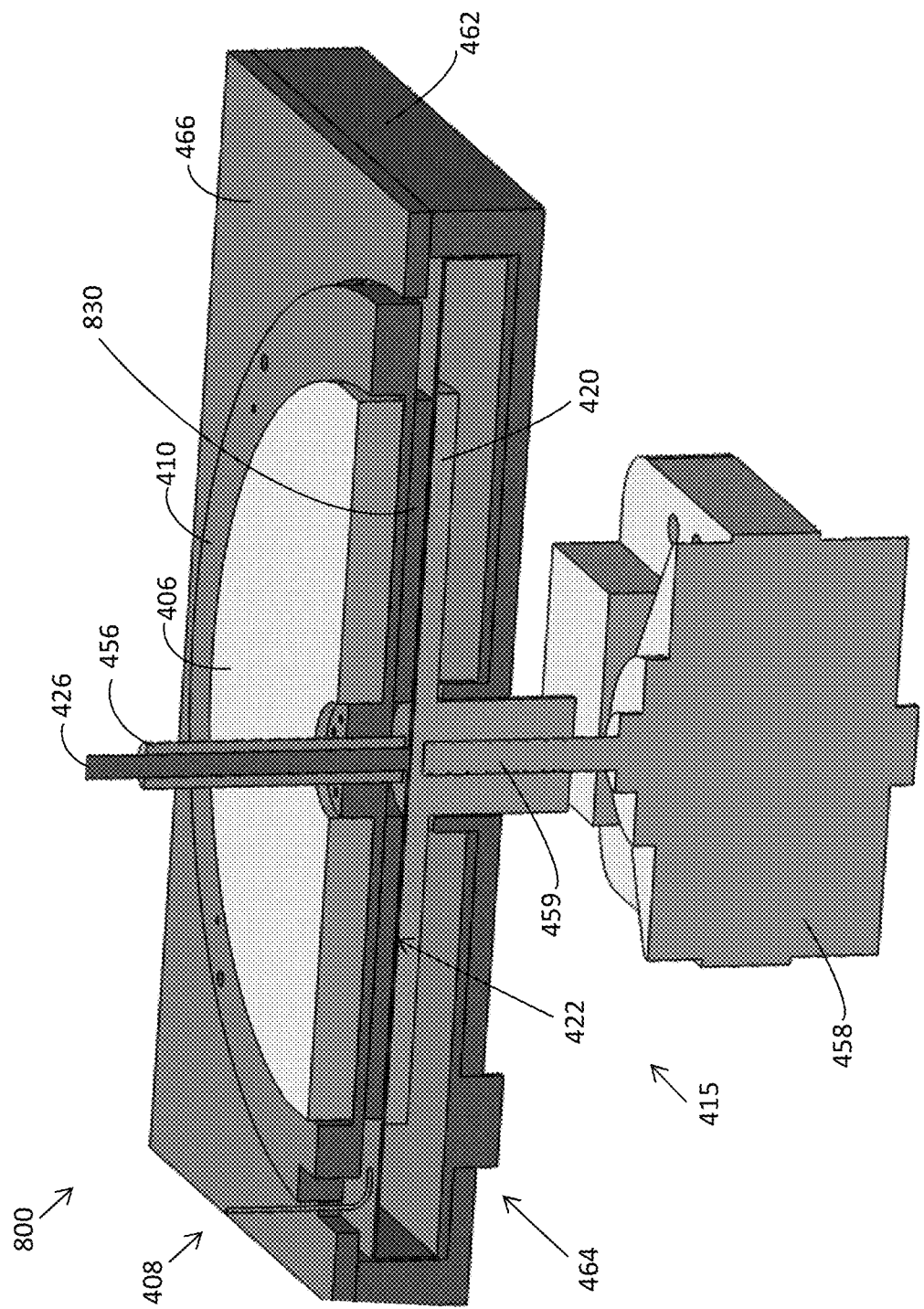
FIG. 8A is a cross-section of a perspective drawing of another exemplary embodiment of a PAL generation apparatus with an exemplary spin disk.

FIGS. 8A-8B illustrate another exemplary embodiment of a PAL generation apparatus 800 with a spin disk. FIG. 8A is a cross-section of a perspective drawing of the apparatus 800. FIG. 8B is a cross-section of a portion of the apparatus 800. The apparatus 800 is similar to and shares many features with apparatus 400, but uses a direct plasma 830 instead of an indirect plasma 430. In particular, in this embodiment, the apparatus does not include the conductive element 450 (as shown with apparatus 400) acting as a filter to create an indirect plasma system. In this manner, the fluid 426 is activated by direct exposure to the plasma 830, rather than its associated afterglow.

Figure 9:
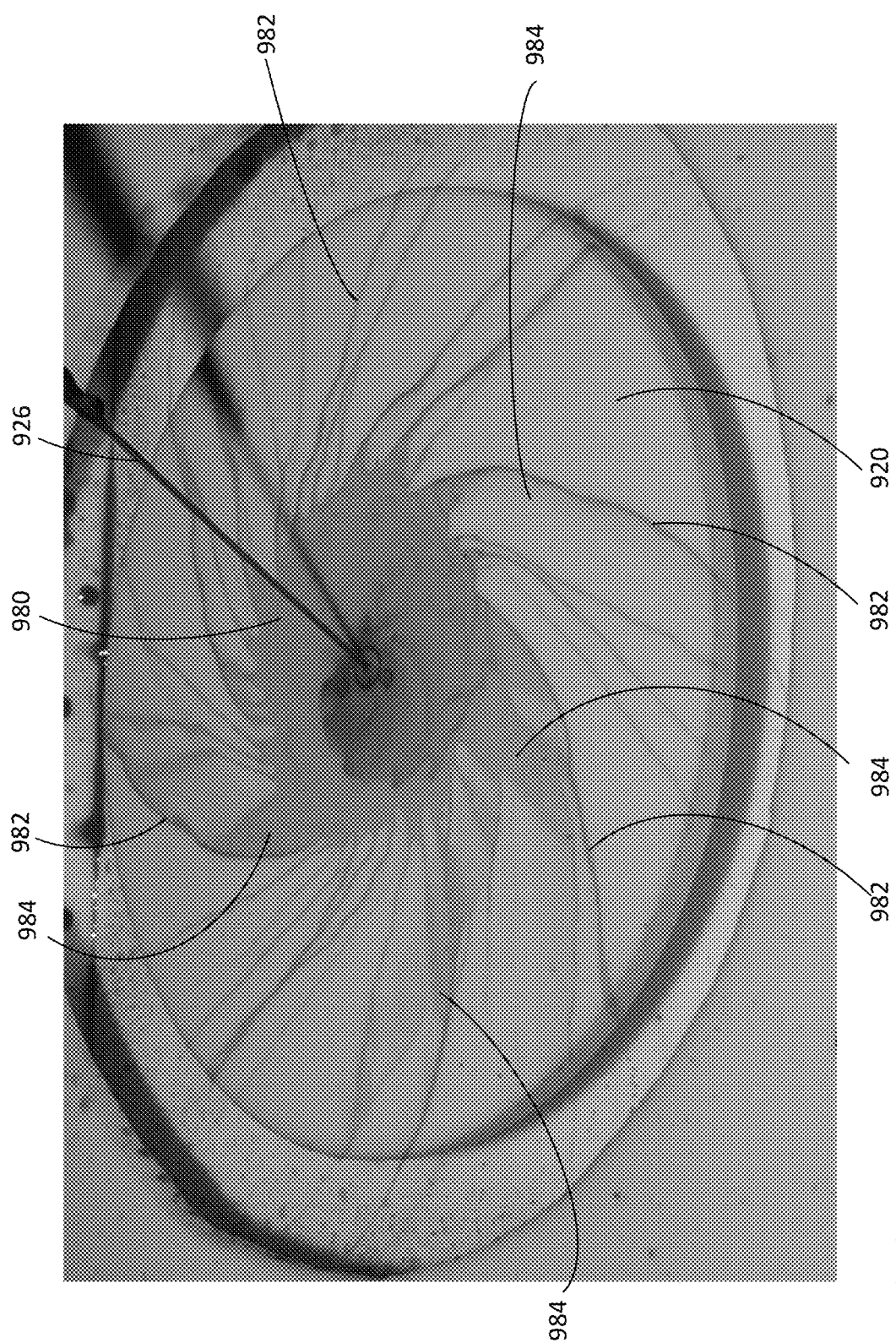
FIG. 9 is a photograph of dyed liquid being deposited onto the center of an exemplary spinning disk.
Figure 10:
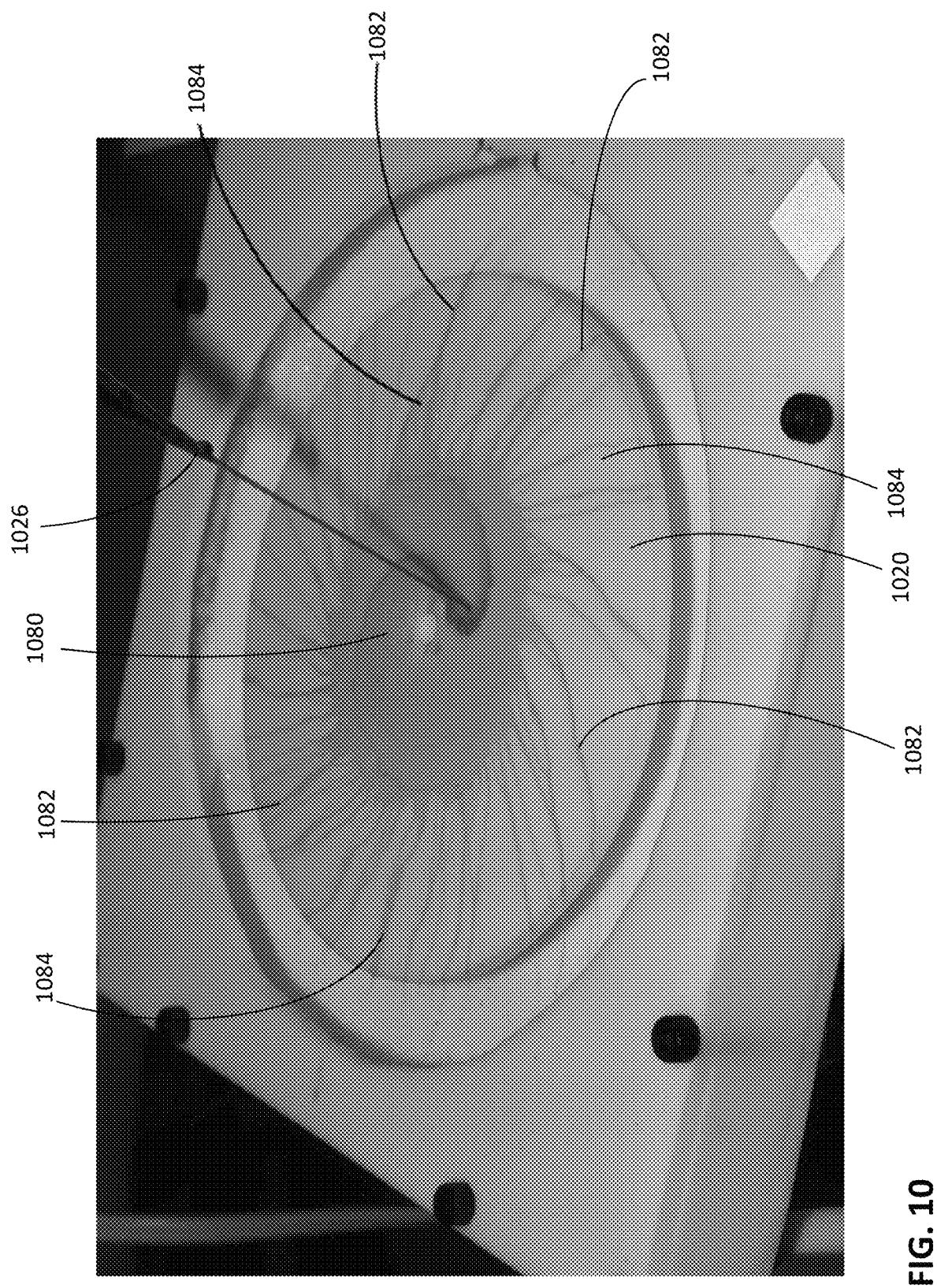
FIG. 10 is a photograph of dyed liquid being deposited off center of an exemplary spinning disk.

To accurately depict the movement of fluid on a spinning disk, FIGS. 9 and 10 show photographs of red-dyed liquid being deposited onto a spinning disk. FIG. 9 is a photograph of red-dyed liquid 926 being deposited onto the center of a spinning disk 920. FIG. 10 is a photograph of red-dyed liquid 1026 being deposited off center of a spinning disk 1020. As the liquid 926, 1026 drops onto the disk's surface, friction between the liquid 926, 1026 and the surface imparts a radial velocity to the liquid 926, 1026. The liquid 926, 1026 will spread out and thin in a central liquid thinned area 980, 1080. The angular velocity of the disk 920, 1020 imparts an angular velocity to the liquid 926, 1026, but a centrifugal force acting on the mass of the liquid 926, 1026 also causes a radial velocity of the liquid 926, 1026. In this manner, as the liquid 926, 1026 is driven outward along the surface of the disk 920, 1020, streamers 982, 1082 of liquid 926, 1026 form, with smearing areas 984, 1084 behind the streamers 982, 1082.

As shown by FIG. 10, the liquid 1026 does not have to drop directly on the center of the disk 1020 for the liquid 1026 to thin. For example, in some embodiments, it may be advantageous to deposit the liquid 1026 off center to get a larger central liquid thinned area 1080 before the liquid 1026 breaks into streamers.

Figures 13, 14:
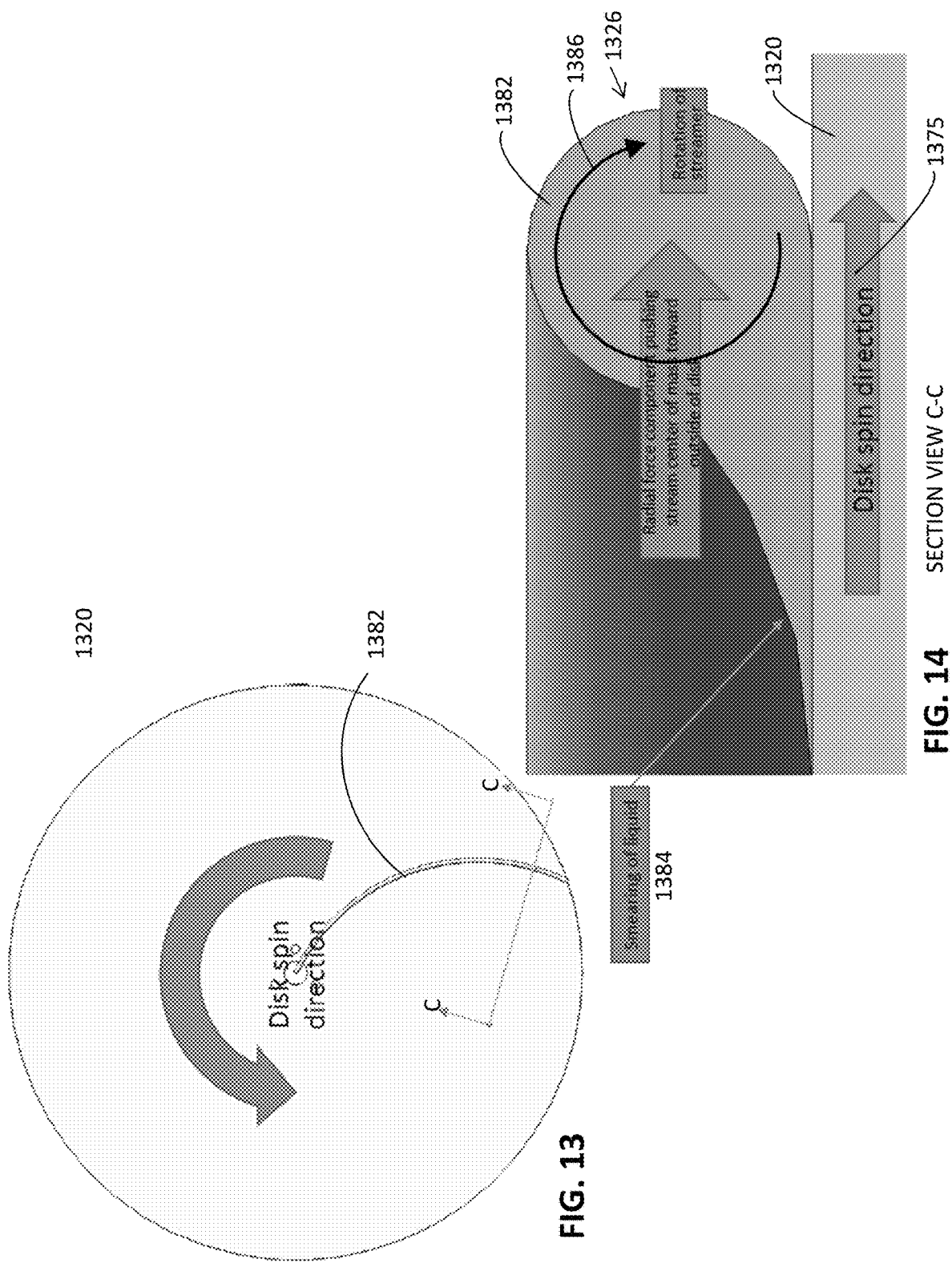
FIG. 13 is a schematic top view showing the angular direction of an exemplary spin disk and an exemplary fluid streamer.
FIG. 14 shows a cross-section side view of the spin disk with fluid streamer and smearing area from FIG. 13.

FIGS. 11-14 are drawings depicting the theory and/or hypothesis behind the fluid mixing on a spin disk. FIGS. 11-12 depict the fluid mixing in the central liquid thinned area on a spin disk (e.g., the central liquid thinned areas 980, 1080 shown in FIGS. 9 and 10, respectively) prior to the liquid separating into liquid streamers (as liquid travels toward the outside of the disk). FIGS. 13-14 depict the liquid streamers that form on a spin disk (e.g., streamers 982, 1082 shown in FIGS. 9 and 10, respectively).

Mixing occurs as a result of shearing action within the fluid created by the velocity differences between the fluid and the spin disk both in the angular direction and the radial direction. As fluid travels radially outward, eventually the fluid will congregate into streamers that are roughly radial in nature but bend as the fluid travels from the interior of the spin disk to the outer perimeter. The streamers are already significantly thinner than a bead of fluid on a surface due to the centrifugal and velocity shear forces overcoming the surface tension forces.

FIG. 11 is a schematic view showing relative spin disk and fluid angular velocities in the central liquid thinned area. FIG. 11A shows the angular direction of an exemplary spin disk 1120. FIG. 11B shows a cross-section view A-A of spin disk 1120 with fluid 1126 in the angular direction of the spin disk 1120. The spin disk 1120 angular velocity is shown with vector 1175. Fluid velocity vectors 1170 induced by the spin disk 1120 angular velocity 1175 are shown throughout fluid 1126. The fluid velocity in the layer of fluid 1126 near the spin disk 1120 matches the spin disk angular velocity 1175. The fluid velocity near the outer surface of the fluid 1126 is slower than the spin disk angular velocity 1175. This velocity difference creates shearing action inside of the fluid 1126 that creates internal swirling of the fluid 1126, as shown with swirl 1180. (See also FIG. 3B.) In this manner, the spin disk 1120 can create a first shearing force that mixes the thin layer of fluid 1126, where the first shearing force is caused by an angular velocity difference within the thin layer of fluid 1126 between the fluid at an outer surface away from the spin disk 1120 and the fluid against the spin disk 1120 in an angular direction.

FIG. 12 is a schematic view showing relative spin disk and fluid radial velocities in the central liquid thinned area. FIG. 12A shows the radial direction of the exemplary spin disk 1120. FIG. 12B shows a cross-section view B-B of spin disk 1120 with fluid 1126 in the radial direction of the spin disk 1120. The spin disk 1120 radial velocity is zero. Fluid velocity vectors 1270 induced by centrifugal force are shown throughout fluid 1126. The fluid velocity in the layer of fluid 1126 near the spin disk 1120 nearly matches the spin disk radial velocity of zero. The fluid velocity near the center of the fluid 1126 is greater than the spin disk radial velocity of zero because of the centrifugal force associated with the spinning spin disk 1120, which acts on the mass of the fluid 1126 and results in a velocity within the fluid 1126 that is in the radial direction. This velocity difference creates shearing action inside of the fluid 1126 that creates internal swirling of the fluid 1126, as shown with swirl 1280. (See also FIG. 3C.) In this manner, the spin disk 1120 can create a second shearing force that mixes the thin layer of fluid 1126, where the second shearing force is caused by a radial velocity difference within the thin layer of fluid 1126 between the fluid at an outer surface away from the spin disk 1120 and the fluid against the spin disk 1120 in a radial direction.

It should be appreciated that the spin disk 1120 can create the first shearing force (e.g., depicted as 1180) and the second shearing force (e.g., depicted as 1280) that mix the thin layer of fluid 1126 at the same time, causing turbulent and dynamic mixing of the fluid 1126.

FIGS. 13-14 are schematic views showing fluid streamers that form on the spin disk. It is believed that liquid falling onto a spinning disk and centrifugal forces create radial velocity to "streamers" of the liquid. The streamers are significantly thinner than a bead of liquid on a surface due to the centrifugal forces overcoming the surface tension forces. FIG. 13 shows the angular direction of an exemplary spin disk 1320 and an exemplary fluid streamer 1382. FIG. 14 shows a cross-section view C-C of spin disk 1320 and fluid streamer 1382 with smearing area 1384. The spin disk 1320 angular velocity is shown with vector 1375. In the streamer region, the angular velocity 1375 of the spin disk 1320 creates an angular shear on the bottom layer of the fluid streamer 1382 that pulls on it to bend the streamer 1382 away from a straight radial direction. This is illustrated in the top view shown in FIG. 13. As the streamer 1382 bends, the radial centrifugal force on its center of mass causes it to "roll" along its internal axis (similar to a rope rolling along a surface) and smear along the spin disk 1320 in smearing area 1384. This smearing thins the streamer 1382 even further and creates internal rotation of the streamer 1382, shown as 1386. In this manner, the spin disk 1320 can create at least one fluid streamer 1382 that mixes the thin layer of fluid 1326.

Rapid activation by plasma is achieved not only because of the thinness of the streamers, but also because the internal rotation caused by the shearing action exposes more of the liquid to the outer surface of the streamer, and hence, the plasma. In particular, rapid activation of the liquid by plasma is achieved by the thinning of the liquid which greatly improves diffusion of the active species versus a thicker layer of liquid. The liquid thinning devices create a liquid thickness that is a fraction of the thickness by other techniques where the thickness of the fluid is dictated by the surface tension of the liquid and hydrophilicity of the substrate material. The exposure of fresh, un-activated and/or less-activated liquid to the plasma by the internal mixing flow of the liquid is caused by the velocity differentials created within the liquid by the different velocities of the disk and the liquid. Also, the exposure of fresh, un-activated and/or less-activated liquid to the plasma by the rolling action of the streamers of liquid is caused by the shearing action forcing this fresh liquid to the outer surface, thereby activating it. Additionally, smearing of at least a portion of the liquid into an even thinner layer further advances activation efficiency.

Figure 15:
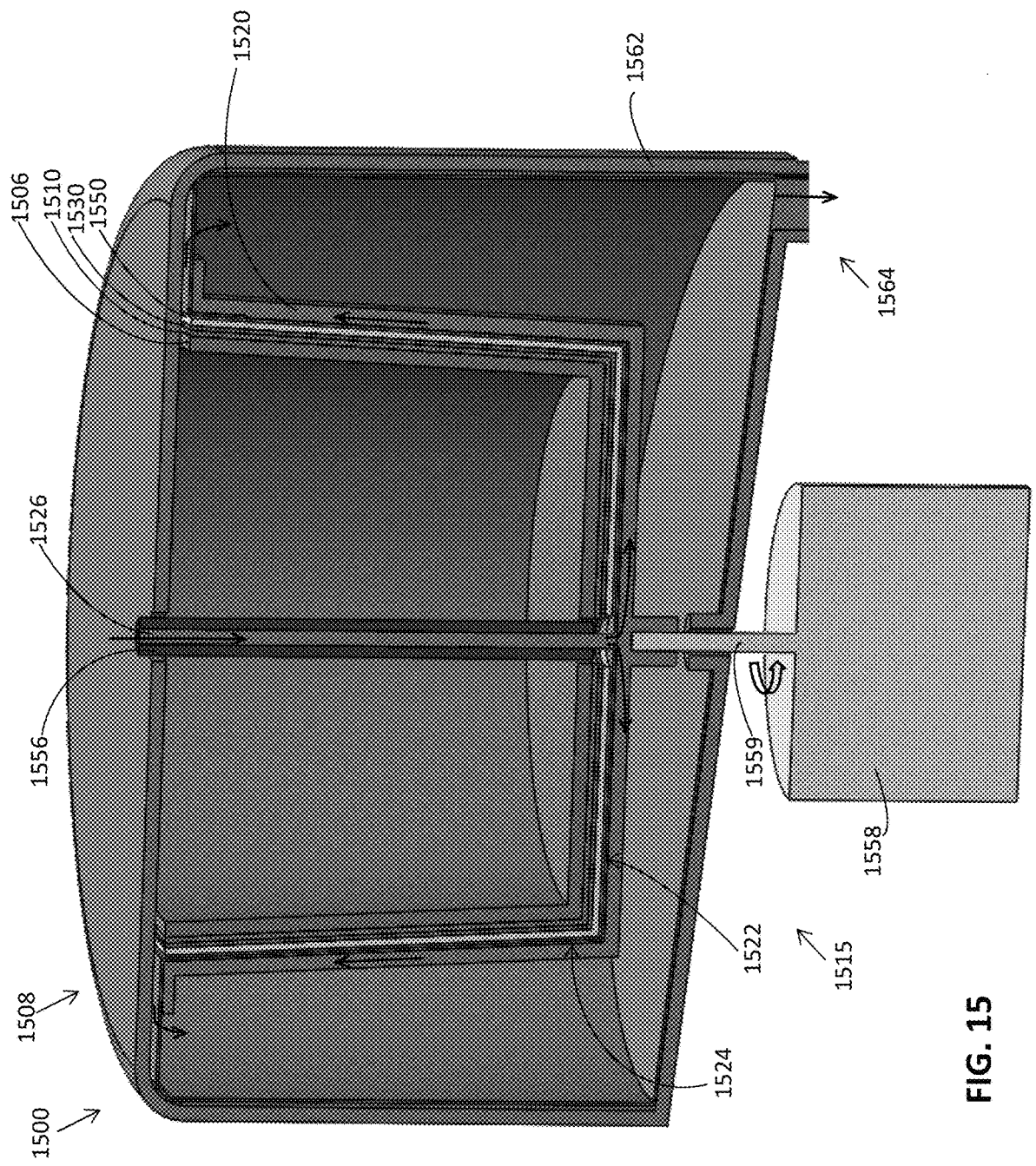
FIG. 15 is a cross-section of a perspective drawing of an exemplary embodiment of a PAL generation apparatus with an exemplary spin cylinder.
Figure 16:
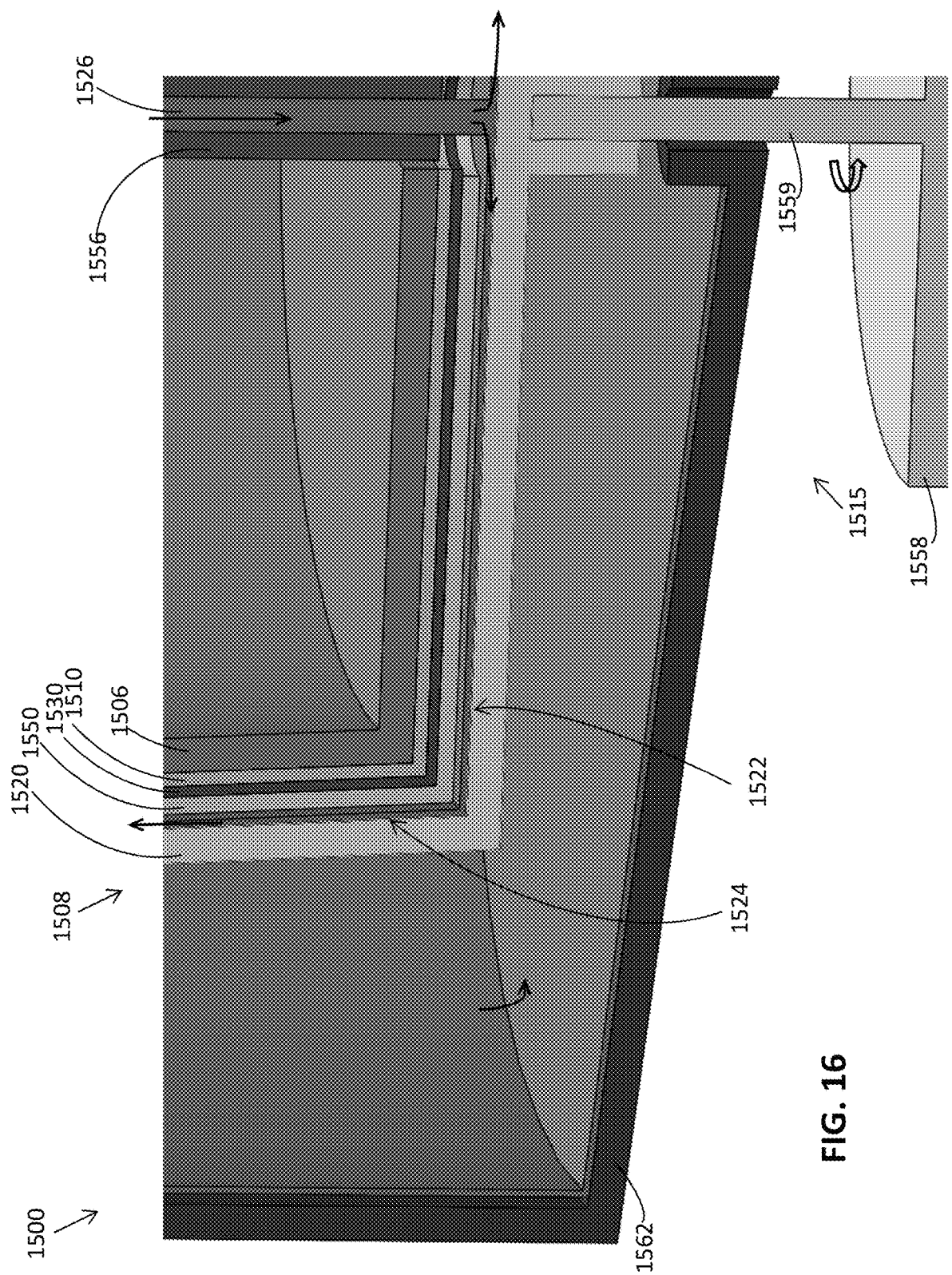
FIG. 16 is a cross-section of a portion of the apparatus of FIG. 15.

Other embodiments can use various other apparatus shapes and methods to thin the fluid and expose to it to plasma. For example, FIGS. 15-16 illustrate an exemplary embodiment of a PAL generation apparatus 1500 with a spin cylinder. FIG. 15 is a cross-section of a perspective drawing of the apparatus 1500. FIG. 16 is a cross-section of a portion of the apparatus 1500.

A plasma generating device 1508 includes a high voltage electrode 1506 and a dielectric barrier 1510. The high voltage electrode 1506 is connected to a high voltage power source via a connector/cable (not shown), as described above. The apparatus also includes a conductive element 1550 acting as a filter to create an indirect plasma system. In this embodiment, the filter 1550 is a conductive mesh or screen. Spacers (not shown) may be used to maintain a gap (e.g., an air gap) between the conductive element 1550 and the dielectric barrier 1510. A conductive post (not shown) or other connection means may be used to connect the conductive element 1550 to ground or other circuitry as discussed above.

The apparatus 1500 also includes a fluid (e.g., liquid) thinning device 1515 with an exemplary spin cylinder 1520 with at least one surface for supporting a supply of fluid 1526. As described in detail below, the spin cylinder 1520 moves (rotates) at a speed that creates a thin layer of the fluid 1526 as the fluid 1526 flows across the spinning cylinder bottom surface 1522 and the spinning cylinder side wall surface 1524 of the spin cylinder 1520. Fluid 1526 may be, for example, one of the various liquids as mentioned above, including, for example, water or water with additional additives. The dielectric barrier 1510 is configured to prevent the high voltage electrode 1506 from contacting the fluid 1526 and/or other apparatus components. The thin layer of fluid 1526 created by the spinning surfaces 1522, 1524 also prevent the fluid 1526 from contacting and/or interfering with the plasma generation.

A slight taper on the inside wall of the spin cylinder 1520 allows the fluid 1526 to travel upward against gravity within the spin cylinder 1520 due to a vertical centrifugal component acting on the fluid 1526. In this manner, the inner surface of the cylinder side wall extends upward with an outward taper that allows the fluid 1526 to travel upward along the inner surface of the cylinder side wall as the spin cylinder 1520 spins. In this manner, some embodiments including apparatus 1500 do not necessarily rely on gravity to maintain a "puddle" or river of fluid 1526 flowing beneath and/or adjacent to the plasma 1530. Thus, the apparatus 1500 does not have to remain fixed, for example, on a cart or other support, to keep the orientation of the apparatus 1500 upright and operational. In some embodiments, the apparatus 1500 may be configured such that the spin cylinder 1520 can operate independent of gravitational effects by overcoming them with the centrifugal forces. As a result, some embodiments of the apparatus 1500 can be operated in any orientation, hand held, and/or portable.

The plasma generating device 1508 and liquid thinning device 1515 are configured to position the thinned fluid 1526 and plasma 1530 proximate to each other for proper activation of the fluid 1526. For example, in this embodiment, the electrode 1506, dielectric barrier 1510, conductive element 1550, and spin cylinder 1520 are all configured as interfacing cylinder shapes that create a cylinder-shaped plasma 1530 and a cylinder-shaped thin layer of fluid 1526.

The apparatus 1500 also includes a conduit 1556 in which fluid 1526 flows from an inlet and is deposited into the spin cylinder 1520. A motor 1558 or other means may be used to spin the spin cylinder 1520 via, for example, a motor shaft 1559.

During operation, the high voltage power source is turned on and a plasma 1530 forms below/along the dielectric barrier 1510 in the gap between the dielectric barrier 1510 and the filter 1550. The filter 1550 prevents charged ions and electrons from passing through and contacting the fluid 1526 to be activated. Fluid 1526 activated by the plasma afterglow, as discussed above, is indirect plasma activated fluid. The PAL generation apparatus 1500 is configured such that the plasma generating device 1508 generates the plasma 1530 proximate to the fluid 1526 in the spin cylinder 1520, where at least a portion of the liquid 1526 exposed to the afterglow of the plasma 1530 becomes plasma activated. The close proximity of the plasma 1530 to the thinned and mixing fluid 1526 on surface of the spin cylinder 1520 creates high concentrations of plasma activated species in the fluid 1526.

The spin cylinder 1520 thins the fluid 1526 and produces internal mixing of the fluid 1526. In this embodiment, as shown by the arrows in FIGS. 15 and 16, the fluid 1526 is directed onto the spin cylinder 1520 from the conduit 1556 in a direction perpendicular to the bottom of the spin cylinder 1520, flows across the spinning bottom surface 1522 of the spin cylinder 1520 and up the spinning side wall surface 1524 in a thin layer while exposed to the afterglow of the plasma 1530, exits the top of the spin cylinder 1520 in a radial direction due to its radial momentum, and is collected in a covered collection chamber 1562. A fluid outlet or drain 1564, including, for example, an outlet conduit, on the bottom of the chamber 1562 allows fluid 1526 to be collected, directed, and used outside of the apparatus 1500 or within a larger machine in which this apparatus 1500 resides. The apparatus may also include a pump (not shown) configured to provide the fluid 1526 to, from, and/or within the apparatus 1500. In some embodiments, the pump may act as a recirculation device configured to direct at least a portion of the fluid 1526 exposed to the plasma 1530 back through the apparatus 1500.

The bottom of the chamber 1562 can be slanted or conical in shape to help direct fluid 1526 to the drain 1564. As mentioned above, in some embodiments, the fluid 1526 may also be re-circulated from the drain 1564 back into the fluid 1526 inlet conduit 1556. Re-circulating all or a portion of the fluid 1526 from the drain 1564 back into the liquid inlet would expose the re-circulated fluid 1526 to the plasma 1530 again and further increase the concentration of plasma activated species.

In some embodiments, the apparatus 1500 may be enclosed in an enclosure. The advantage of being in an enclosed system is that any unwanted emissions (gas or otherwise) from the plasma (such as ozone) could be contained within a closed system and treated to prevent undesired exposure of the surrounding environment to the emissions.

The spin cylinder 1520 includes a cylinder bottom and side walls that rotate about a cylinder center with a speed (e.g., in revolutions per minute (RPM)) dictated by the motor 1558, which may be controlled by a controller, as discussed below. The rotating surfaces 1522, 1524 of the spin cylinder 1520 cause the fluid 1526 to have an angular velocity component in the same direction in addition to the radial velocity component caused by centrifugal force. The fluid velocity is sufficient to overcome the surface tension of fluid 156, which causes the thickness of the fluid 1526 to be a thin layer. In this embodiment, the fluid 1526 is deposited onto the spin cylinder 1520 substantially at the spin cylinder center. In other embodiments, the fluid 1526 can be deposited onto the spin cylinder 1520 offset from the spin cylinder center. Also in this embodiment, the fluid 1526 is deposited onto the spin cylinder 1520 from above in a direction substantially perpendicular to the spin cylinder surface. In other embodiments, the fluid 1526 can be deposited onto the spin cylinder 1520 at various other angles and/or deposited onto the spin cylinder 1520 from below, for example, via a feed tube.

In this particular embodiment, the fluid 1526 is deposited vertically onto the bottom of the spin cylinder 1520 that is moving in an approximately horizontal direction at a relatively high rate of speed. The high surface speed overcomes the liquid surface tension forces to create a thin layer of fluid 1526 and internal mixing flow within the thin layer of fluid 1526 in the spin cylinder 1520. In this embodiment, the spin cylinder 1520 uses centrifugal action to thin the fluid 1526 and to move the fluid 1526 up the side walls of the spin cylinder 1520. Internal mixing flow within the thin layer of fluid 1526 is created by the spin cylinder 1520 spinning faster than the fluid 1526, resulting in a shearing action within the fluid 1526, causing internal circulation of the fluid 1526.

The thinning and mixing properties discussed above in the spin disk embodiments also apply to the spin cylinder embodiments, including the various shearing forces due to angular and radial velocity differences within the thin layer of fluid 1526 along the bottom and side wall surfaces of the spin cylinder 1520. However, in some embodiments, an increased surface area of the spin cylinder 1520 versus the spin disk 420 may provide even greater concentrations of activated species within the fluid 426 and/or greater flow rates with low plasma exposure residence time.

Figure 17:
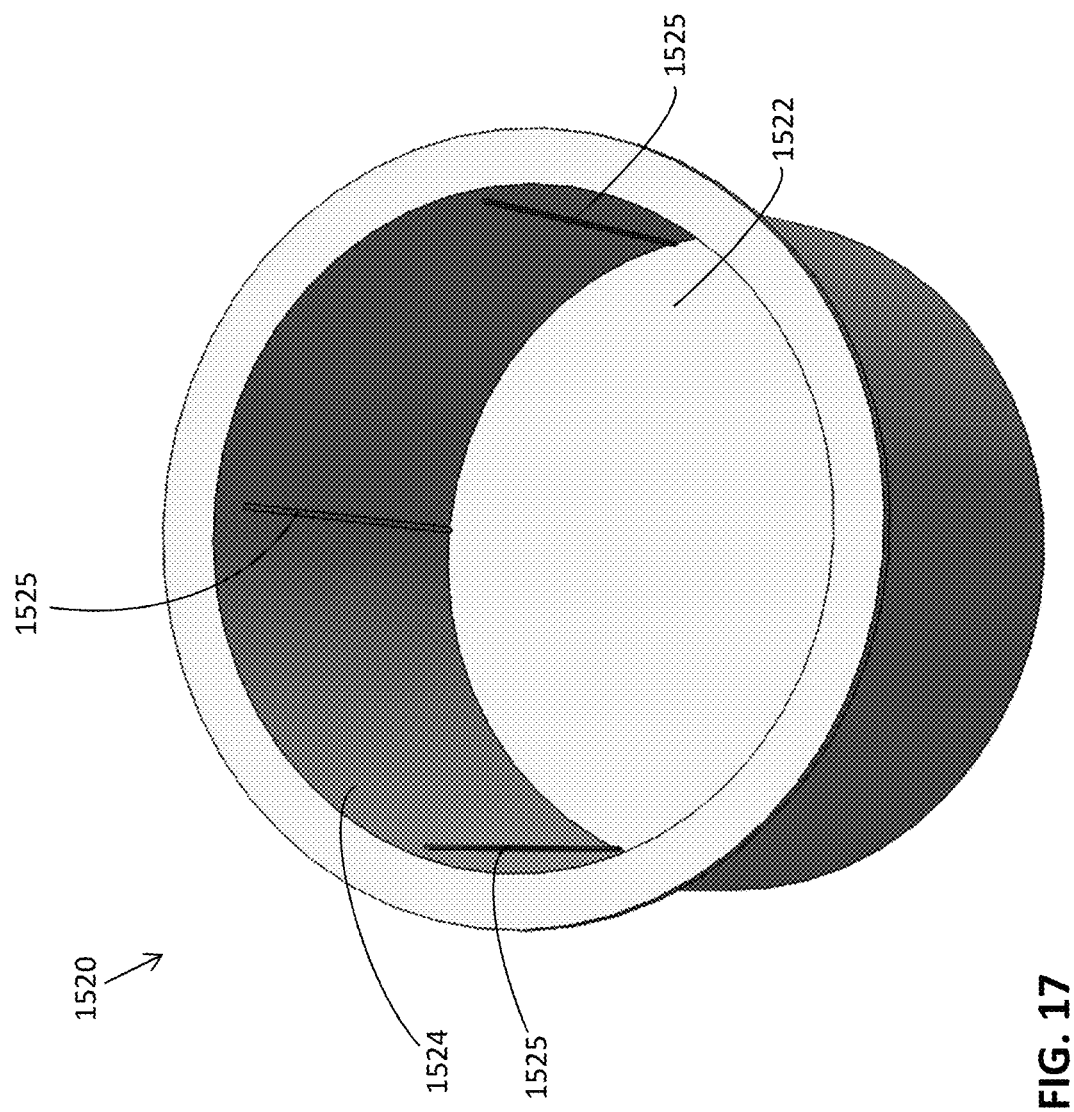
FIG. 17 is a perspective drawing of the exemplary spin cylinder of the apparatus of FIG. 15.

FIG. 17 is a perspective drawing of the exemplary spin cylinder 1520. As described above, the spin cylinder 1520 moves (rotates) at a speed that creates a thin layer of the fluid (e.g., fluid 1526 discussed above, not shown in FIG. 17) as the fluid flows across the spinning cylinder bottom surface 1522 and the spinning cylinder side wall surface 1524 of the spin cylinder 1520. A slight taper on the inside wall of the spin cylinder 1520 allows the fluid to travel upward against gravity within the spin cylinder 1520 due to a vertical centrifugal component acting on the fluid. In this embodiment, the inner surface 1524 of the cylinder side wall extends upward with an outward taper that allows the fluid to travel upward along the inner surface 1524 of the cylinder side wall as the spin cylinder 1520 spins.

This embodiment also shows optional ribs 1525 on a portion of the inner surface 1524 of the cylinder side wall that increase the friction between the cylinder surface and the fluid. These ribs 1525 can affect the speed of the fluid against the inner surface 1524 of the cylinder side wall and/or provide further agitation to increase mixing of the fluid. Ribs 1525 can force the liquid to spin at a radial velocity that is the same as the cylinder. Increasing the speed of the fluid along the cylinder side wall surface 1524 can assist the fluid in overcoming the surface tension forces and/or gravitational forces as the fluid flows up along the surface 1524. In this embodiment, four ribs 1525 start at the bottom of the cylinder and extend nearly to the top of the cylinder side wall. In other embodiments, any number of ribs, extending various lengths up the side of the cylinder wall, and/or in directions not necessarily perpendicular to the cylinder bottom may be used.

Figure 18:
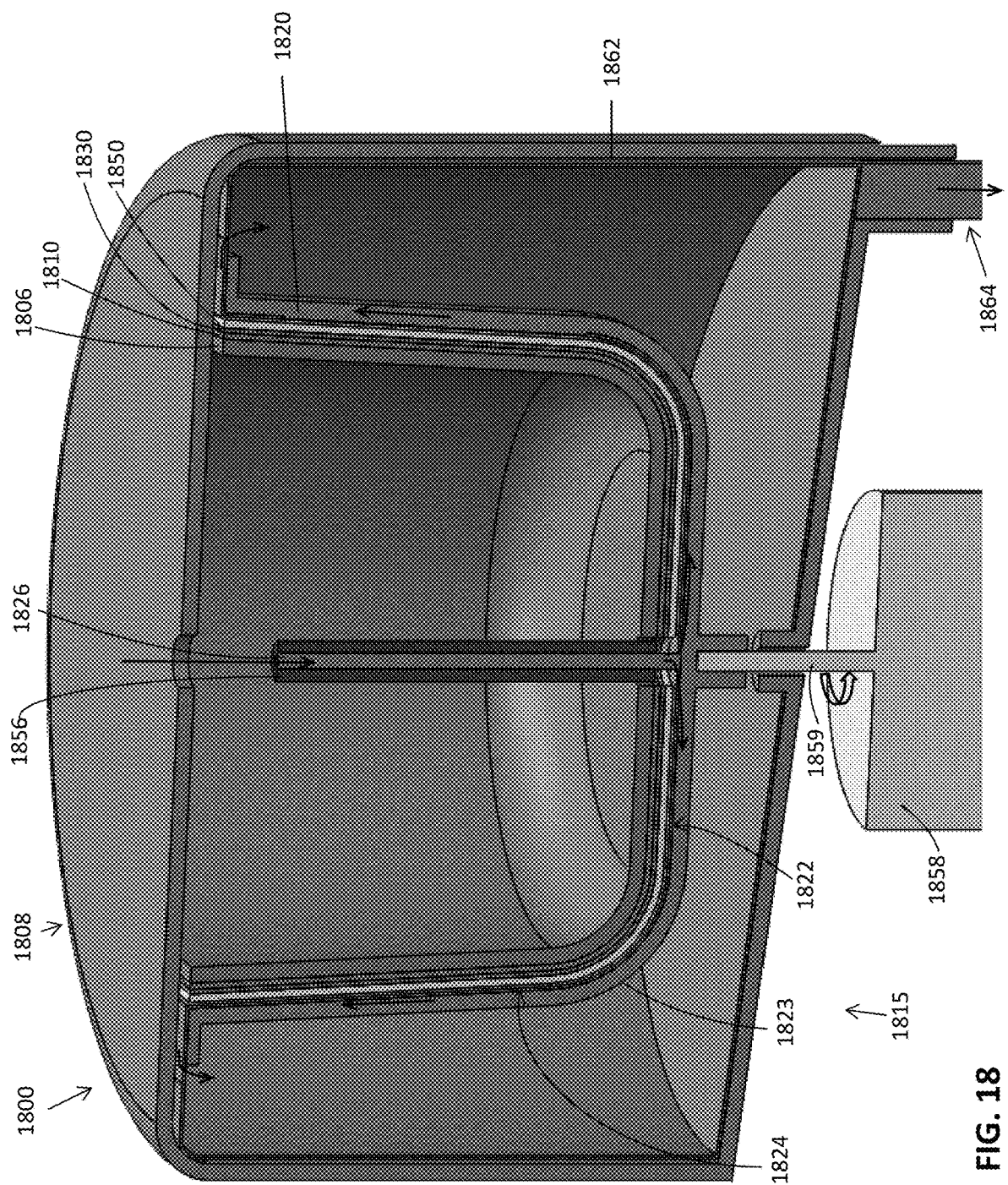
FIG. 18 is a cross-section of a perspective drawing of another exemplary embodiment of a PAL generation apparatus with another exemplary spin cylinder.

FIG. 18 is a cross-section of a perspective drawing of another exemplary embodiment of a PAL generation apparatus 1800 with another exemplary spin cylinder. In this embodiment, the cylinder side wall is connected to the cylinder bottom with a fillet.

A plasma generating device 1808 includes a high voltage electrode 1806, a dielectric barrier 1810, and a conductive element 1850 acting as a filter to create an indirect plasma system. Spacers (not shown) may be used to maintain a gap (e.g., an air gap) between the conductive element 1850 and the dielectric barrier 1810. These components are arranged and operate in a manner similar to their corresponding respective components 1506, 1510, 1550 in apparatus 1500.

The apparatus 1800 also includes a fluid (e.g., liquid) thinning device 1815 with an exemplary spin cylinder 1820 with at least one surface for supporting a supply of fluid 1826. The spin cylinder 1820 moves (rotates) at a speed that creates a thin layer of the fluid 1826 as the fluid 1826 flows across the spinning cylinder bottom surface 1822 and the spinning cylinder side wall surface 1824 of the spin cylinder 1820. However, in this embodiment, the transition from the cylinder bottom surface 1822 to the cylinder side wall surface 1824 includes fillet 1823. The curved fillet 1823 can be used to minimize fluid 1826 splashing and/or disruption as it transitions from the planar direction along the cylinder bottom surface 1822 to the angled side wall surface 1824. Any radius suitable for a particular or various applications may be used for fillet 1823

The other features of the spin cylinder 1820 (e.g., slight taper on the inside wall) allows the fluid 1826 to travel upward against gravity within the spin cylinder 1820 as described above.

The plasma generating device 1808 and liquid thinning device 1815 are configured to position the thinned fluid 1826 and plasma 1830 proximate to each other for proper activation of the fluid 1826. For example, in this embodiment, the electrode 1806, dielectric barrier 1810, conductive element 1850, and spin cylinder 1820 are all configured as interfacing cylinder shapes with filleted radii that create a matching plasma 1830 (and associated afterglow) and thin layer of fluid 1826.

The apparatus 1800 also includes other components, such as, for example, a conduit 1856, a motor 1858, a motor shaft 1859, a covered collection chamber 1862, and a fluid outlet or drain 1864.

The apparatus 1800, using fluid thinning device 1815, including spin cylinder 1820, thins the fluid 1826 and produces internal mixing of the fluid 1826 in a manner similar to the apparatus 1500 with fluid thinning device 1515 and spin cylinder 1520 described above, albeit with the described features associated with the fillet 1823. In particular, the thinning and mixing properties discussed above in the spin disk embodiments also apply to the spin cylinder embodiments, including the various shearing forces due to angular and radial velocity differences within the thin layer of fluid 1826 along the bottom and side wall surfaces of the spin cylinder 1820, including the filleted portion 1823.

In this embodiment, as shown by the arrows in FIG. 18, the fluid 1826 is directed onto the spin cylinder 1820 from the conduit 1856 in a direction perpendicular to the bottom of the spin cylinder 1820, flows across the spinning bottom surface 1822 of the spin cylinder 1820, along the fillet 1823, and up the spinning side wall surface 1824 in a thin layer while exposed to the afterglow of the plasma 1830, exits the top of the spin cylinder 1820 in a radial direction due to its radial momentum, and is collected in the covered collection chamber 1862. In some embodiments, at least a portion of the fluid 1826 exposed to the plasma 1830 may be recirculated back through the apparatus 1800 for further activation.

Figure 19:
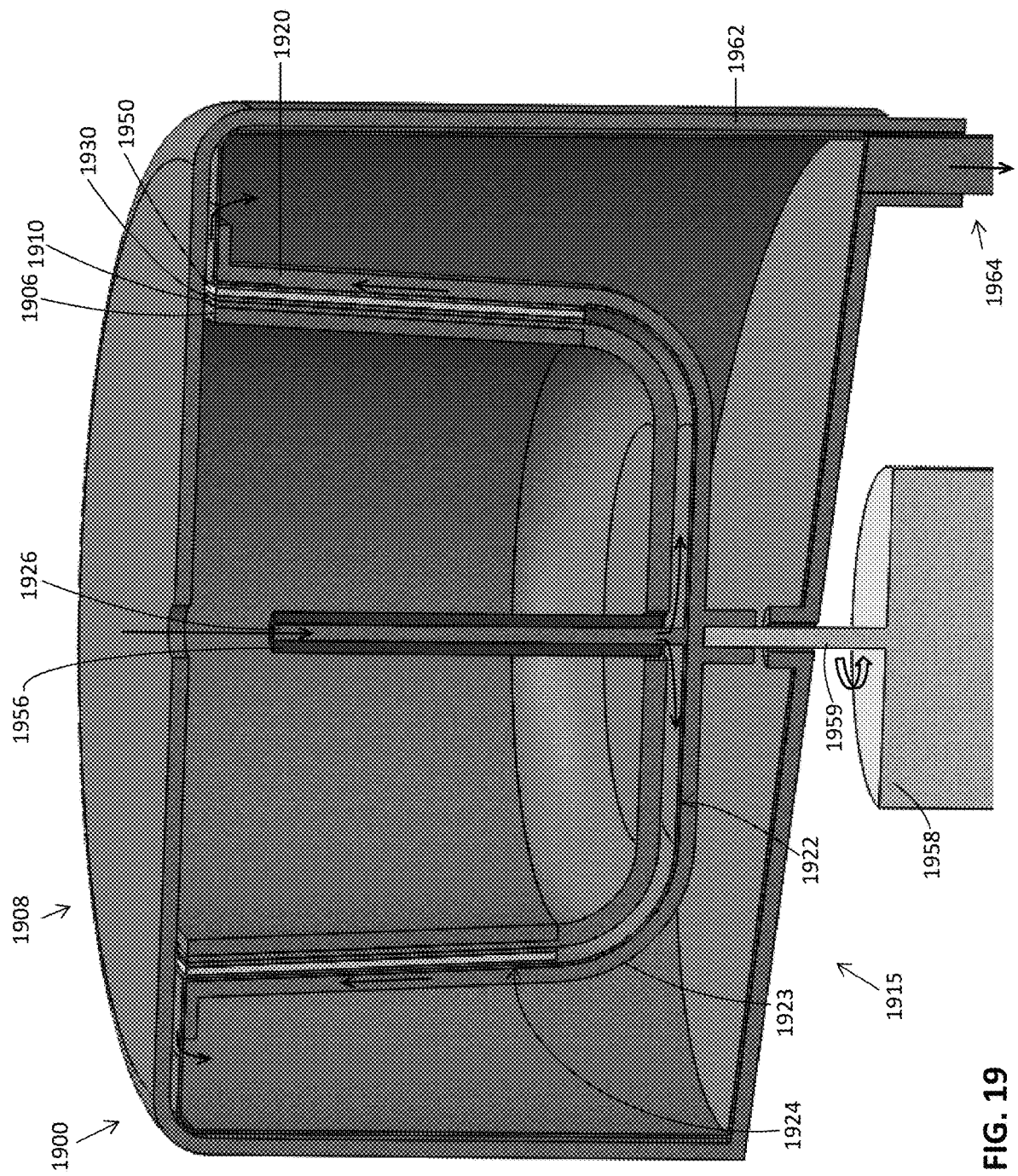
FIG. 19 is a cross-section of a perspective drawing of another exemplary embodiment of a PAL generation apparatus with another exemplary spin cylinder.
Figure 20:
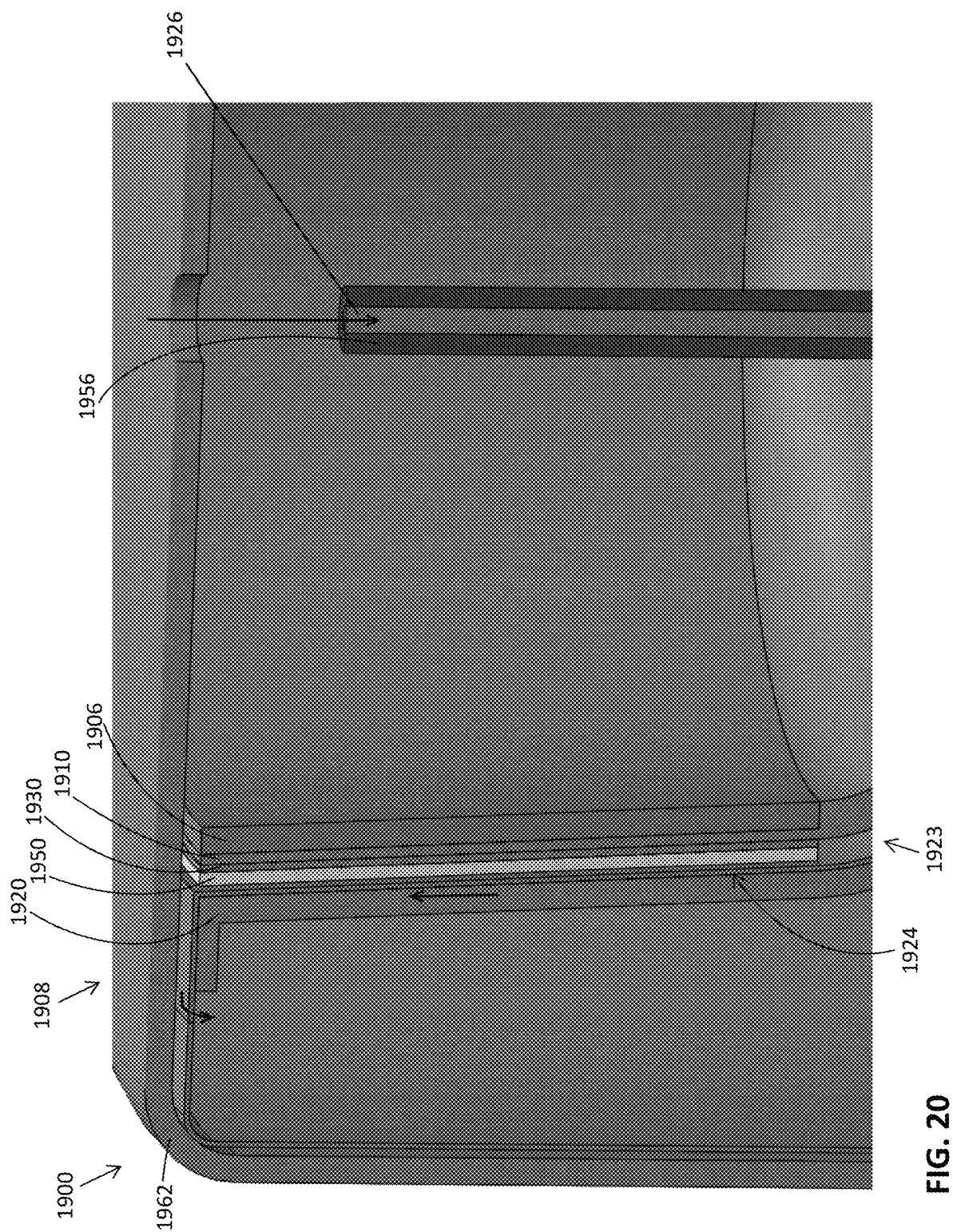
FIG. 20 is a cross-section of a portion of the apparatus of FIG. 19.

FIGS. 19-20 illustrate another exemplary embodiment of a PAL generation apparatus 1900 with another exemplary spin cylinder. FIG. 19 is a cross-section of a perspective drawing of the apparatus 1900. FIG. 20 is a cross-section of a portion of the apparatus 1900. In this embodiment, the cylinder side wall is connected to the cylinder bottom with a fillet, but the fluid is only exposed to the plasma along the cylinder side wall.

A plasma generating device 1908 includes a high voltage electrode 1906, a dielectric barrier 1910, and a conductive element 1950 acting as a filter to create an indirect plasma system. Spacers (not shown) may be used to maintain a gap (e.g., an air gap) between the conductive element 1950 and the dielectric barrier 1910. These components are arranged and operate along the cylinder side wall in a manner similar to their corresponding respective components 1506, 1510, 1550 in apparatus 1500.

The apparatus 1900 also includes a fluid (e.g., liquid) thinning device 1915 with an exemplary spin cylinder 1920 with at least one surface for supporting a supply of fluid 1926. The spin cylinder 1920 moves (rotates) at a speed that creates a thin layer of the fluid 1926 as the fluid 1926 flows across the spinning cylinder side wall surface 1924 of the spin cylinder 1920. In this embodiment, the transition from the cylinder bottom surface 1922 to the cylinder side wall surface 1924 includes fillet 1923. The curved fillet 1923 can be used to minimize fluid 1926 splashing and/or disruption as it transitions from the planar direction along the cylinder bottom surface 1922 to the angled side wall surface 1924. Any radius suitable for a particular or various applications may be used for fillet 1923

The other features of the spin cylinder 1920 (e.g., slight taper on the inside wall) allows the fluid 1926 to travel upward against gravity within the spin cylinder 1920 as described above. However, in this embodiment, the liquid 1926 does not have to be maintained in a thin layer along the cylinder bottom surface 1922. The thin layer of the fluid 1926 only forms along the spinning cylinder side wall surface 1924. In this manner, the fluid 1926 along the bottom of the cylinder may be sporadic, "flooded," and/or act as a buffer or reservoir for fluid 1926 before the fluid 1926 flows across the cylinder side wall surface 1924 in a thin layer. In some embodiments, apparatus 1900 may be configured as a portable device that is not reliant on gravity to maintain fluid 1926 along the spin cylinder 1920 surfaces, as mentioned above.

The plasma generating device 1908 and liquid thinning device 1915 are configured to position the thinned fluid 1926 and plasma 1930 proximate to each other for proper activation of the fluid 1926. For example, in this embodiment, the electrode 1906, dielectric barrier 1910, conductive element 1950, and spin cylinder 1920 are all configured as interfacing cylindrical shapes along the cylinder side wall to create a matching plasma 1930 (and associated afterglow) and thin layer of fluid 1926.

The apparatus 1900 also includes other components, such as, for example, a conduit 1956, a motor 1958, a motor shaft 1959, a covered collection chamber 1962, and a fluid outlet or drain 1964.

The apparatus 1900, using fluid thinning device 1915, including spin cylinder 1920, thins the fluid 1926 and produces internal mixing of the fluid 1926 in a manner similar to the apparatus 1500 with fluid thinning device 1515 and spin cylinder 1520 described above, albeit with the described features associated with the fillet 1923 and the plasma generating device 1908 only activating the fluid 1926 along the cylinder side wall. In particular, the thinning and mixing properties discussed above in the spin disk embodiments also apply to the spin cylinder embodiments, including the various shearing forces due to angular and radial velocity differences within the thin layer of fluid 1926 along the side wall surface 1924 of the spin cylinder 1920.

In this embodiment, as shown by the arrows in FIGS. 19 and 20, the fluid 1926 is directed onto the spin cylinder 1920 from the conduit 1956 in a direction perpendicular to the bottom of the spin cylinder 1920, flows across the spinning bottom surface 1922 of the spin cylinder 1920, along the fillet 1923, and along the spinning side wall surface 1924 in a thin layer while exposed to the afterglow of the plasma 1930 (which is the only thin layer fluid portion), exits the top of the spin cylinder 1920 in a radial direction due to its radial momentum, and is collected in the covered collection chamber 1962. In some embodiments, at least a portion of the fluid 1926 exposed to the plasma 1930 may be re-circulated back through the apparatus 1900 for further activation.

FIGS. 21-22 illustrate another exemplary embodiment of a PAL generation apparatus 2100 with an exemplary conveyor. FIG. 21 is a cross-section of a perspective drawing of the apparatus 2100. FIG. 22 is a cross-section of a side view of the apparatus 2100. In this embodiment, fluid is thinned and exposed to plasma along the surface of a conveyor.

A simplified plasma generating device 2108 is shown with a high voltage electrode 2106 to create a plasma 2130. The high voltage electrode 2106 is connected to a high voltage power source via a connector/cable (not shown), as described above. Although not shown in the simplified drawing, the plasma generating device may also include a dielectric barrier, a conductive element acting as a filter to create an indirect plasma system, spacers to maintain a gap between the conductive element and the dielectric barrier, and a connection connecting the conductive element to ground or other circuitry. All of these components can have the features and capabilities as described in the above embodiments.

The apparatus 2100 also includes a fluid (e.g., liquid) thinning device 2115 with a conveyor system 2115. The conveyor system 2115 includes a conveyor belt 2120 with a surface for supporting a supply of fluid 2126 and pulleys 2121 for supporting and moving the conveyor belt 2120. The conveyor belt 2120 moves at a speed that creates a thin layer of the fluid 2126 as the fluid 2126 flows across the surface 2122 of the conveyor belt 2120. Fluid 2126 may be, for example, one of the various liquids as mentioned above, including, for example, water or water with additional additives. The conveyor belt 2120 may be any suitable material and configuration, including, for example, flat, textured, and/or ribbed in one or more directions to assist in the movement and/or mixing of fluid 2126.

The plasma generating device 2108 and liquid thinning device 2115 are configured to position the thinned fluid 2126 and plasma 2130 proximate to each other for proper activation of the fluid 2126. For example, in this embodiment, the electrode 2106 (and other components of the plasma generating device 2108 not shown), and conveyor belt 2120 are configured as interfacing planes that create a flat plasma 2130 and a flat thin layer of fluid 2126.

The apparatus 2100 also includes a conduit 2156 in which fluid 2126 flows from an inlet and is deposited onto the conveyor belt 2120. A motor or other means may be used to rotate one or more of the pulleys 2121. In this manner, fluid 2126 is deposited onto the conveyer belt 2120 moving at relatively high speed roughly perpendicular to the conduit 2156. The moving conveyor belt 2120 imparts thinning and internal mixing of the fluid 2126 by the relatively high speed of the belt surface 2122 and the slower travelling fluid 2126.

During operation, the high voltage power source is turned on and a plasma 2130 forms below the dielectric barrier in the gap between the dielectric barrier and the filter in an indirect direct plasma embodiment or between the dielectric barrier and the fluid 2126 in a direct plasma embodiment. Fluid 2126 activated by the plasma and/or its afterglow, as discussed above, is plasma activated fluid. The PAL generation apparatus 2100 is configured such that the plasma generating device 2108 generates the plasma 2130 proximate to the fluid 2126 on the conveyor belt 2120, where at least a portion of the fluid 2126 exposed to the plasma 2130 becomes plasma activated. The close proximity of the plasma 2130 to the thinned and mixing fluid 2126 on top of the conveyor belt 2120 creates high concentrations of plasma activated species in the fluid 2126.

The apparatus 2100, using fluid thinning device 2115, including conveyor belt 2120, thins the fluid 2126 and produces internal mixing of the fluid 2126 in a manner similar to the apparatus 400 with fluid thinning device 415 and spin disk 420 described above. In particular, the thinning and mixing properties discussed above in the spin disk embodiments also apply to the conveyor embodiments, including the various shearing forces due to angular velocity differences within the thin layer of fluid 2126 along the surface 2122 of the conveyor belt 2120.

The conveyor belt 2120 thins the fluid 2126 and produces internal mixing of the fluid 2126, as discussed above. In this embodiment, as shown by the arrows in FIG. 21, the fluid 2126 is directed onto the conveyor belt 2120 from the conduit 2156 in a direction perpendicular to the conveyor belt 2120, flows across the moving surface 2122 of the conveyor belt 2120 in a thin layer while exposed to the plasma 2130, and exits the conveyor belt 2120 as the fluid 2126 rolls over the end of the conveyor 2117. In some embodiments, a recirculation device may be configured to direct at least a portion of the fluid 2126 exposed to the plasma 2130 back through the apparatus 2100.

Figure 23A:
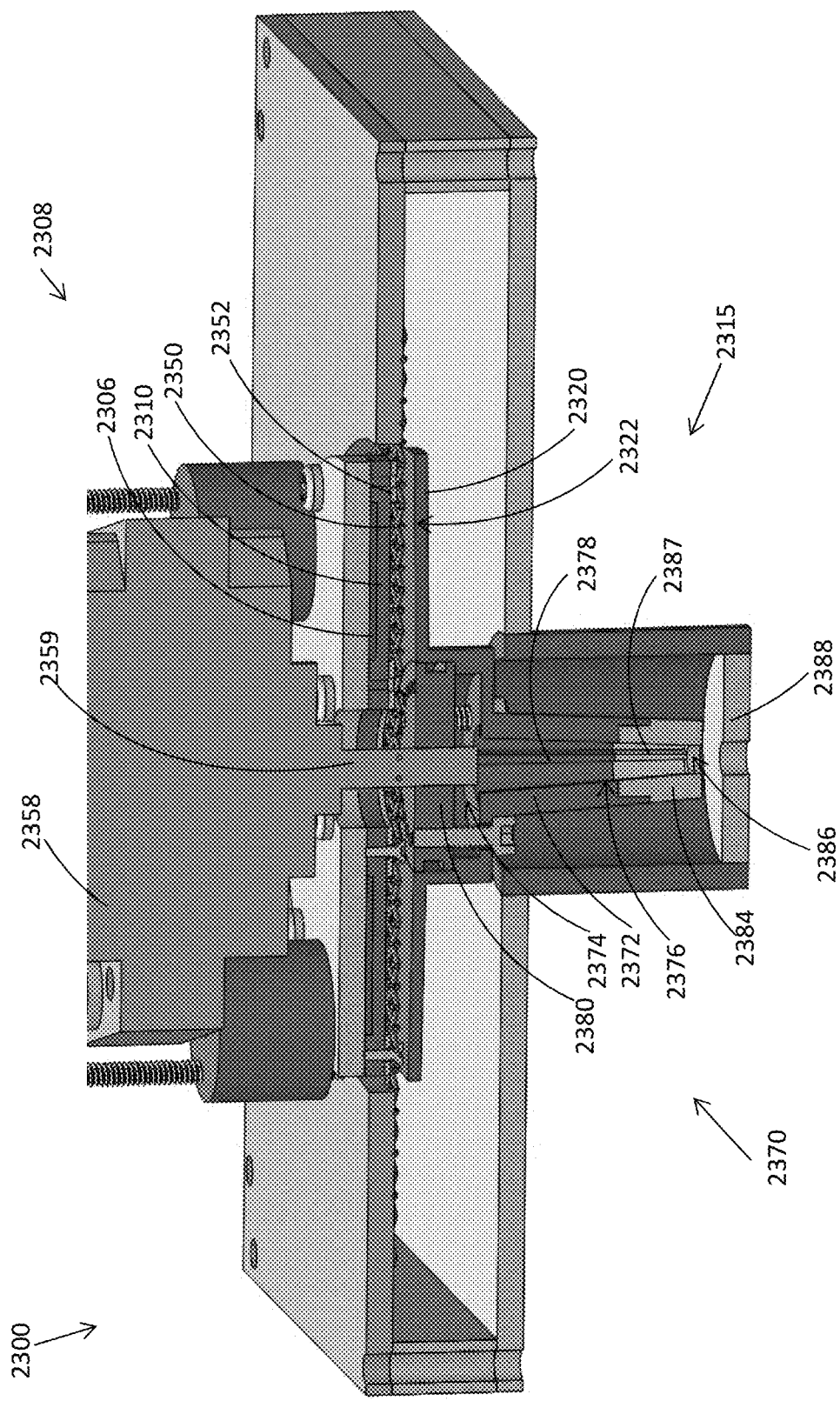
FIG. 23A is a cross-section of a perspective drawing of an exemplary embodiment of a PAL generation apparatus with an exemplary spin disk and an exemplary fluid feed device.
Figure 23B:
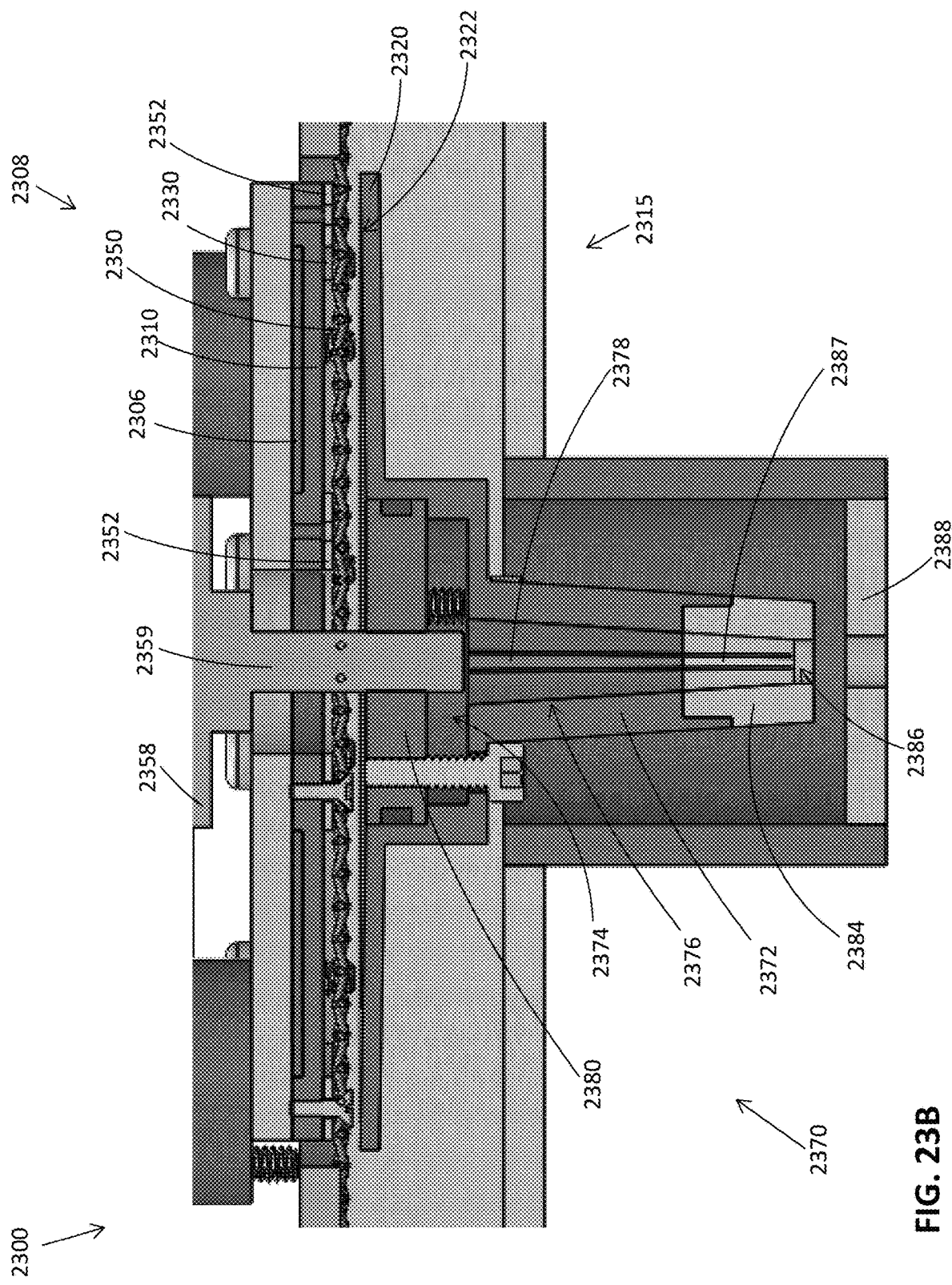
FIG. 23B is a side view cross-section of a portion of the apparatus of FIG. 23A.

FIGS. 23-24 illustrate an exemplary embodiment of a PAL generation apparatus 2300 with an exemplary spin disk and an exemplary fluid feed device. FIG. 23A is a cross-section of a perspective drawing of the apparatus 2300. FIG. 23B is a cross-section view of a portion of the apparatus 2300. FIGS. 24A and 24B are cross-section views of selected components of the apparatus 2300.

A plasma generating device 2308 includes a high voltage electrode 2306 and a dielectric barrier 2310. The high voltage electrode 2306 is connected to a high voltage power source via a connector/cable (not shown), as described above. The apparatus also includes a conductive element 2350 acting as a filter to create an indirect plasma system. In this embodiment, the filter 2350 is a conductive mesh or screen. Spacers 2352 maintain a gap (e.g., an air gap) between the conductive element 2350 and the dielectric barrier 2310.

The apparatus 2300 also includes a fluid (e.g., liquid) thinning device 2315 with a spin disk 2320 with a surface for supporting a supply of fluid (not shown). As described in detail above with regard to spin disk 420 of apparatus 400, the surface of the spin disk 2320 moves at a speed that creates a thin layer of the fluid as the fluid flows across the spinning surface 2322 of the spin disk 2320.

The plasma generating device 2308 and liquid thinning device 2315 are configured to position the thinned fluid and plasma 2330 proximate to each other for proper activation of the fluid. For example, in this embodiment, the electrode 2306, dielectric barrier 2310, conductive element 2350, and spin disk 2320 are all configured as interfacing disk shapes that create a disk-shaped plasma 2330 and a disk-shaped thin layer of fluid.

The apparatus 2300 also includes an exemplary fluid feed device 2370. In this embodiment, the spin disk 2320 is spun from a motor 2358 and motor shaft 2359 mounted above the spin disk 2320. Fluid feed device 2370 includes a fluid feed tube 2372 that directs fluid to a fluid reservoir 2374 below the spin disk 2320. In this embodiment, the spin disk 2320, the fluid feed tube 2372, and the fluid reservoir 2374 are integrated into one component, but in other embodiments, separate and/or other combinations of components may be used. The feed tube 2372 may include feed tube walls 2376 with a slight taper and/or ribs 2378. The fluid feed device 2370 may also include a disk insert 2380 with exit holes 2382, a tube insert 2384 with inlet hole 2386 and ribs 2387, and/or reservoir fill valve 2388. In other embodiments, one or more of these components 2380, 2384, 2388 and/or features 2382, 2386, 2387 may be integrated with other components, including, for example, spin disk 2320. In this embodiment, the tube insert 2384 has inlet hole 2386 at the bottom of the tube insert 2384. In an embodiment without a tube insert 2384, the feed tube 2372 would have a similar inlet hole at the bottom of the feed tube 2372. The feed tube 2372 and/or tube insert 2384 has radially extending internal ribs 2378, 2387 near the inlet hole 2386. In this embodiment, the feed tube 2372 is connected to the liquid thinning device 2315 and spins with the liquid thinning device 2315. The fluid feed device 2370 may also include a regulator or valve 2388 to control the flow of fluid into the feed tube 2372.

During operation, the inlet hole 2386 end of the tube/insert 2372, 2384 would be submerged inside a reservoir of fluid (not shown). As the motor 2358 starts to spin the spin disk 2320, the fluid at the bottom of the tube/insert 2372, 2384 is forced to the outside wall of the bottom of the tube/insert 2372, 2384 and spins at the same rate as the tube/insert 2372, 2384 due to the ribs 2378, 2387 on the inside of the tube/insert 2372, 2384. The taper inside walls 2376 of the tube/insert 2372, 2384 causes the fluid within the tube/insert 2372, 2384 to climb up the tube/insert 2372, 2384 toward the spin disk 2320 due to the centrifugal force component acting on the mass of the fluid. After the fluid reaches the top of the tube/insert 2372, 2384, it enters fluid reservoir 2374 below the spin disk 2320. Fluid is forced to the outside of the fluid reservoir 2374 by centrifugal force.

A plurality of openings or holes 2382 above the periphery of the fluid reservoir 2374 allow fluid to exit the fluid reservoir 2374 and emerge onto the surface 2322 of the spin disk 2320. In this embodiment, the holes 2382 are in the disk insert 2380 that is inserted into the spin disk 2320 above the feed tube 2372. In this manner, the fluid feed tube 2372 directs the fluid to the thinning surface 2322 of the fluid thinning device 2315 from below the thinning surface 2322. However, the spinning of the spin disk 2320 thins and adds internal mixing flow to the fluid in the same manner as spin disk 420 of apparatus 400 described above, which directed fluid to the spin disk 420 from above.

In another embodiment, fluid feed device 2370 and fluid feed tube 2372 direct the fluid to the thinning surface 2322 of the fluid thinning device 2315 with positive pressure and may not be directly connected to the liquid thinning device 2315 and/or spinning with the liquid thinning device 2315. In other embodiments, various feed tube inserts 2384 may be interchanged in the fluid feed device 2370 to differently regulate the flow of fluid through the liquid feed tube 2372.

The exemplary fluid feed device 2370 may be used with various PAL generation apparatuses, including, for example, the spin disk and spin cylinder apparatuses described above.

As mentioned above, the indirect and direct plasma systems shown above are exemplary. In other embodiments, indirect or direct plasmas may be used interchangeably with the apparatuses described above. Several types of plasmas may be suitable for activating the fluid, including, for example, indirect or direct non-thermal plasma generators, a plasma jet, DBD, DBD plasma jet, RBD, gliding arc, corona discharge, non-thermal arc discharge, pulsed spark discharge, hollow cathode discharge, glow discharge, etc. Where applicable, the plasma carrier gas can be a molecular gas (such as, e.g., air, oxygen, nitrogen), a noble gas (such as, e.g., helium or argon), or a mixture of any of them.

FIGS. 25-26 depict exemplary embodiments of some of these types of plasmas. FIGS. 25A-25F illustrate exemplary plasma generation systems. FIGS. 26A-26E are pictures of exemplary plasma systems, showing the generated plasma.

Figure 25A:
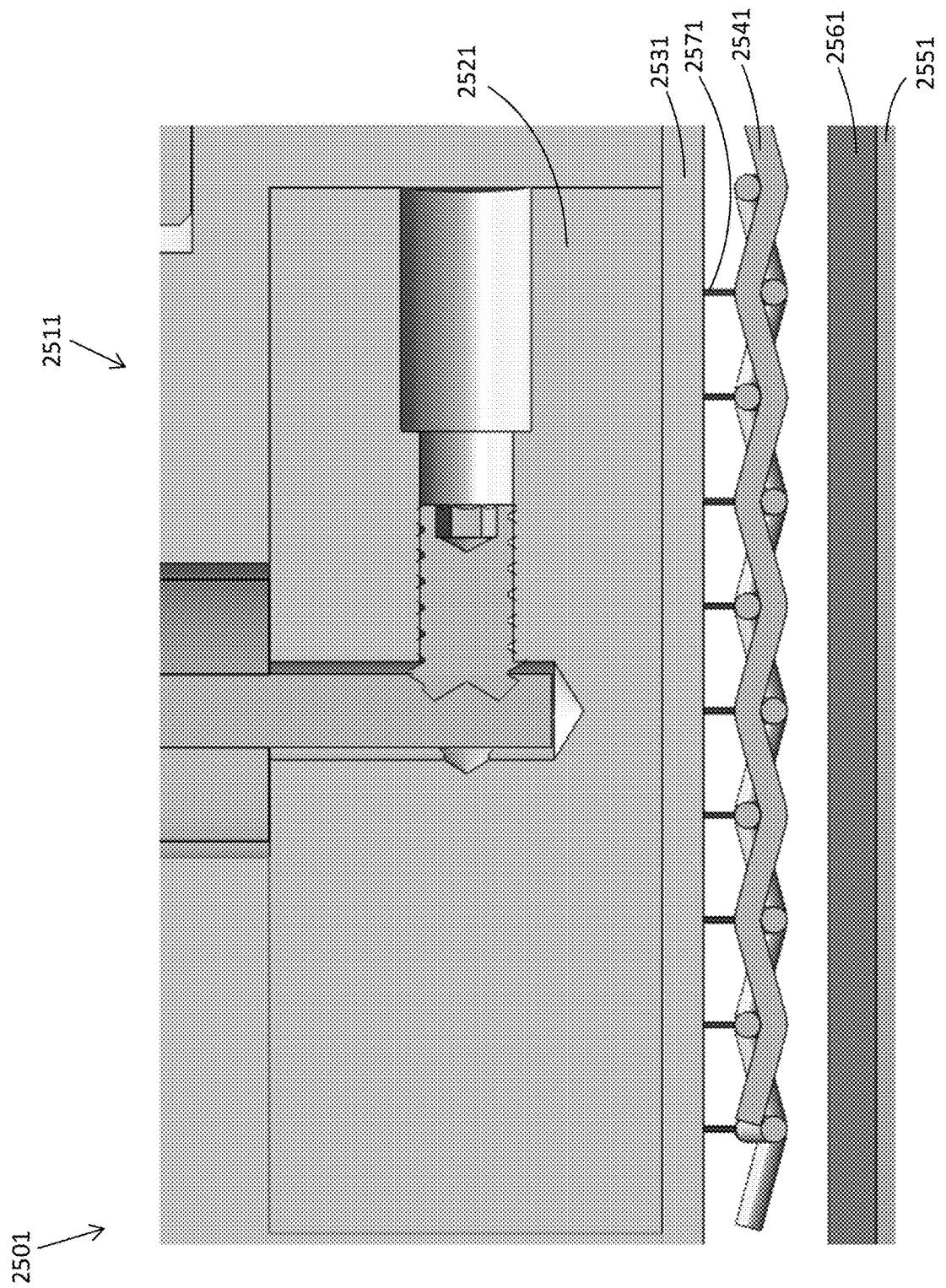
FIG. 25A illustrates an exemplary plasma generation apparatus with DBD indirect plasma for activating fluid.

FIG. 25A illustrates an exemplary embodiment of a plasma generation apparatus 2501 with DBD indirect plasma for activating fluid. Plasma generating device 2511 includes a high voltage electrode 2521 and a dielectric barrier 2531. The apparatus 2501 also includes a conductive element 2541 acting as a filter to create an indirect plasma system. The apparatus 2501 also includes a fluid thinning device with a surface 2551 for supporting a thinned layer of fluid 2561 (e.g., liquid). Plasma 2571 and its afterglow are created proximate to the thinned layer of fluid 2561 to activate the fluid 2561.

Figure 25B:
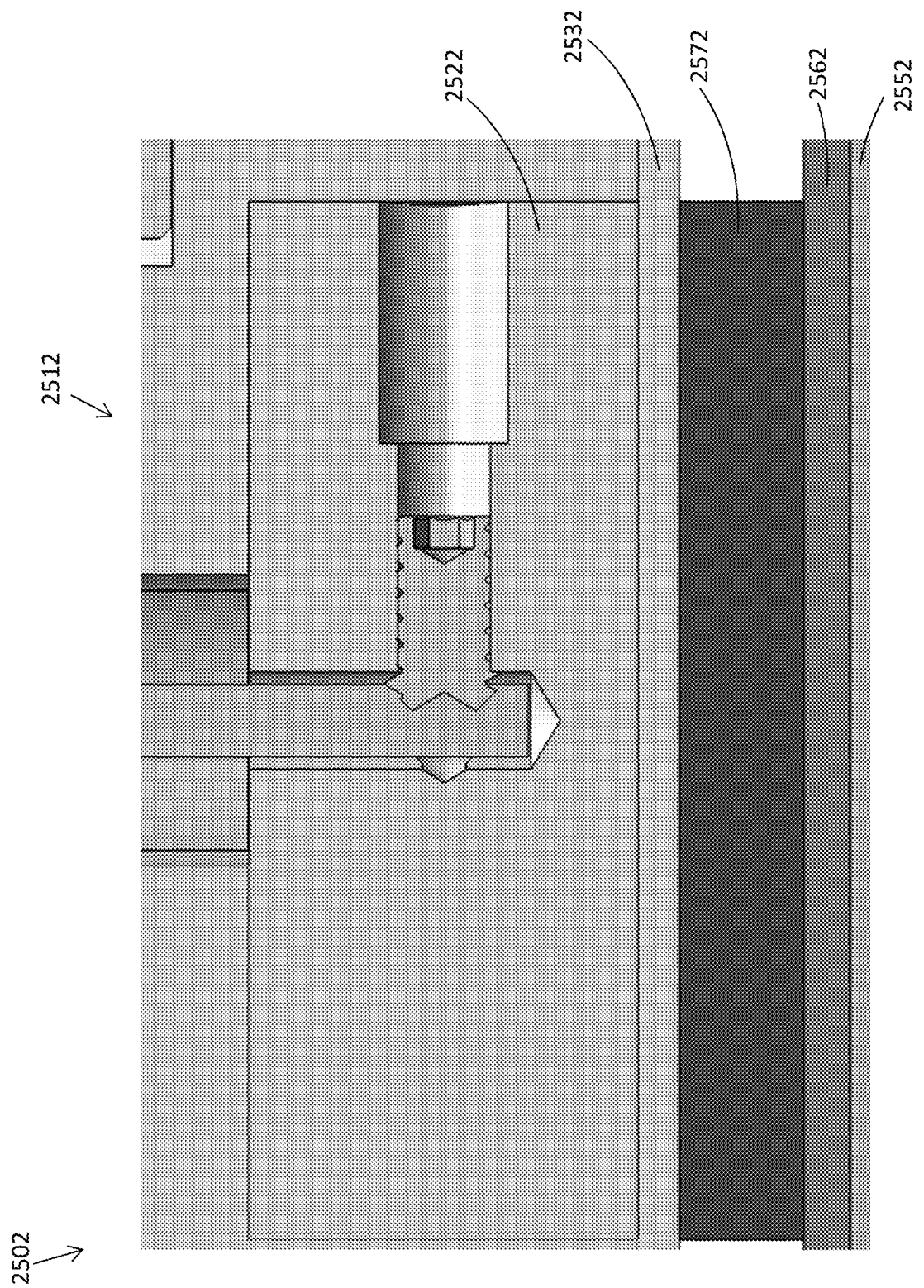
FIG. 25B illustrates an exemplary plasma generation apparatus with DBD direct plasma for activating fluid.

FIG. 25B illustrates an exemplary embodiment of another plasma generation apparatus 2502 with DBD direct plasma for activating fluid. Plasma generating device 2512 includes a high voltage electrode 2522 and a dielectric barrier 2532. The apparatus 2502 creates a direct plasma system. The apparatus 2502 also includes a fluid thinning device with a surface 2552 for supporting a thinned layer of fluid 2562 (e.g., liquid). Plasma 2572 is created proximate to the thinned layer of fluid 2562 to activate the fluid 2562.

Figure 25C:
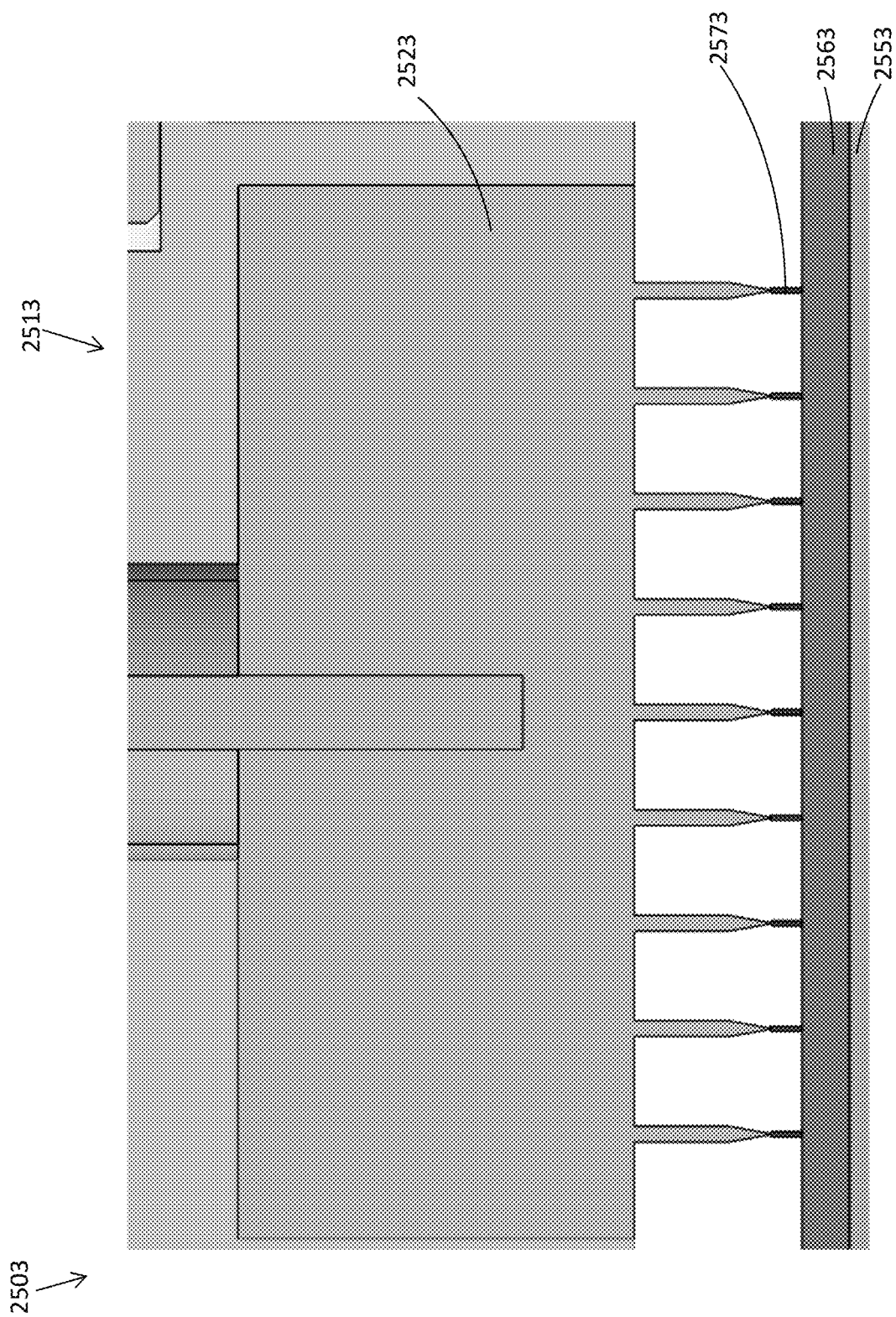
FIG. 25C illustrates an exemplary plasma generation apparatus with corona plasma for activating fluid.

FIG. 25C illustrates an exemplary embodiment of another plasma generation apparatus 2503 with corona plasma for activating fluid. Plasma generating device 2513 includes a high voltage electrode 2523. The apparatus 2503 also includes a fluid thinning device with a surface 2553 for supporting a thinned layer of fluid 2563 (e.g., liquid). Plasma 2573 is created proximate to the thinned layer of fluid 2563 to activate the fluid 2563. The plasma 2573 is shown extending from the electrode tips to the fluid 2563.

Figure 25D:
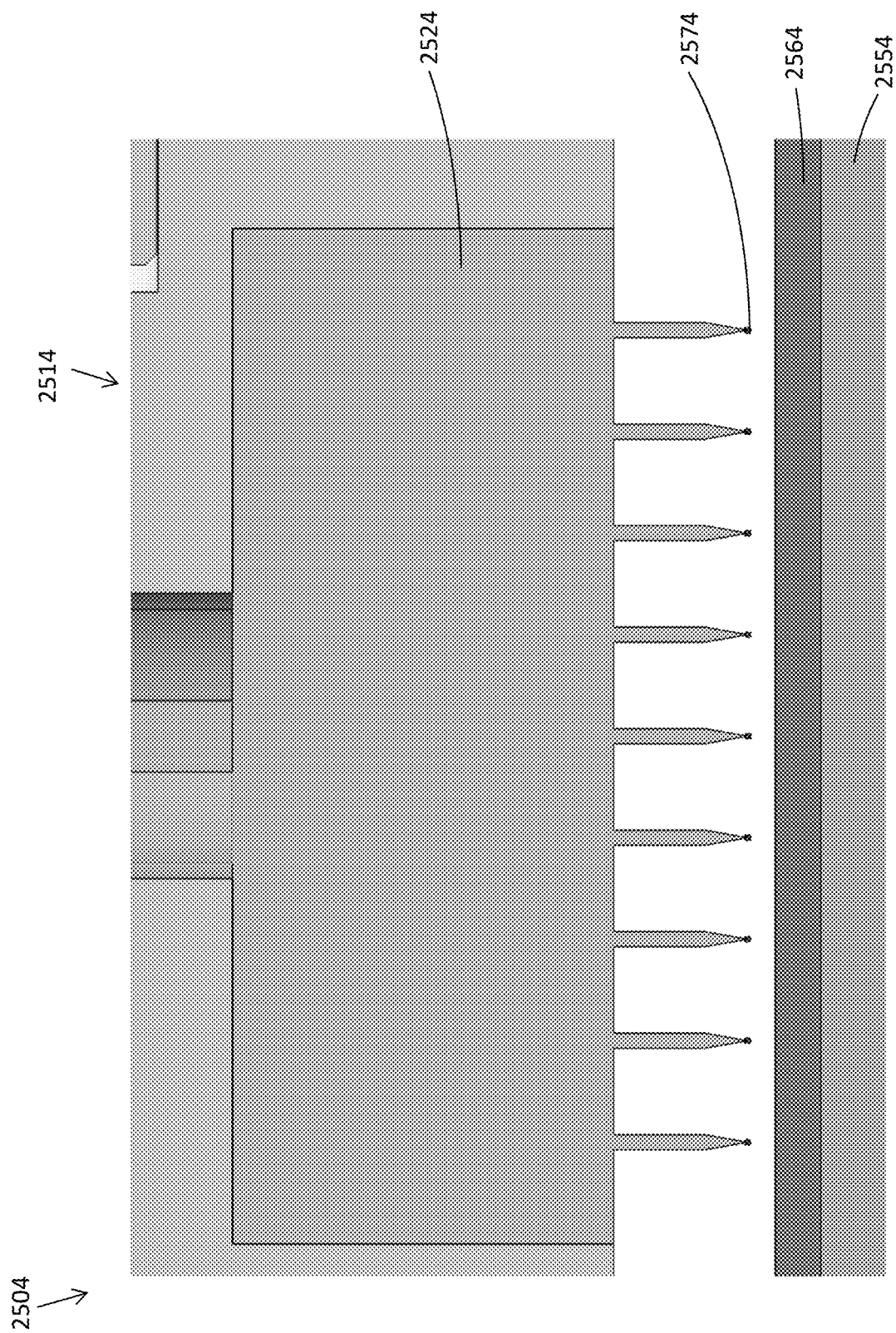
FIG. 25D illustrates another exemplary plasma generation apparatus with corona plasma for activating fluid.

FIG. 25D illustrates an exemplary embodiment of another plasma generation apparatus 2504 with corona plasma for activating fluid. Plasma generating device 2514 includes a high voltage electrode 2524. The apparatus 2504 also includes a fluid thinning device with a surface 2554 for supporting a thinned layer of fluid 2564 (e.g., liquid). Plasma 2574 is created proximate to the thinned layer of fluid 2564 to activate the fluid 2564. The plasma 2574 is shown locally at the electrode tips.

Figure 25E:
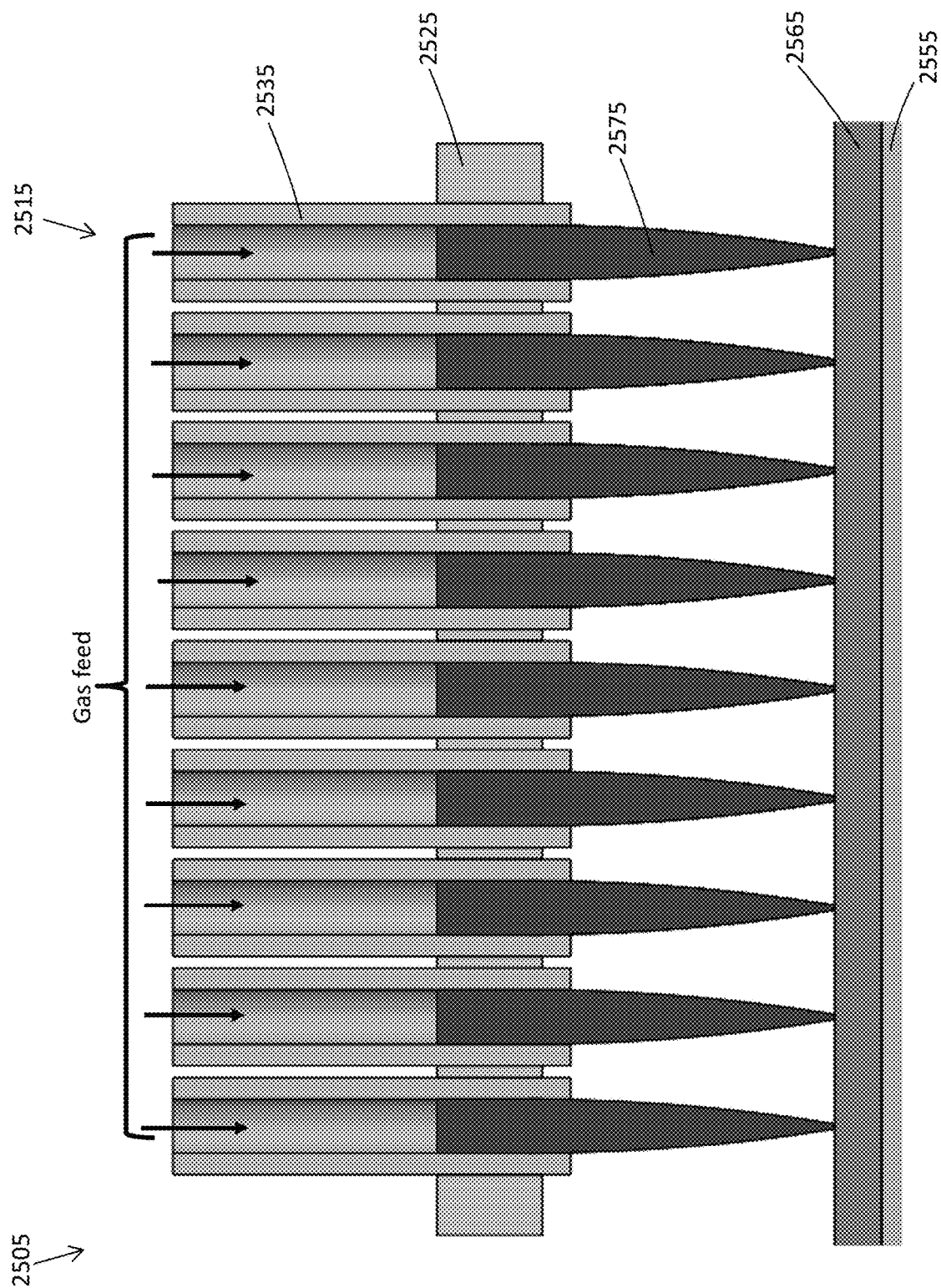
FIG. 25E illustrates an exemplary plasma generation apparatus with jet plasma for activating fluid.

FIG. 25E illustrates an exemplary embodiment of another plasma generation apparatus 2505 with jet plasma for activating fluid. Plasma generating device 2515 includes a high voltage electrode 2525 and a dielectric tube 2535. The apparatus 2505 creates a plasma jet system with a gas feed flowing through the tubes 2535. The apparatus 2505 also includes a fluid thinning device with a surface 2555 for supporting a thinned layer of fluid 2565 (e.g., liquid). Plasma 2575 is created as the gas flows through the tubes 2535 past the high voltage electrode 2525 towards the thinned layer of fluid 2565 to activate the fluid 2565.

FIG. 25E illustrates an exemplary embodiment of another plasma generation apparatus 2505 with jet plasma for activating fluid. Plasma generating device 2515 includes a high voltage electrode 2525 and a dielectric tube 2535. The apparatus 2505 creates a plasma jet system with a gas feed flowing through the tubes 2535. The apparatus 2505 also includes a fluid thinning device with a surface 2555 for supporting a thinned layer of fluid 2565 (e.g., liquid). Plasma 2575 is created as the gas flows through the tubes 2535 past the high voltage electrode 2525 towards the thinned layer of fluid 2565 to activate the fluid 2565.

Figure 25F:
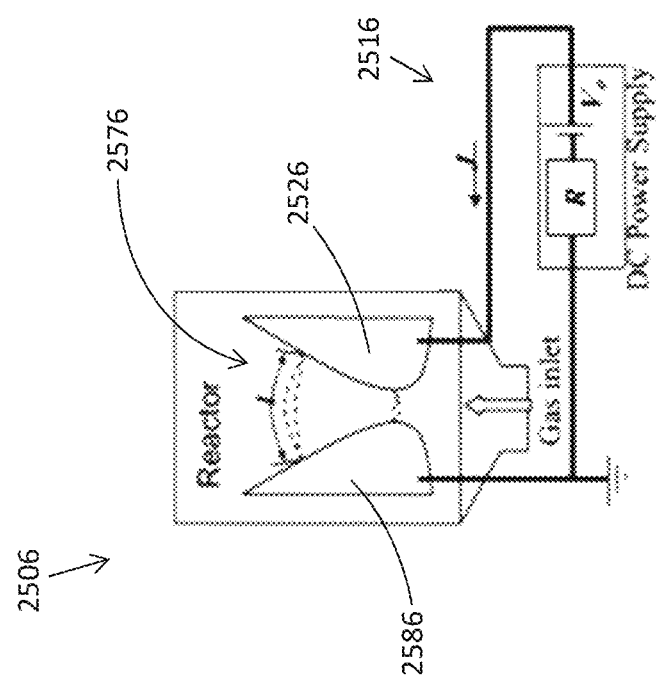
FIG. 25F illustrates an exemplary plasma generation apparatus with gliding arc plasma for activating fluid.

FIG. 25F illustrates an exemplary embodiment of another plasma generation apparatus 2506 with gliding arc plasma for activating fluid. Plasma generating device 2516 includes a high voltage electrode 2526. The apparatus 2506 creates a gliding arc plasma system with a gas feed flowing through the gas inlet. The apparatus 2506 also includes a fluid thinning device with a surface for supporting a thinned layer of fluid (not shown). Plasma 2576 is created as the gas flows between the high voltage electrode 2526 and a grounded electrode 2586 towards the thinned layer of fluid to activate the fluid.

Figure 26A:
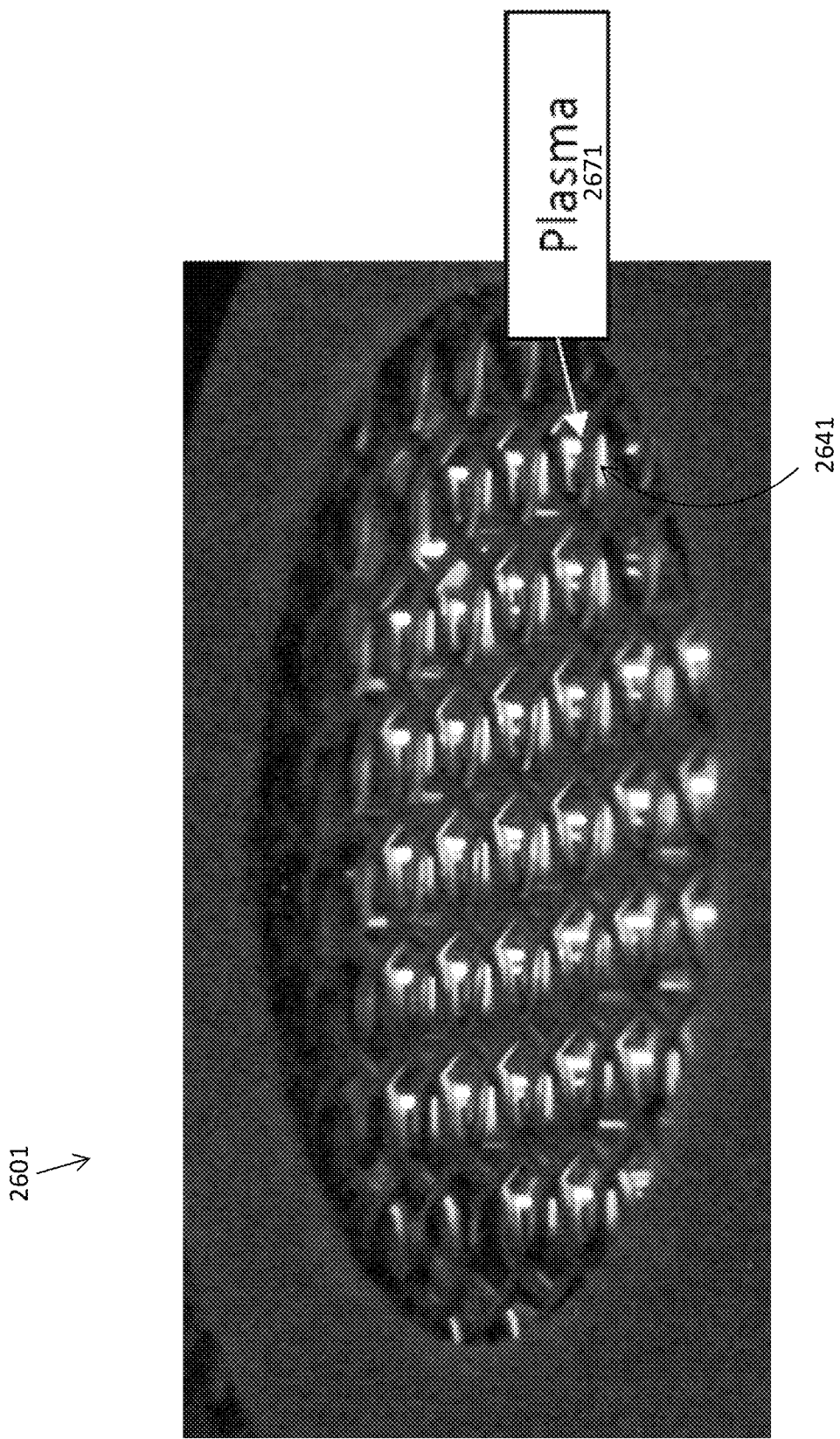
FIG. 26A is a picture showing plasma created by an exemplary indirect DBD plasma generation system under a mesh conductive element.
Figure 26B:
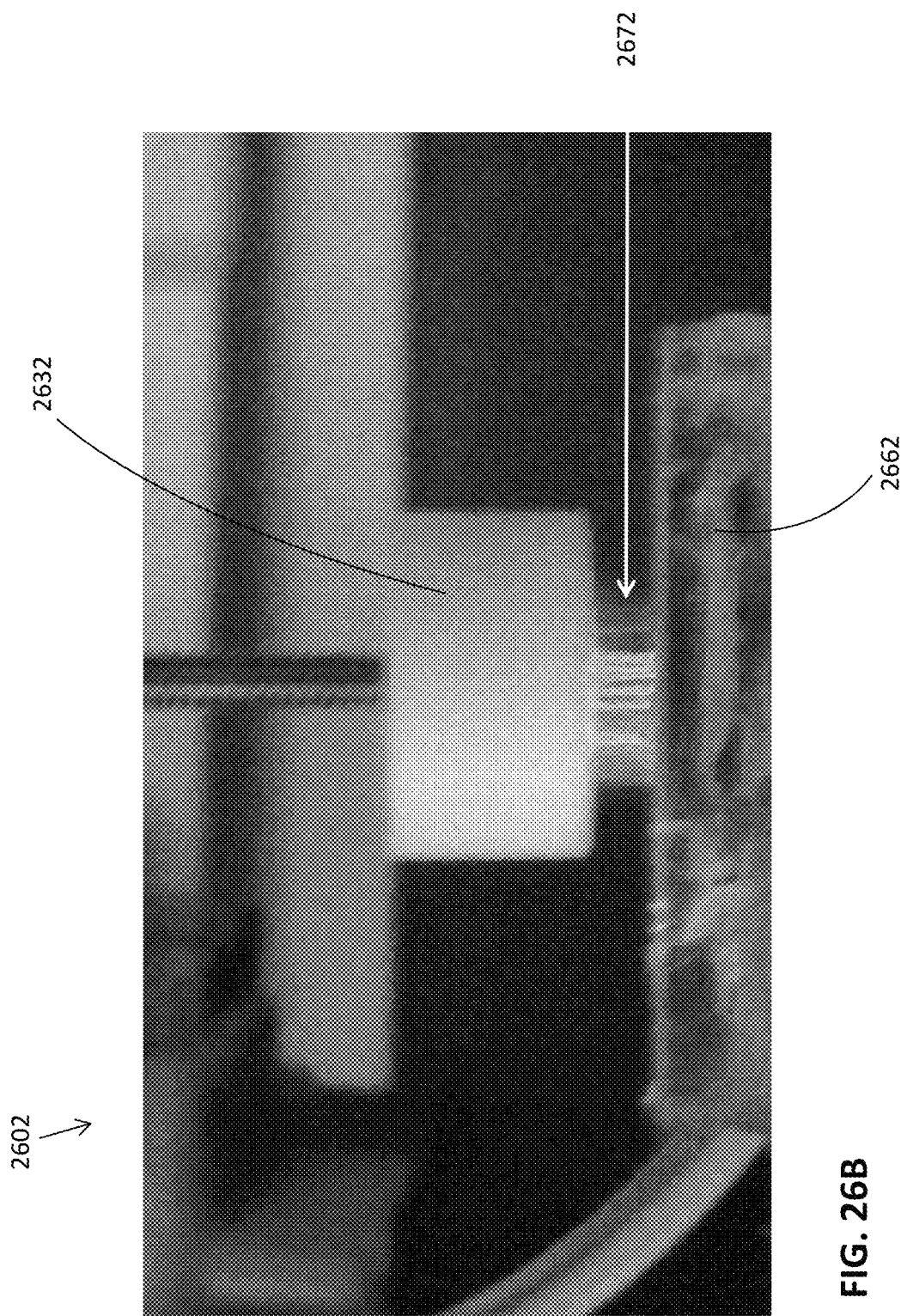
FIG. 26B is a picture showing plasma created by an exemplary direct DBD plasma generation system between a dielectric and water.
Figure 26C:
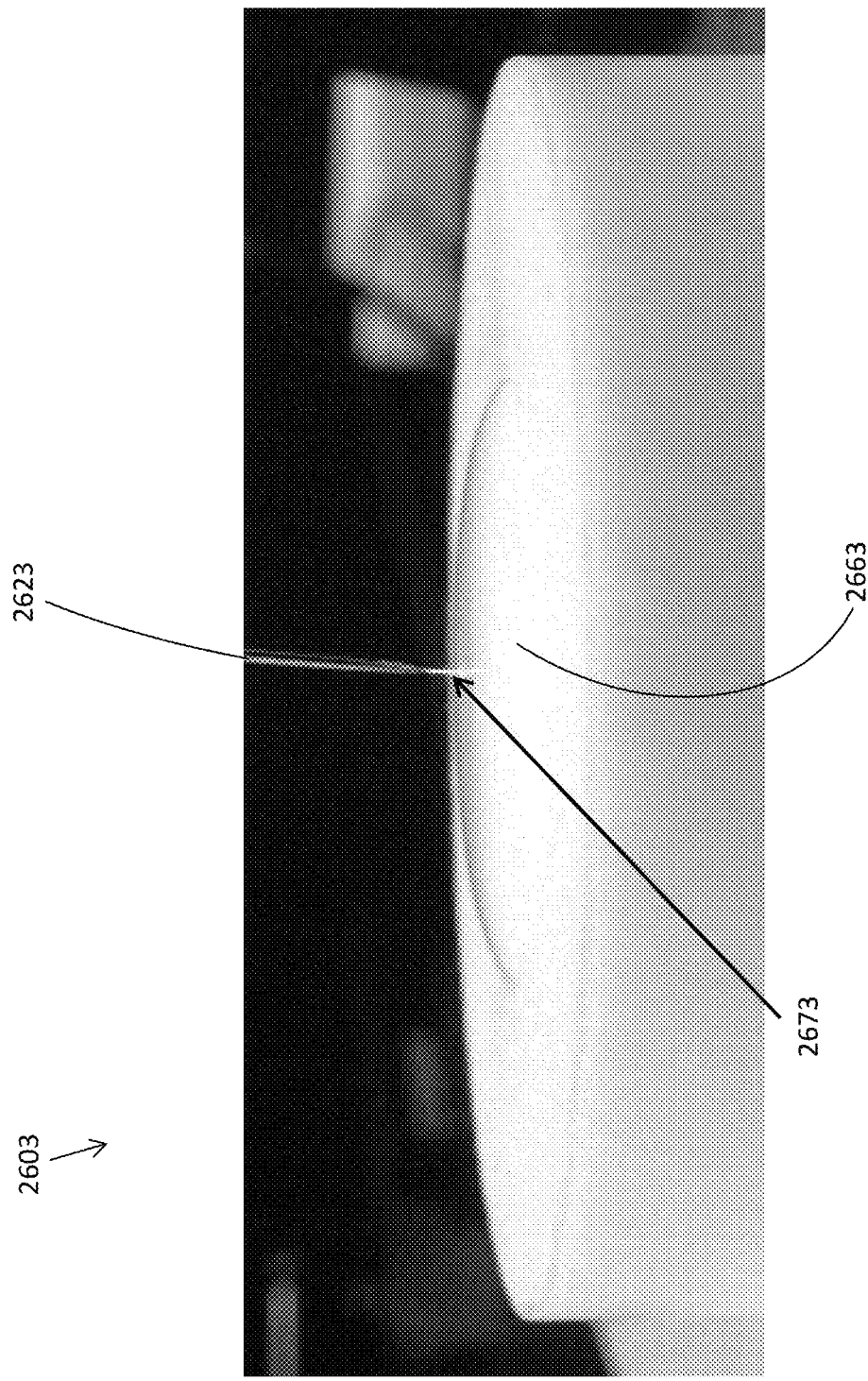
FIG. 26C is a picture showing plasma created by an exemplary corona plasma generation system between a needle tip and water.
Figure 26D:
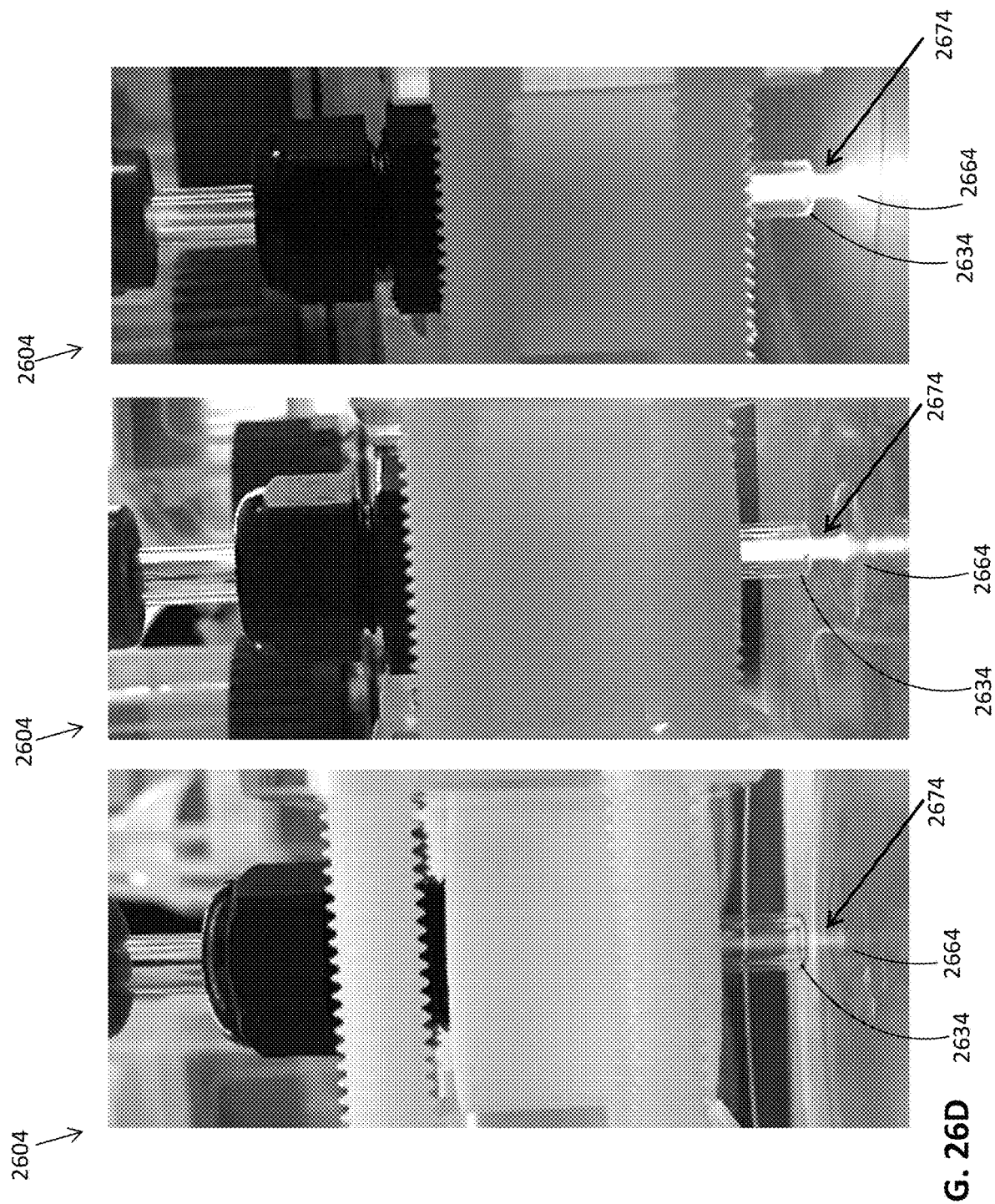
FIG. 26D shows pictures of plasma created by an exemplary plasma jet generation system with gas flow through a dielectric tube towards liquid.
Figure 26E:
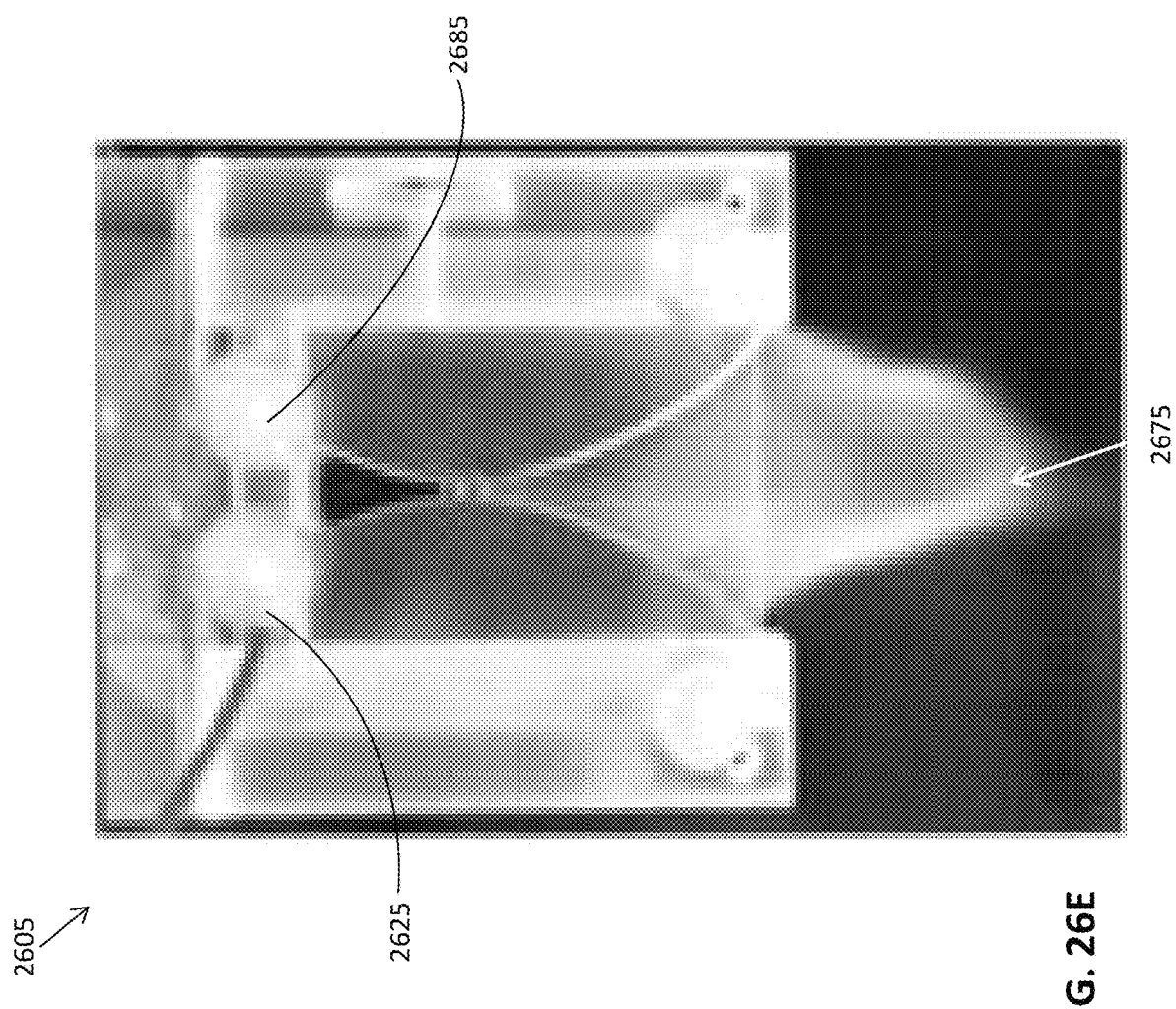
FIG. 26E shows pictures of plasma created by an exemplary gliding arc plasma generation system with gas flow between the high voltage electrode and a grounded electrode.

FIG. 26A is a picture showing plasma 2671 created by an exemplary indirect DBD plasma generation system 2601 under a mesh conductive element 2641. FIG. 26B is a picture showing plasma 2672 created by an exemplary direct DBD plasma generation system 2602 between a dielectric 2632 and water 2662. FIG. 26C is a picture showing plasma 2673 created by an exemplary corona plasma generation system 2603 between a needle tip 2623 and water 2663. FIG. 26D shows pictures of plasma 2674 created by an exemplary plasma jet generation system 2604 with gas flow through a dielectric tube 2634 towards liquid 2664. FIG. 26E shows pictures of plasma 2675 created by an exemplary gliding arc plasma generation system 2605 with gas flow between the high voltage electrode 2625 and a grounded electrode 2685.

The apparatuses described above can be used to create activated fluid (e.g., PAL) with high concentrations of plasma activated species due to the disclosed thinning and/or mixing features, and with extremely high concentrations of plasma activated species by re-circulating the fluid through the apparatus any number of times to increase the concentration of the species by multiple exposures to the plasma. Furthermore, these apparatuses can create large volumes of activated fluid by scaling up the apparatus or having multiple apparatuses working together in a coordinated system. Furthermore, the apparatuses can also be used to create highly activated fluid that can then be diluted with un-activated fluid to create larger volumes of less concentrated fluid.

Figure 27:
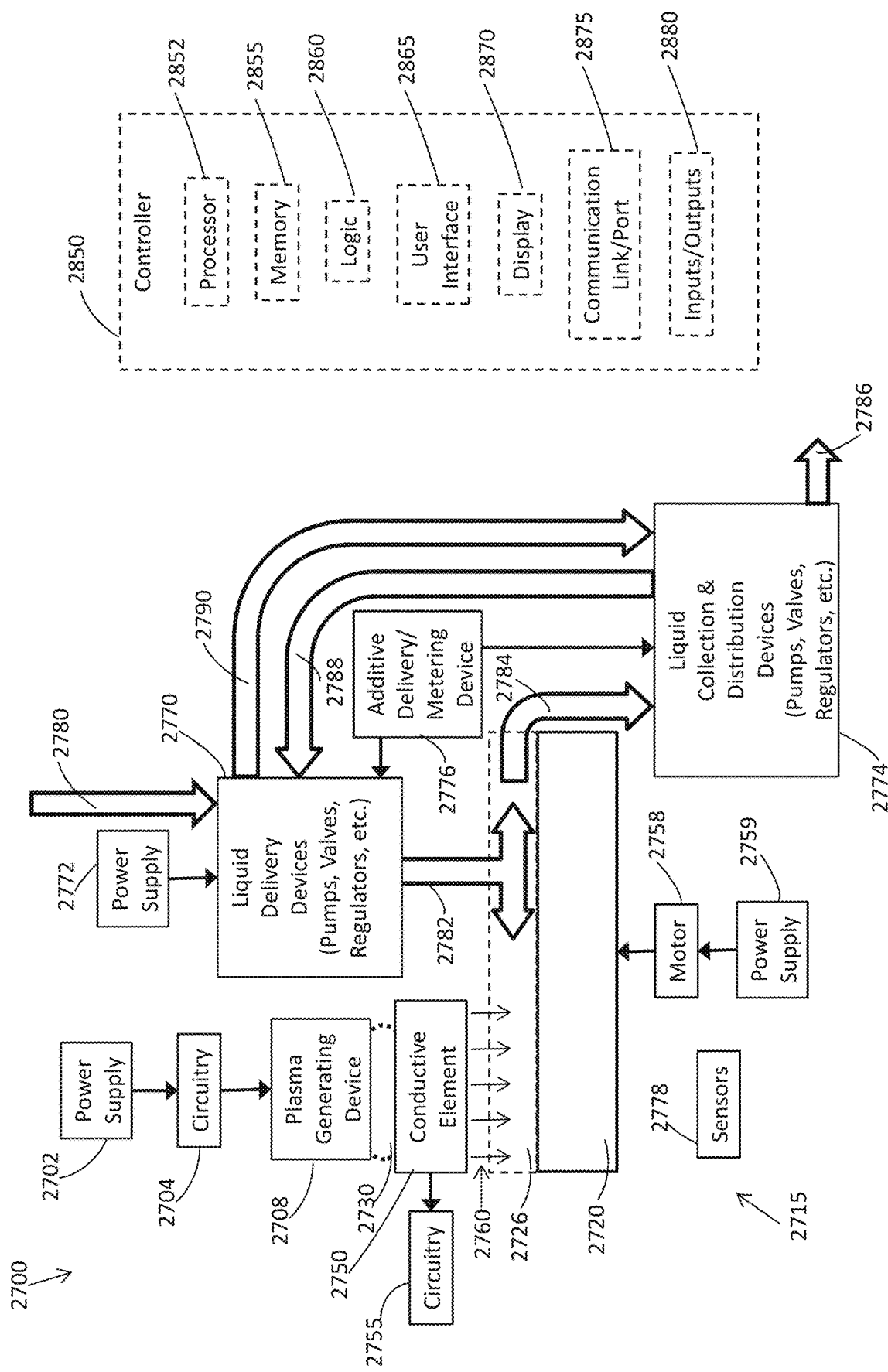
FIG. 27 is a block diagram of an exemplary PAL generation apparatus.

For example, FIG. 27 is a block diagram of an exemplary embodiment of a PAL generation apparatus 2700. An exemplary plasma generating device 2708 includes a high voltage electrode and a dielectric barrier (not shown). The high voltage electrode of the plasma generating device 2708 receives power from a high voltage power source 2702 and associated circuitry 2704 for creating the waveforms for any particular application. The apparatus may also include a conductive element 2750 acting as a filter to create an indirect plasma system. In some embodiments, the conductive element 2750 is grounded and in other embodiments the conductive element 2750 can be connected to circuitry 2755 for affecting an electric field associated with the plasma 2730. In some embodiments, the plasma generating device 2708 may be configured similarly to any one or more of the plasma generating devices 308, 408, 1508, 1808, 1908, 2108, 2308 described above, including any one or more of their components.

The apparatus 2700 also includes an exemplary liquid thinning device 2715 with a surface 2720 for supporting a liquid 2726. As described in detail above, the surface 2720 and liquid 2726 move at a relative speed that creates a thin layer (shown as dashed layer above surface 2720) of the liquid 2726 and/or mixes the liquid 2726 as the liquid 2726 flows across the surface 2720. A motor 2758 or other means may be used to move the surface 2720 along with an associated power supply 2759. In some embodiments, the liquid thinning device 2715 may be configured similarly to any one or more of the plasma generating devices 415, 1515, 1815, 1915, 2115, 2315 described above, including any one or more of their components.

As in the embodiments above, the plasma generating device 2708 and liquid thinning device 2715 are configured to position the thinned liquid 2726 and plasma 2730 (including its afterglow 2760 in indirect embodiments) proximate to each other for proper activation of the liquid 2726. During operation, the high voltage power supply 2702 is turned on and plasma 2730 forms below the dielectric barrier. The conductive element 2750 prevents charged ions and electrons from passing through and contacting the liquid 2726 to be activated. Liquid 2726 is activated by plasma 2730 or its afterglow 2760 (shown as arrows penetrating into liquid 2726) when it passes through and/or is created through conductive element 2750. The PAL generation apparatus 2700 is configured such that the plasma generating device 2708 generates the plasma 2730 proximate to the liquid 2726 on the substrate surface 2720, where at least a portion of the liquid 2726 exposed to the plasma 2730 becomes plasma activated.

The apparatus 2700 also includes an exemplary liquid delivery device 2770. Liquid delivery device 2770 delivers the liquid 2726 to the liquid thinning device 2715 for thinning and/or mixing in the presence of the plasma 2730. Liquid delivery device 2770 can include various liquid delivery components, including, for example, pumps, valves, regulators, pipes, fittings, conduit, etc., along with any required power supplies 2772. In some embodiments, the liquid delivery device 2770 may be configured similarly to any one or more of the liquid delivery devices described above, including any one or more of their components.

The apparatus 2700 also includes an exemplary liquid collection and distribution device 2774. Liquid collection and distribution device 2774 collects the liquid 2726 from the liquid thinning device 2715 and re-circulates and/or distributes the liquid 2726 to downstream devices or components, including, for example, storage devices or a device using the PAL. Liquid collection and distribution device 2774 can include various liquid collection and distribution components, including, for example, pumps, valves, regulators, pipes, fittings, conduit, etc., along with associated power supplies 2772, which may be the same as and/or shared with the liquid delivery device 2770 components. In some embodiments, the liquid delivery device 2770 may be configured similarly to any one or more of the liquid delivery devices described above, including any one or more of their components.

The apparatus 2700 can also include an exemplary additive delivery and/or metering device 2776. Additive delivery and/or metering device 2776 can add various additives to the liquid 2726 before and/or after activation for any particular application, as described above. The apparatus 2700 can also include one or more exemplary sensors 2778 for sensing various characteristics of the apparatus 2700, its components, and/or the liquid 2726, including, for example, additive concentration, species concentration, pH, flow rate, pressure, temperature, motor speed, surface speed, power (including, e.g., voltage and/or current), plasma strength, etc. Another exemplary sensor 2778 can detect the degradation level of the conductive element 2750, which may be, for example, a grounded mesh. In one embodiment, based on the degradation level, a user may decide to replace the conductive element 2750. In another embodiment, based on the degradation level, the controller 2850 may indicate when to replace the conductive element 2750, including, for example, based on a predetermined threshold and/or other algorithm.

During operation, the liquid 2726 may flow through a variety of flow paths associated with the apparatus 2700, including, for example, flow paths associated with the liquid delivery device 2770, the liquid thinning device 2715, and/or the liquid collection and distribution device 2774. In particular: flow path 2780 provides (un-activated and/or partially-activated (from another apparatus 2700)) liquid 2726 to the apparatus 2700; flow path 2782 provides liquid 2726 to the surface 2720 of the liquid thinning device 2715 for activation; flow path 2784 collects liquid 2726 from the liquid thinning device 2715 after activation; flow path 2786 delivers liquid 2726 from the apparatus 2700, for example, to downstream devices or components, including, for example, another apparatus 2700, storage devices, or a device using the PAL; flow path 2788 re-circulates (partially-activated) liquid 2726 to the apparatus 2700 for further activation; and flow path 2790 provides (un-activated) liquid 2726 that bypasses activation, for example, to be blended with activated liquid 2726.

In this manner, apparatus 2700 can activate liquid 2726 (flow path 2780, 2782, 2784, 2786), re-circulate all or a portion of liquid 2726 for further activation to create higher concentrations of species due to multiple exposures to the plasma 2730 (flow path 2788 interjected any number of times), and/or bypass activation (flow path 2780, 2790) for blending with activated liquid 2726. As discussed in more detail below, more than one apparatus 2700 may be combined to allow for any number of combined flow paths.

In some embodiments, the apparatus 2700 may include an exemplary controller 2850 for controlling one or more aspects of the apparatus 2700. Controller 2850 may include a processor 2852, a memory 2855, logic 2860, user interface 2865, display 2870, communication link/port 2875, inputs/outputs 2880, and/or any other feature associated with a controller. In one embodiment, the controller 2850 may be embodied as one or more computing devices, such as, for example, a computer (e.g., desktop, laptop, tablet), a portable smart device (e.g., smart phone, programmer, portable controller), etc.

Processor 2852 may include a device or combination of devices that function as a processor, as defined above, associated with the PAL apparatus and/or processes. Logic 2860 may include software for controlling and/or executing the PAL process, tuning routines, process sequences, safety checks, adjustments, etc. The memory 2855 may store the logic 2860, various algorithms associated with the logic 2860, various settings for the power supplies 2702, 2759, 2772, plasma generating device 2708, circuitry 2704, 2755, etc. The memory 2855 may be of any type or configuration, including, for example, local, remote, permanent, removable, centralized, shared, etc.

The memory 2855 may also store an application database of PAL process settings. Exemplary application details may include, for example, the fluid (e.g., liquid type), additive, ratio, concentration, activation time, exposure time, surface speed, recirculation rate, blending ratio, flow rate, pressure, etc. Exemplary parameters/settings may include, for example, power supply 2702 and associated circuitry 2704 settings (e.g., type, voltage, polarity, waveform, frequency, pulse number and duration, duty cycle, etc.), plasma generating device 2708 settings (plasma type, gas type, flow rate, etc.), spacing (between plasma generating device 2708 and conductive element 2750), process times/routines, conductive element 2705 features (e.g., placement, shape, size, thickness, material, gap size, porosity, etc.), circuitry 2755 features (e.g., component (resistor, capacitor, inductor, etc.) values, component arrangement (e.g., series, parallel, etc.), component type (e.g., fixed, variable, etc.), grounding, etc.), etc.

The user interface 2865 may include various input devices, such as, for example, buttons, dials, mouse, keyboard, touch-pad, etc. The display 2870 may include one or more displays, including, for example, monitors, readouts, LCDs, LEDs, etc. The communication link/port 2875 may include various devices suitable for any type of communication, including, for example, network connections (e.g., modem, LAN, WAN), wired (e.g., USB, Ethernet), wireless interfaces (e.g., Bluetooth, 802.11 standards, near field), portable storage medium interfaces (e.g., flash drive ports (e.g., memory sticks, USB, multimedia, SD, compact flash)), etc. Inputs/outputs 2880 may include devices for receiving and/or transmitting various signals, information, readings, etc. associated with the apparatus 2700, including to and/or from various devices, sensors 2778, readouts, etc.

For example, in one embodiment, the controller 2850 can control various aspects of the apparatus 2700 to achieve a desired concentration and flow rate of a PAL. In particular, the controller 2850 can control any of the various components of the apparatus 2700, including, for example, the power settings, circuitry, pumps, valves, regulators, flow paths, etc. associated with the plasma generating device 2708, the liquid delivery device 2770, the liquid thinning device 2715, the additive delivery/metering device 2776, the liquid collection and distribution device 2774, etc. to achieve the desired concentration and flow rate of the PAL from the apparatus 2700, including based on feedback from various sensors 2778.

In various embodiments, the controller 2850 can include logic 2860 for regulating the generation of the PAL. For example, in one embodiment, regulating the generation of the PAL includes controlling a flow rate of the liquid 2726 provided to the liquid thinning device 2715. In another embodiment, regulating the generation of the PAL includes controlling a pressure of the liquid 2726 provided to the liquid thinning device 2715. In another embodiment, regulating the generation of the PAL includes controlling a flow rate of the liquid 2726 out of the liquid thinning device 2715. In another embodiment, regulating the generation of the PAL includes controlling recirculation of liquid 2726 exposed to the plasma 2730 back through the apparatus 2700. In another embodiment, regulating the generation of the PAL includes controlling blending of liquid exposed to the plasma 2730 with liquid not exposed to the plasma 2730. In another embodiment, regulating the generation of the PAL includes controlling a power supply 2702 associated with the plasma generating device 2708. In another embodiment, regulating the generation of the PAL includes controlling a speed of a motor 2758 configured to move the surface 2720 of the liquid thinning device 2715. In another embodiment, regulating the generation of the PAL includes controlling a pump configured to provide the liquid 2726 to the liquid thinning device 2715. In another embodiment, regulating the generation of the PAL includes controlling a characteristic of a circuit 2755 for affecting an electric field associated with the plasma 2730. In another embodiment, regulating the generation of the PAL includes controlling a concentration of an additive to the liquid 2726. In another embodiment, regulating the generation of the PAL includes providing the PAL at a desired volume. In another embodiment, regulating the generation of the PAL includes providing the PAL at a desired concentration. In another embodiment, regulating the generation of the PAL includes controlling a plurality of PAL generation apparatuses 2700.

Figure 28:
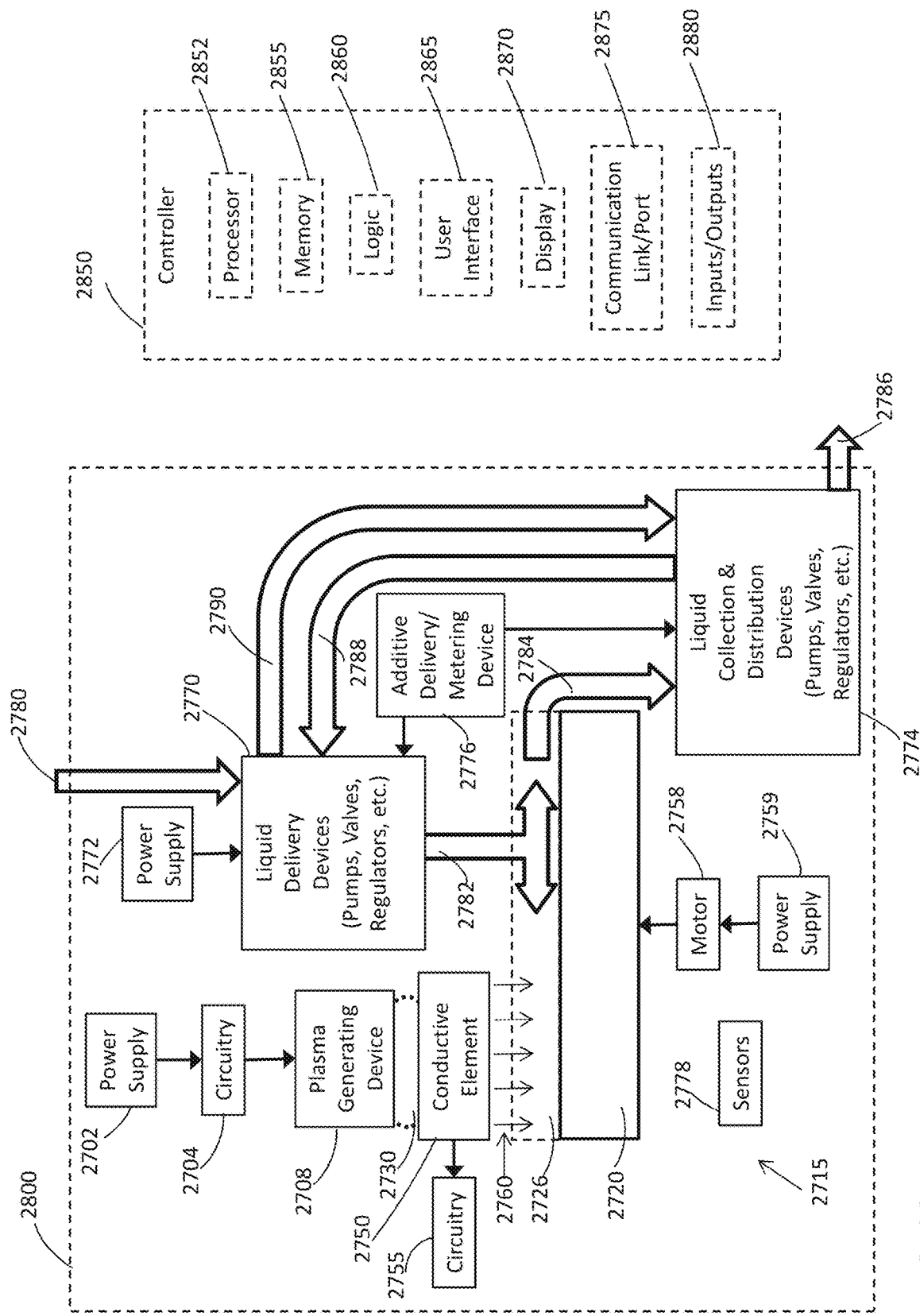
FIG. 28 is a block diagram of an exemplary PAL generation apparatus embodied as an integrated device.

In various embodiments, the various components of apparatus 2700, including controller 2850, may be separate components in operative communication with each other or may be integrated to various degrees. The degree of integration may range from discrete components sharing a common housing to full integration into one or more integrated components or devices with combined capabilities. For example, as shown in FIG. 27, one embodiment of a PAL apparatus 2700 includes the plasma generating device 2708, the liquid delivery device 2770, the liquid thinning device 2715, the liquid collection and distribution device 2774, and their respective associated components all as separate components. In another embodiment, as shown in FIG. 28, another PAL apparatus 2800 includes the plasma generating device 2708, the liquid delivery device 2770, the liquid thinning device 2715, the liquid collection and distribution device 2774, and their respective associated components as an integrated device. Any number of various other levels of integration may be utilized, including with controller 2850 and its components.

Figure 29:
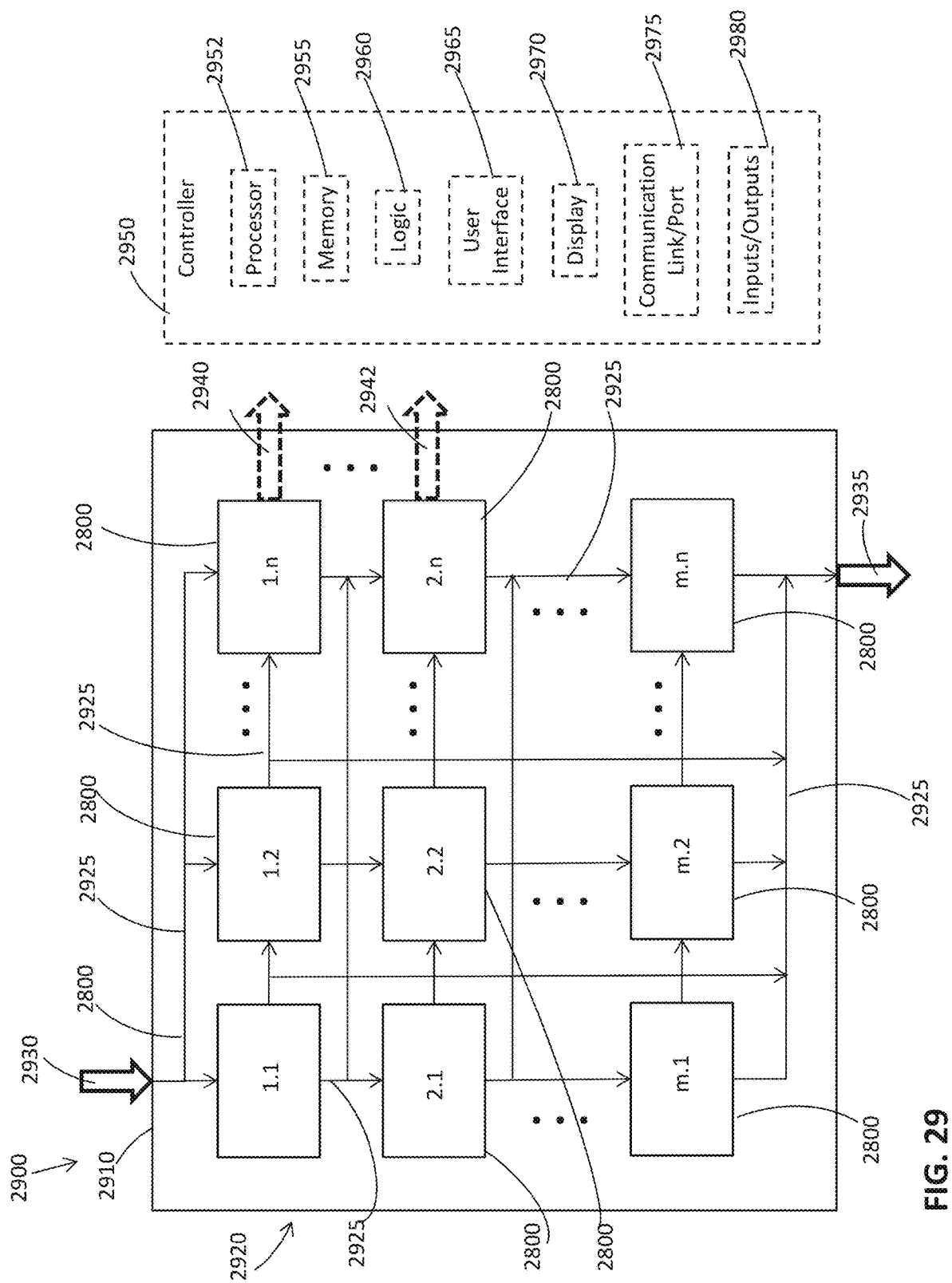
FIG. 29 is a block diagram of an exemplary PAL generation system.

FIG. 29 is a block diagram of an exemplary embodiment of a PAL generation system 2900. In this embodiment, the PAL generation system 2900 includes a plurality of PAL apparatuses 2800 integrated into an exemplary PAL production device 2910. In another embodiment, the PAL generation system 2900 can include a plurality of separate PAL apparatuses 2800 that are not integrated into a device 2910, but are similarly configured for combined usage. The plurality of PAL apparatuses 2800 included in the PAL generation system 2900 are configured (connected) in a manner that allows for almost unlimited flexibility and capability to produce PAL, including, for example, at higher and/or various flow rates, concentrations, etc. For example: a plurality of PAL apparatuses 2800 can be configured to generate PAL at higher flow rates by arranging various PAL apparatuses 2800 in parallel; a plurality of PAL apparatuses 2800 can be configured to generate PAL at higher concentrations by arranging various PAL apparatuses 2800 in series; a plurality of PAL apparatuses 2800 can be configured to generate PAL at various concentrations by arranging various PAL apparatuses 2800 in series with intermediate "tap-in" or exit paths; etc.

For example, in this embodiment, a plurality of PAL apparatuses 2800 are integrated into a PAL production device 2910 in an array 2920 to demonstrate the unlimited nature of various configurations. The array 2920 includes m rows and n columns of PAL apparatuses 2800. Any values of m and n can be utilized for any particular application of the PAL generation device 2910. The PAL apparatuses 2800 of the array 2920 are interconnected with connection network 2925, which provides flow paths to and from each of the PAL apparatuses 2800. Connection network 2925 can include various pumps, valves, regulators, etc. (not shown, but similar to the liquid delivery, collection, and distribution devices described above) that control the movement of liquid throughout the PAL production device 2910. Liquid entering the PAL production device 2910 at flow path 2930 can be directed to any number of PAL apparatuses 2800 before exiting the PAL production device 2910 at flow path 2935. In addition, the PAL production device 2910 may also include various intermediate exit flow paths 2940, 2942.

Certain components of the various PAL apparatuses 2800 may be shared or combined in the PAL production device 2910. For example, additive delivery/metering devices 2776 of various PAL apparatuses 2800 may be combined for use within the PAL production device 2910.

The PAL generation system 2900 can also include an exemplary controller 2950 for controlling one or more aspects of the PAL production device 2910. Controller 2950 may include a processor 2952, a memory 2955, logic 2960, user interface 2965, display 2970, communication link/port 2975, inputs/outputs 2980, and/or any other feature associated with a controller, similar to the respective components 2852, 2855, 2860, 2865, 2870, 2875, 2880 discussed above, but configured for controlling the PAL production device 2910. In one embodiment, the controller 2950 serves as the controller 2850 for each of the a plurality of PAL apparatuses 2800. In another embodiment, using network control, the controller 2950 communicates with the controllers 2850 for each of the a plurality of PAL apparatuses 2800. Controller 2950 can control the PAL apparatuses 2800 and connection network 2925 to generate PAL according to the desired output(s) of the PAL production device 2910.

In some embodiments, only a portion of the PAL apparatuses 2800 may be utilized to produce PAL according to the desired output(s) of the the PAL production device 2910. For example, only the PAL apparatuses 2800 needed to produce the desired PAL most efficiently may be active. In other embodiments, use of equivalent PAL apparatuses 2800 or equivalent combinations of PAL apparatuses 2800 may be staggered to distribute the use and wear on the PAL apparatuses 2800. In yet other embodiments, sensors 2778 and/or performance measures or metrics may indicate that certain PAL apparatuses 2800 should be serviced and/or not used.

It should be appreciated that the plurality of PAL apparatuses 2800 integrated into the PAL production device 2910 may all be configured differently with various individual capabilities, including, for example, some optimized for maximum flow, some optimized for maximum activation, etc. Whether configured the same or different, control of the PAL apparatuses 2800 can also be different. For example, a first value of an operating parameter associated with one of the PAL apparatuses 2800 can be different than a second value of the operating parameter associated with another of the PAL apparatuses 2800 to provide the PAL according to at least one desired output parameter. Operating parameters can include, for example, a flow rate of the liquid provided to the liquid thinning device, a pressure of the liquid provided to the liquid thinning device, a flow rate of the liquid out of the liquid thinning device, a power supplied to the plasma generating device, a speed of a motor configured to move the thinning surface of the liquid thinning device, a characteristic of a circuit for affecting an electric field associated with the plasma, a rate of recirculation, a rate of blending, a concentration of an additive to the liquid, etc. Desired output parameters can include, for example, a flow rate of the plasma activated liquid and/or a concentration of the plasma activated liquid.

In this manner, the PAL production device 2910 can generate a high volume and/or high concentration of PAL. Also, the PAL production device 2910 can be flexibly reconfigured to meet the needs of any desired output(s), essentially producing PAL "on-demand" according to user requirements.

Figure 30:
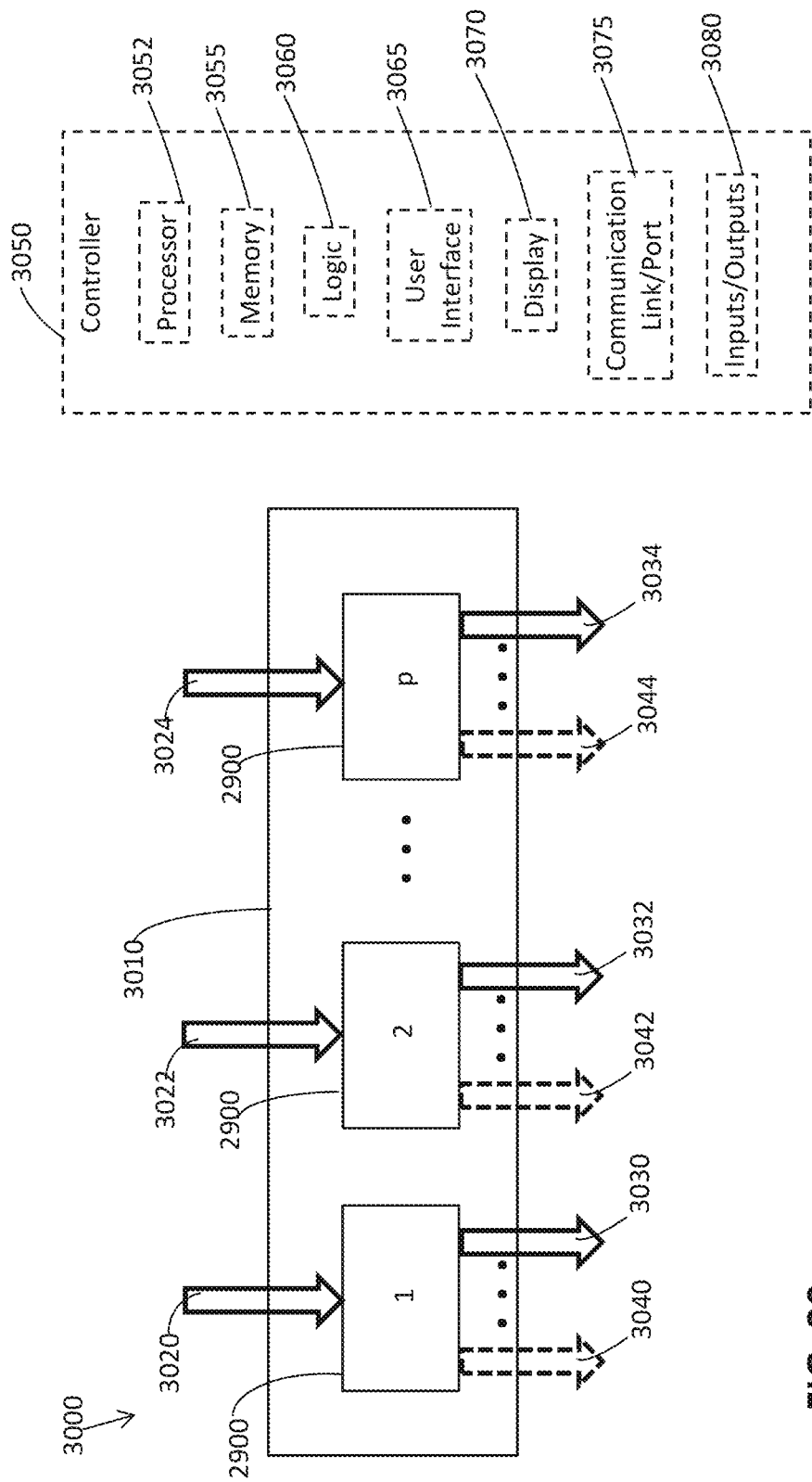
FIG. 30 is a block diagram of another exemplary PAL generation system.

FIG. 30 is a block diagram of an exemplary embodiment of another PAL generation system 3000. In this embodiment, the PAL generation system 3000 includes a plurality of PAL generation systems 2900 integrated into an exemplary PAL production device 3010. In another embodiment, the PAL generation system 3000 can include a plurality of separate PAL generation systems 2900 that are not integrated into a device 3010, but are similarly configured for combined usage. The plurality of PAL generation systems 2900 included in the PAL generation system 3000 are configured (connected) in a manner that allows for almost unlimited flexibility and capability to produce different PALs, including, for example, at higher and/or various flow rates, concentrations, etc. In particular, a plurality of PAL apparatuses 2900 can be configured to generate various PALs at high flow rates and/or at high concentrations, including with intermediate "tap-in" or exit paths.

For example, in this embodiment, a plurality of PAL generation systems 2900 are integrated into PAL generation device 3010 to demonstrate the unlimited nature of various configurations. Any value of p can be utilized for any particular application of the PAL generation device 3010. The PAL generation systems 2900 are each dedicated to a certain PAL. However, if certain PALs are compatible with each other, some interconnection may be used. Various liquids can enter the PAL generation device 3010 at flow paths 3020, 3022, 3024 and directed through the associated PAL generation system 2900 before exiting the PAL generation device 3010 at flow paths 3030, 3032, 3034. In addition, the PAL generation device 3010 may also include various intermediate exit flow paths 3040, 3042, 3044 for distributing lower concentrations of each PAL, as described above.

Certain components of the various PAL apparatuses 2800 and/or PAL generation systems 2900 may be shared or combined in the PAL generation device 3010. For example, additive delivery/metering devices 2776 of various PAL apparatuses 2800 may be combined for use across multiple PAL generation systems 2900 within the PAL generation device 3010.

The PAL generation system 3000 can also include an exemplary controller 3050 for controlling one or more aspects of the PAL generation device 3010. Controller 3050 may include a processor 3052, a memory 3055, logic 3060, user interface 3065, display 3070, communication link/port 3075, inputs/outputs 3080, and/or any other feature associated with a controller, similar to the respective components 2852, 2855, 2860, 2865, 2870, 2875, 2880 discussed above, but configured for controlling the PAL generation device 3010. In one embodiment, the controller 3050 serves as the controller 2850 for each of the a plurality of PAL apparatuses 2800 and/or the controller 2950 for each of the plurality of PAL generation systems 2900. In another embodiment, using network control, the controller 2950 communicates with the controllers 2850 and/or controllers 2950 for each of the a plurality of PAL apparatuses 2800 and/or PAL generation systems 2900. Controller 2950 can control the PAL generation systems 2900 to generate various PALs according to the desired output(s) of the PAL generation device 3010.

In some embodiments, only a portion of the PAL generation systems 2900 may be utilized to produce PALs according to the desired output(s) of the the PAL generation device 3010. For example, only the PAL generation systems 2900 needed to produce the desired PALs may be active. It should be appreciated that the plurality of PAL generation systems 2900 integrated into the PAL generation device 3010 may all be configured differently with various individual capabilities, including, for example, optimization for production of particular PALs.

In this manner, the PAL production device 2910 can generate a high volume and/or high concentration of PAL. Also, the PAL production device 2910 can be flexibly reconfigured to meet the needs of any desired output(s), essentially producing PAL "on-demand" according to user requirements.

FIGS. 31-34 are block diagrams of exemplary methodologies associated with PAL generation. The exemplary methodologies may be carried out in logic, software, hardware, or combinations thereof. In addition, although the methods are presented in an order, the blocks may be performed in different orders. Further, additional steps or fewer steps may be used.

Figures 31, 32:
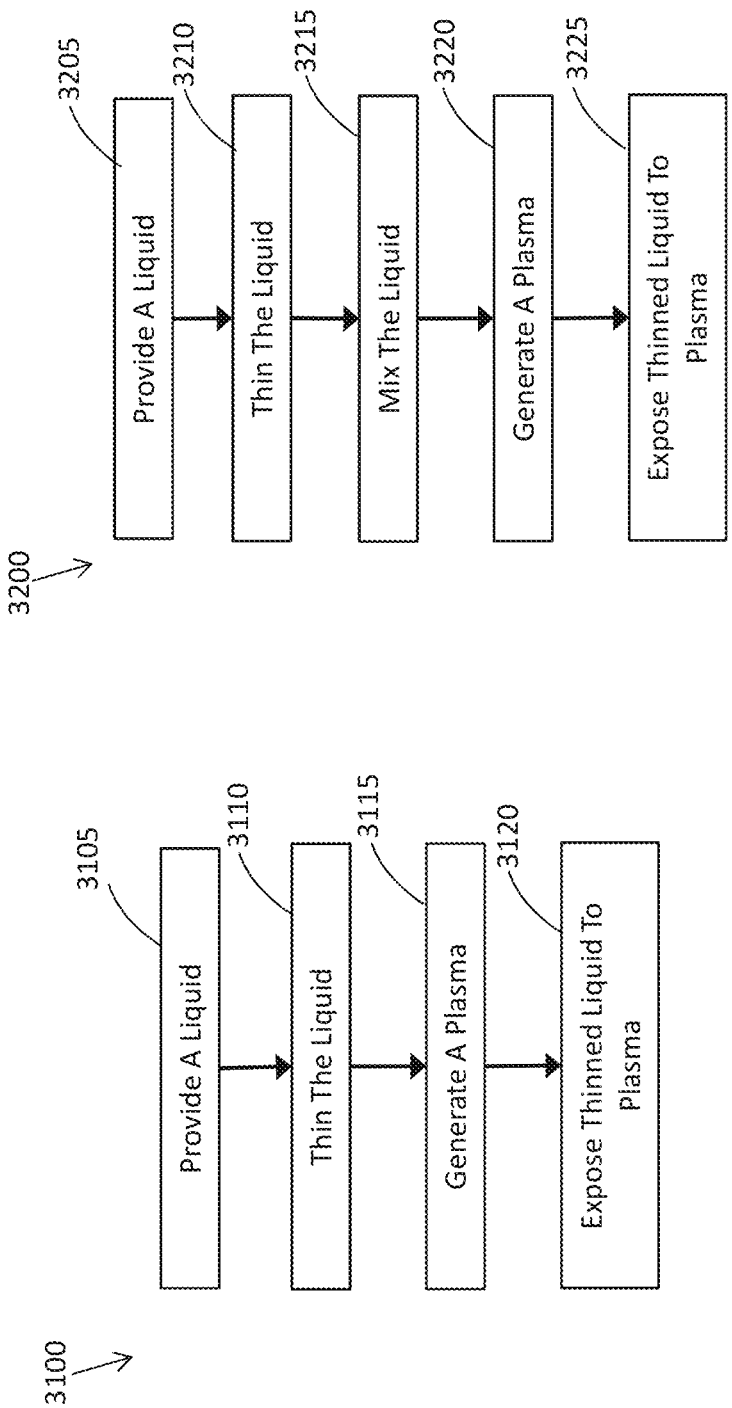
FIG. 31 shows an exemplary method of generating PAL.
FIG. 32 shows another exemplary method of generating PAL.

FIG. 31 shows an exemplary method 3100 of generating PAL using any of the apparatuses, systems, devices, components, and/or configurations described above. First, at step 3105, the method includes providing a liquid to be activated. Then, at step 3110, the method includes thinning the liquid. For example, as described above, a thinning surface of a liquid thinning device and liquid can move at a relative speed that creates a thin layer of the liquid as the liquid flows across the thinning surface. Next, at step 3115, the method includes generating a plasma. At step 3120, the method includes exposing the thin layer of liquid to the plasma so that at least a portion of the liquid exposed to the plasma becomes plasma activated.

FIG. 32 shows another exemplary method 3200 of generating PAL using any of the apparatuses, systems, devices, components, and/or configurations described above. The first two steps, 3205 and 3210, are the same as steps 3105 and 3110 of method 3100. Next, at step 3215, the method includes mixing the liquid within the thin layer of liquid as the liquid flows across the thinning surface, as described above. The next two steps, 3220 and 3225, are the same as steps 3115 and 3120 of method 3100.

Figures 33, 34:
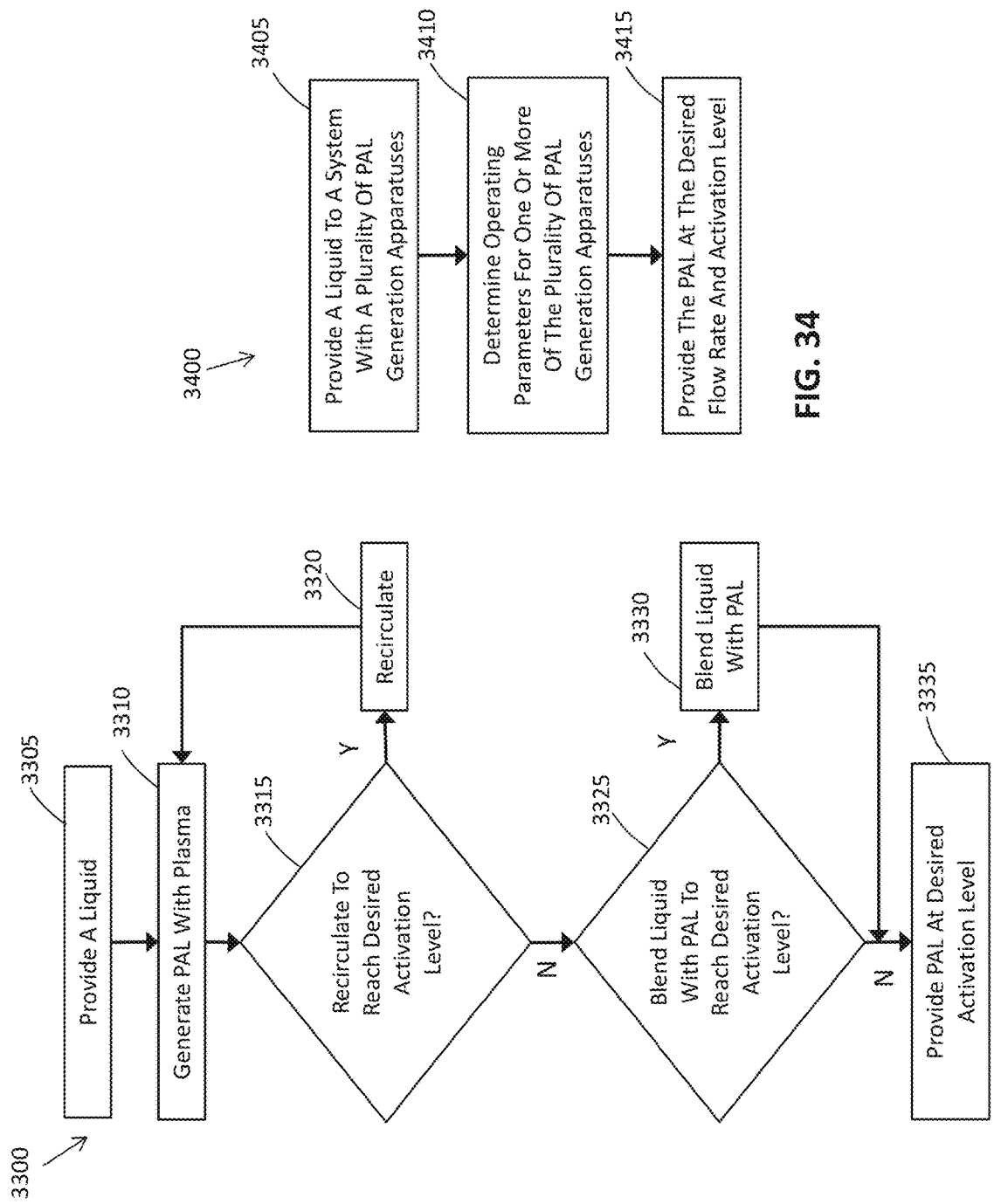
FIG. 33 shows another exemplary method of generating PAL.
FIG. 34 shows another exemplary method of generating PAL.

FIG. 33 shows another exemplary method 3300 of generating PAL using any of the apparatuses, systems, devices, components, and/or configurations described above. First, at step 3305, the method includes providing a liquid to be activated. Then, at step 3310, the method includes generating the PAL using a plasma. For example, as described above, generating the PAL at step 3310 may be in accordance with methods 3100 or 3200. Next, at step 3315, the method includes determining whether all or a portion of the liquid should be re-circulated for additional plasma exposure, for instance, to reach a higher concentration or activation level. If yes, the method proceeds to step 3320 to re-circulate the liquid for additional plasma exposure. If no, the method proceeds to step 3325 for determining whether all or a portion of the activated liquid should be blended with non-activated liquid, for instance, to reduce the concentration or activation level. If yes, the method proceeds to step 3330 to blend the activated liquid with non-activated liquid. Finally, at step 3335, the method provides the PAL at the desired concentration or activation level.

FIG. 34 shows another exemplary method 3400 of generating PAL using any of the apparatuses, systems, devices, components, and/or configurations described above. First, at step 3405, the method includes providing a liquid to be activated to a system with a plurality of PAL generation apparatuses. Then, at step 3410, the method includes determining operating parameters for one or more of the plurality of PAL generation apparatuses, as described above. Next, at step 3415, the method includes providing the PAL at the desired flow rate and activation level.

In various embodiments, steps of the methods 3100, 3200, 3300, 3400 can include controlling various aspects of the process. For example: controlling a flow rate of the liquid provided to a liquid thinning device; controlling a pressure of the liquid provided to a liquid thinning device; controlling a flow rate of a liquid out of a liquid thinning device; controlling a power supply associated with a plasma generating device; controlling a speed of a motor configured to move a thinning surface of a liquid thinning device; controlling a pump configured to provide the liquid to a liquid thinning device; controlling a characteristic of a circuit for affecting an electric field associated with the plasma; controlling a concentration of an additive to the liquid; providing the PAL at a desired volume; providing the PAL at a desired concentration; controlling a plurality of PAL generation apparatuses; etc. (as described above).

To demonstrate the effectiveness of the above PAL apparatuses and methods, test results of an exemplary embodiment are provided. The exemplary prior art system 200 (shown in FIG. 2), where liquid is held in a container 220, and the exemplary apparatus 400 (shown in FIGS. 4-8), where liquid flows across spin disk 420, were compared in similar activations. Both systems 200, 400 were used to activate a 35% ethanol/water mix. The results are shown below:

TABLE 1

| Device | Plasma Activated Volume | Plasma Activated Time | Cdiff Log Reduction |
|---|---|---|---|
| System 200 | 600 μL | 60 s | 6 |
| System 200 | 200 μL | 60 s | 6 |
| System 400 | continuous | ~0.09 s | 3.6 |

System 200 showed it can produce a 6 log reduction in Cdiff using the operating parameters shown in Table 1. For the spin disk system 400, the disk was 4" diameter, speed was 1,000 rpm, the plasma power level was 60 watts to the power supply, and the motor voltage was 80 volts. The spin disk device 400 showed it can produce a 3.6 log reduction in Cdiff using the operating parameters shown in Table 1. Even though no efforts were made to optimize the operating parameters associated with the spin disk test, the test results confirm that the spin disk is effective in activating the liquid and highly effective against Cdiff and/or other undesirable microbials.

As can be seen in Table 1, the exposure of the liquid to the plasma in the spin disk embodiment is a small fraction of the exposure using system 200. In later bench testing, a small peristaltic pump was hooked up to the input tube in the spin disk device and it was fed with a continuous flow of liquid to control the flow rate. The test results are based on just one exposure to the plasma (the time it took the liquid to travel from the inside of the disk to the outside of the plasma zone). Test strip results indicate good activation at a flow rate of about 270 mL/min with this device at the power level and disk speed. No efforts were made to optimize the spin disk device by studying flow rates, electrical power to the plasma, plasma type, power supply type, distance of liquid from plasma, spin disk rotational speed, etc. While some of the exemplary embodiments are illustrated using liquid, any of the described embodiments would work equally well with various other fluids.

While the present invention has been illustrated by the description of embodiments thereof and while the embodiments have been described in considerable detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative apparatus and methods, and illustrative examples shown and described. Accordingly, departures may be made from such details without departing from the spirit or scope of the applicant's general inventive concept. While the embodiments discussed herein have been related to the systems and methods discussed above, these embodiments are intended to be exemplary and are not intended to limit the applicability of these embodiments to only those discussions set forth herein. The control systems and methodologies discussed herein may be equally applicable to, and can be utilized in, other systems and methods.

I claim:

1. A plasma activated liquid generation apparatus, comprising:
    a supply of a liquid;
    a spin cylinder, comprising:
        a cylinder bottom; and
        a cylinder side wall connected to the cylinder bottom;
    a dielectric barrier discharge plasma generating device configured to generate dielectric barrier discharge generated plasma proximate an inner surface of the cylinder side wall;
        the dielectric barrier discharge plasma generating device comprising an electrode and a dielectric barrier;
        wherein the liquid is deposited into the spin cylinder;
        wherein the spin cylinder is configured to rotate and the rotation is configured to cause the liquid to move along the inner surface of the cylinder side wall; and
        wherein when the liquid moves along the inner surface of the cylinder side wall, a layer of the liquid is exposed to the plasma; and
    wherein at least a portion of the liquid exposed to the plasma becomes plasma activated; and
    wherein the dielectric barrier is located between the electrode and the inner surface of the cylinder side wall.

2. The apparatus of claim 1, wherein the plasma generating device further comprises;

a conductive element, wherein the plasma is generated between the dielectric barrier and the conductive element.

3. The apparatus of claim 2, wherein the conductive element is connected to circuitry that affects an electric field associated with the plasma.

4. The apparatus of claim 1, wherein a velocity differential between the liquid and the inner surface of the cylinder side wall overcomes a surface tension of the liquid.

5. The apparatus of claim 1, wherein the spin cylinder is configured to create a shearing force that mixes the layer of liquid while the liquid is exposed to the plasma.

6. The apparatus of claim 1, further comprising:
a liquid delivery device connected to the spin cylinder;
wherein the liquid is deposited into the spin cylinder through the liquid delivery device.

7. The apparatus of claim 1, wherein the inner surface of the cylinder side wall extends upward with an outward taper that allows the liquid to travel upward along the inner surface of the cylinder side wall as the spin cylinder rotates.

8. The apparatus of claim 1, wherein the plasma generating device is located proximate a top surface of the cylinder bottom.

9. The apparatus of claim 1, wherein the cylinder side wall is connected to the cylinder bottom with a fillet.

10. The apparatus of claim 1, wherein the inner surface of the cylinder side wall comprises at least one rib.

11. The apparatus of claim 1, wherein at least a portion of the liquid exposed to the plasma is recirculated back through the apparatus.

12. The apparatus of claim 1, further comprising a controller.

13. The apparatus of claim 12 further comprising a pump for recirculation of liquid exposed to the plasma back through the apparatus.

14. A system for providing plasma activated liquid, comprising:
a supply of a liquid;
a plurality of dielectric barrier discharge plasma activated liquid generation apparatuses, each comprising:
a spin cylinder, comprising:
a cylinder bottom; and
a cylinder side wall connected to the cylinder bottom;
a dielectric barrier discharge plasma generating device located proximate an inner surface of the cylinder wall configured to generate plasma proximate the cylinder side wall;
the dielectric barrier discharge plasma generating device comprising an electrode and a dielectric barrier;
wherein the spin cylinder rotates;
wherein the liquid is deposited into the spin cylinder, and
wherein when the spin cylinder rotates, the liquid travels along the inner surface of the cylinder side wall and a layer of liquid is located proximate to the plasma generated by the plasma generating device; and
wherein at least a portion of the liquid exposed to the plasma becomes plasma activated; and
a controller in circuit communication with the plasma activated liquid generation apparatuses; and
wherein the dielectric barrier is located between the electrode and the inner surface of the cylinder side wall.

15. The system of claim 14, wherein a first value of an operating parameter associated with one of the plurality of plasma activated liquid generation apparatuses is different than a second value of the operating parameter associated with another of the plurality of plasma activated liquid generation apparatuses to provide the plasma activated liquid according to at least one desired output parameter.

16. A plasma activated liquid generation apparatus, comprising:
a liquid delivery device for supplying a liquid;
a spin cylinder, comprising:
a cylinder bottom; and
a cylinder side wall connected to the cylinder bottom;
a dielectric barrier discharge plasma generating device located proximate an inner surface of the cylinder side wall and configured to generate plasma proximate the inner surface of the cylinder side wall;
the dielectric barrier discharge plasma generating device comprising an electrode and a dielectric barrier;
the dielectric barrier located between the electrode and the inner surface of the cylinder side wall;
wherein when the liquid is deposited into the spin cylinder and the spin cylinder rotates, the liquid travels along the inner surface of the cylinder side wall causing the liquid to be proximate to the dielectric barrier discharge generated plasma;
wherein at least a portion of the liquid exposed to the dielectric barrier discharge generated plasma becomes plasma activated; and
a liquid collection device for collecting the liquid after exposure to the plasma.

17. The apparatus of claim 16, further comprising a controller.

18. The apparatus of claim 17 further comprising recirculating of liquid exposed to the plasma back through the apparatus.

19. The apparatus of claim 17 further comprising circuitry to control an electric field associated with the plasma.

20. The apparatus of claim 17 further comprising circuitry to control a concentration of an additive to the liquid.

* * * * *